United States Patent
Jung et al.

(10) Patent No.: US 11,817,158 B2
(45) Date of Patent: Nov. 14, 2023

(54) OPERATION METHOD OF NONVOLATILE MEMORY DEVICE

(71) Applicant: Samsung Electronics Co., Ltd., Suwon-si (KR)

(72) Inventors: Doo-Yeun Jung, Suwon-si (KR); Young-Jin Cho, Seoul (KR); Bu-Il Nam, Hwaseong-si (KR); Nari Lee, Hwaseong-si (KR); Yeji Nam, Suwon-si (KR); Sangyong Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/079,433

(22) Filed: Dec. 12, 2022

(65) Prior Publication Data
US 2023/0111404 A1 Apr. 13, 2023

Related U.S. Application Data

(63) Continuation of application No. 17/232,370, filed on Apr. 16, 2021, now Pat. No. 11,527,296.

(30) Foreign Application Priority Data

Apr. 24, 2020 (KR) .......... 10-2020-0049865
Aug. 31, 2020 (KR) .......... 10-2020-0110608

(51) Int. Cl.
| | | |
|---|---|---|
| G11C 16/34 | (2006.01) | |
| G11C 16/08 | (2006.01) | |
| G11C 16/30 | (2006.01) | |
| G11C 16/24 | (2006.01) | |
| G11C 16/10 | (2006.01) | |
| G11C 16/16 | (2006.01) | |

(52) U.S. Cl.
CPC .......... *G11C 16/3459* (2013.01); *G11C 16/08* (2013.01); *G11C 16/102* (2013.01);
(Continued)

(58) Field of Classification Search
CPC ... G11C 16/3459; G11C 16/08; G11C 16/102; G11C 16/16; G11C 16/24; G11C 16/30;
(Continued)

(56) References Cited

U.S. PATENT DOCUMENTS

| | | |
|---|---|---|
| 7,944,755 B2 | 5/2011 | Sarin |
| 8,760,935 B2 | 6/2014 | Takekida |

(Continued)

FOREIGN PATENT DOCUMENTS

KR 100495655 B1 9/2005

*Primary Examiner* — Sultana Begum
(74) *Attorney, Agent, or Firm* — Muir Patent Law, PLLC

(57) ABSTRACT

An operation method of a nonvolatile memory device which includes a memory block having wordlines includes performing an erase on the memory block, performing a block verification on the memory block by using a 0-th erase verification voltage, performing a delta verification on the memory block by using a first erase verification voltage different from the 0-th erase verification voltage when a result of the block verification indicates a pass, and outputting information about an erase result of the memory block based on the result of the block verification or a result of the delta verification. The delta verification includes generating delta counting values respectively corresponding to wordline groups by using the first erase verification voltage, generating a delta value based on the delta counting values, and comparing the delta value and a first reference value.

20 Claims, 41 Drawing Sheets

(52) U.S. Cl.
CPC .............. *G11C 16/16* (2013.01); *G11C 16/24* (2013.01); *G11C 16/30* (2013.01)

(58) Field of Classification Search
CPC ............ G11C 16/3445; G11C 16/0483; G11C 2211/5644; G11C 7/12; G11C 8/08; G11C 29/42
See application file for complete search history.

(56) References Cited

U.S. PATENT DOCUMENTS

| | | |
|---|---|---|
| 8,787,088 B2 | 7/2014 | Dutta et al. |
| 8,787,094 B2 | 7/2014 | Costa et al. |
| 8,842,472 B2 | 9/2014 | Kim |
| 8,929,149 B2 | 1/2015 | Shim |
| 9,019,773 B2 | 4/2015 | Park et al. |
| 9,025,378 B2 | 5/2015 | Tokiwa |
| 9,053,978 B2 | 6/2015 | Nam |
| 9,147,494 B2 | 9/2015 | Tokiwa |
| 9,330,778 B2 | 5/2016 | Costa et al. |
| 9,543,023 B2 | 1/2017 | Lai et al. |
| 9,552,885 B2 | 1/2017 | Shukla et al. |
| 9,595,319 B2 | 3/2017 | Lee |
| 9,646,696 B2 | 5/2017 | Yang |
| 10,304,551 B2 | 5/2019 | Ray et al. |
| 2015/0009754 A1 | 1/2015 | Kim |
| 2018/0286485 A1 | 10/2018 | Takizawa et al. |
| 2021/0312993 A1* | 10/2021 | Cho ................... G11C 16/30 |
| 2021/0319838 A1 | 10/2021 | Joo |

* cited by examiner

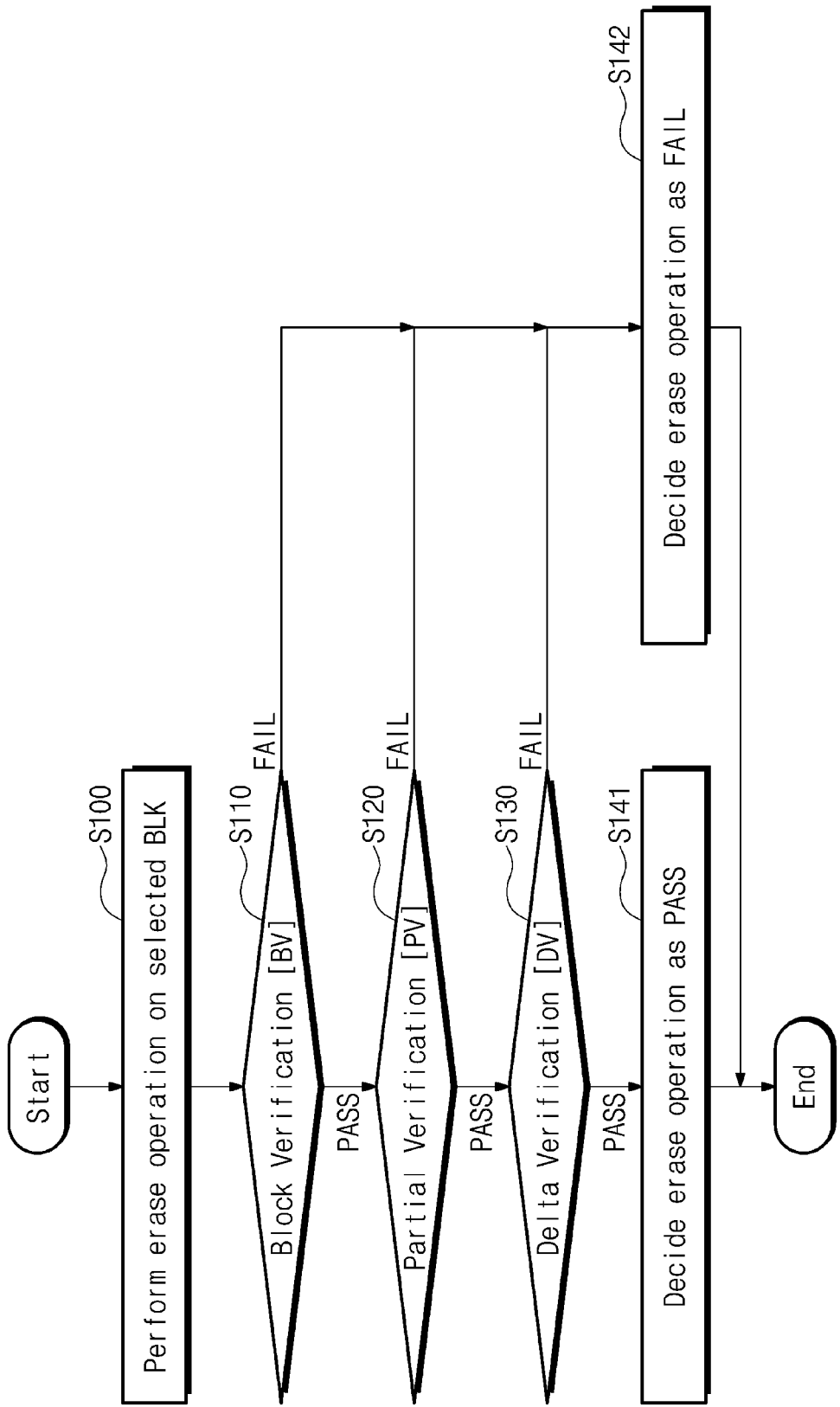

OPERATION METHOD OF NONVOLATILE MEMORY DEVICE

CROSS-REFERENCE TO RELATED APPLICATIONS

This application is a continuation application of U.S. application Ser. No. 17/232,370, filed on Apr. 16, 2021, which claims priority under 35 U.S.C. § 119 to Korean Patent Application Nos. 10-2020-0049865 filed on Apr. 24, 2020 and 10-2020-0110608 filed on Aug. 31, 2020, in the Korean Intellectual Property Office, the disclosures of which are incorporated by reference herein in their entireties.

BACKGROUND

Embodiments of the inventive concept disclosed herein relate to a semiconductor memory, and more particularly, relate to an operation method of a nonvolatile memory device.

A semiconductor memory device is classified as a volatile memory device, in which stored data disappear when a power is turned off, such as a static random access memory (SRAM) or a dynamic random access memory (DRAM), or a nonvolatile memory device, in which stored data are retained even when a power is turned off, such as a flash memory device, a phase-change RAM (PRAM), a magnetic RAM (MRAM), a resistive RAM (RRAM), or a ferroelectric RAM (FRAM).

A flash memory is being widely used as a high-capacity storage medium. The flash memory may erase memory blocks using an erase voltage. The reliability of data programmed in the memory cells of the flash memory may depend on an erase state of the flash memory. Accurate verifying of the erase state of the flash memory is desirable.

SUMMARY

Embodiments of the inventive concept provide an operation method of a nonvolatile memory device having improved reliability.

According to an embodiment of the present inventive concept, an operation method of a nonvolatile memory device which includes a memory block including a plurality of wordlines and a plurality of bitlines, includes performing an erase operation on the memory block using a 0-th erase voltage, performing a block verification operation on the memory block using a 0-th erase verification voltage, performing, in response to a result of the block verification operation being determined as a pass, a delta verification operation on the memory block using a first erase verification voltage different from the 0-th erase verification voltage, and outputting, in response to the result of the block verification operation or a result of the delta verification operation, information of whether the erase operation performed on the memory block is determined as a pass or a fail. The plurality of wordlines are grouped into a plurality of wordline groups. The delta verification operation includes generating a plurality of delta counting values respectively from the plurality of wordline groups using the first erase verification voltage, generating a delta value based on the plurality of delta counting values, and comparing the delta value and a first reference value.

According to an embodiment of the present inventive concept, an operation method of a nonvolatile memory device which includes a memory block including a plurality of wordlines and a plurality of bitlines, includes performing an erase operation on the memory block, performing a block verification operation on the memory block using a 0-th erase verification voltage, performing, in response to a result of the block verification operation being determined as a pass, a partial verification operation on the memory block using the 0-th erase verification voltage, performing, in response to a result of the partial verification operation being determined as a pass, a delta verification operation on the memory block using a first erase verification voltage different from the 0-th erase verification voltages, and outputting, in response to the result of the block verification operation, the result of the partial verification operation, or a result of the delta verification operation, information of whether the erase operation performed on the memory block is determined as a pass or a fail. The performing of the block verification operation includes generating a block counting value in a block unit using the 0-th erase verification voltage, and comparing the block counting value and a first reference value. The performing of the partial verification operation includes generating a plurality of partial counting values in a wordline group unit using the 0-th erase verification voltage and comparing each of the plurality of partial counting values and a second reference value. The performing of the delta verification operation includes generating a plurality of delta counting values in the wordline group unit using the first erase verification voltage, generating a delta value based on the plurality of delta counting values, and comparing the delta value and a third reference value.

According to an embodiment of the present inventive concept, an erase verification method of a nonvolatile memory device which includes a memory block erased in an erased operation and having a plurality of wordlines includes grouping the plurality of wordlines into a plurality of wordline groups, generating a plurality of delta counting values respectively from the plurality of wordline groups by using a first erase verification voltage, generating a delta value based on the plurality of delta counting values, comparing the delta value and a first reference value, and outputting, in response to the comparing of the delta value and the first reference value, information of whether an erase result of the erase operation performed on the memory block is determined as a pass or a fail.

According to an exemplary embodiment, an erase verification method of a nonvolatile memory device which includes a memory block including a plurality of wordlines includes performing a block verification operation on the memory block by using a 0-th erase verification voltage, performing a delta verification operation when a result of the block verification operation indicates a pass, outputting information about an erase result of the memory block based on the result of the block verification operation or a result of the delta verification operation, and the plurality of wordlines are classified into a plurality of wordline groups. The delta verification operation may include generating a plurality of first delta counting values respectively corresponding to the plurality of wordline groups based on a first sensing condition, generating a first delta value based on the plurality of first delta counting values, comparing the first delta value and a first reference value, and generating a plurality of second delta counting values respectively corresponding to the plurality of wordline groups based on a second sensing condition different from the first sensing condition, when the first delta value is smaller than the first reference value.

According to an exemplary embodiment, an erase verification method of a nonvolatile memory device which includes a memory block connected with a plurality of wordlines includes performing an erase operation on the memory block, performing a block verification operation on the memory block, performing a plurality of delta verification operations when a result of the block verification operation indicates a pass, and outputting information about an erase result of the memory block based on the result of the block verification operation or a result of the plurality of delta verification operations. The plurality of wordlines are classified into a plurality of wordline groups. Each of the plurality of delta verification operations indicates an operation in which a soft defect of each of the plurality of wordline groups is detected based on a difference between delta counting values respectively detected from the plurality of wordline groups based on a different erase verification voltage.

BRIEF DESCRIPTION OF THE FIGURES

The above and other objects and features of the inventive concept will become apparent by describing in detail exemplary embodiments thereof with reference to the accompanying drawings.

FIG. 5 is a flowchart illustrating an erase operation of a nonvolatile memory device of FIG. 3.

DETAILED DESCRIPTION

Below, embodiments of the inventive concept may be described in detail and clearly to such an extent that an ordinary one in the art easily implements the inventive concept.

Figure 1:
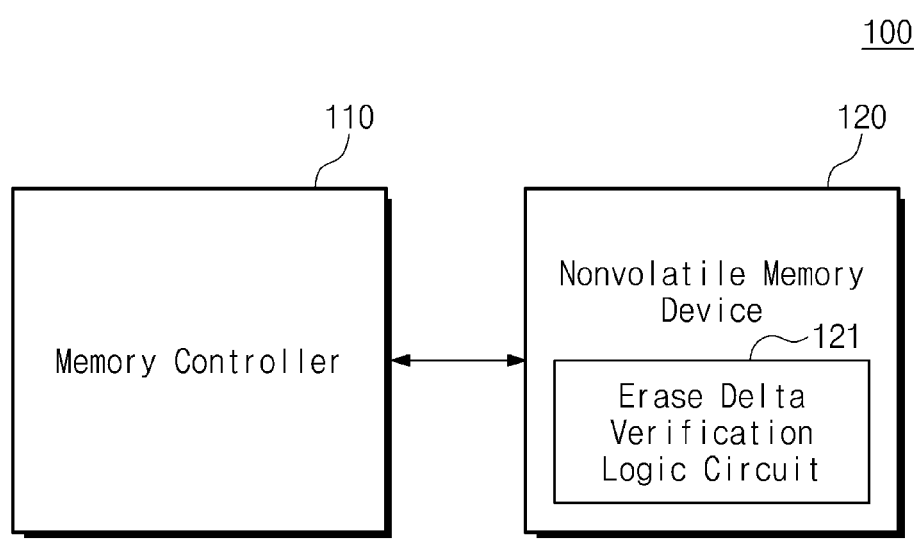
FIG. 1 is a block diagram illustrating a storage device according to an embodiment of the inventive concept.

FIG. 1 is a block diagram illustrating a storage device according to an embodiment of the inventive concept. Referring to FIG. 1, a storage device 100 may include a memory controller 110 and a nonvolatile memory device 120. Under control of an external device (e.g., an external host device, a central processing unit (CPU), or an application processor (AP)) or in response to a request of the external device, the memory controller 110 may store data in the nonvolatile memory device 120 or may read data from the nonvolatile memory device 120.

Under control of the memory controller 110, the nonvolatile memory device 120 may store data or may provide data stored therein to the memory controller 110. In an exemplary embodiment, the nonvolatile memory device 120 may be a NAND flash memory device, but the inventive concept is not limited thereto.

The nonvolatile memory device 120 may include a plurality of memory blocks. The nonvolatile memory device 120 may perform an erase operation on the plurality of memory blocks under control of the memory controller 110 or automatically. For example, the nonvolatile memory device 120 may perform the erase operation on a memory block selected from the plurality of memory blocks. The erase operation may be performed based on an increment step pulse erase (ISPE) manner. For example, the erase operation may include a plurality of erase loops. Each of the plurality of erase loops may include an erase step of decreasing a threshold voltage distribution of memory cells of a selected memory block and a verify step of verifying erase states of the memory cells of the selected memory block. After all the erase loops are performed, when the erase operation of the selected memory block is determined in the verify step as fail, the nonvolatile memory device 120 may provide the memory controller 110 with information about the erase-failed memory block. The memory controller 110 may manage the erase-failed memory block as a bad block based on the information about the erase-failed memory block.

In an exemplary embodiment, the nonvolatile memory device 120 according to an embodiment of the inventive concept may include an erase delta verification logic circuit 121. For example, in the erase operation of the selected memory block, even though a result (hereinafter referred to as a "verification result") of performing verification using a given erase verification voltage is determined as pass, memory cells of a specific wordline of the selected memory block may have soft defects. Data stored in the memory cells of the specific wordline may have soft errors, and the reliability of data may be reduced.

The erase delta verification logic circuit 121 may verify a soft defect associated with a specific wordline of a selected memory block by performing delta verification on the selected memory block. When it is determined that memory cells of the specific wordline may have soft defects, an erase operation of the memory block (i.e., the selected memory block) including the specific wordline may be determined as fail.

In an exemplary embodiment, the delta verification may verify whether memory cells of a specific wordline may have soft defects by comparing differences between the numbers of fail bits for respective groups of wordlines of the selected memory block. In an exemplary embodiment, the delta verification may be repeatedly performed by a predetermined number of times. A sensing condition that is used in each delta verification may change. A configuration and an operation of the erase delta verification logic circuit 121 will be more fully described with reference to the following drawings.

As described above, the nonvolatile memory device 120 according to an embodiment of the inventive concept may perform the delta verification on a selected memory block in the erase operation of the selected memory block. Memory cells of a specific wordline of a memory block which was determined as pass in a conventional erase verification operation may have soft defects, and such soft defects may be verified or detected through the delta verification. Thus, the reliability of the nonvolatile memory device 120 may be improved.

Figure 2:
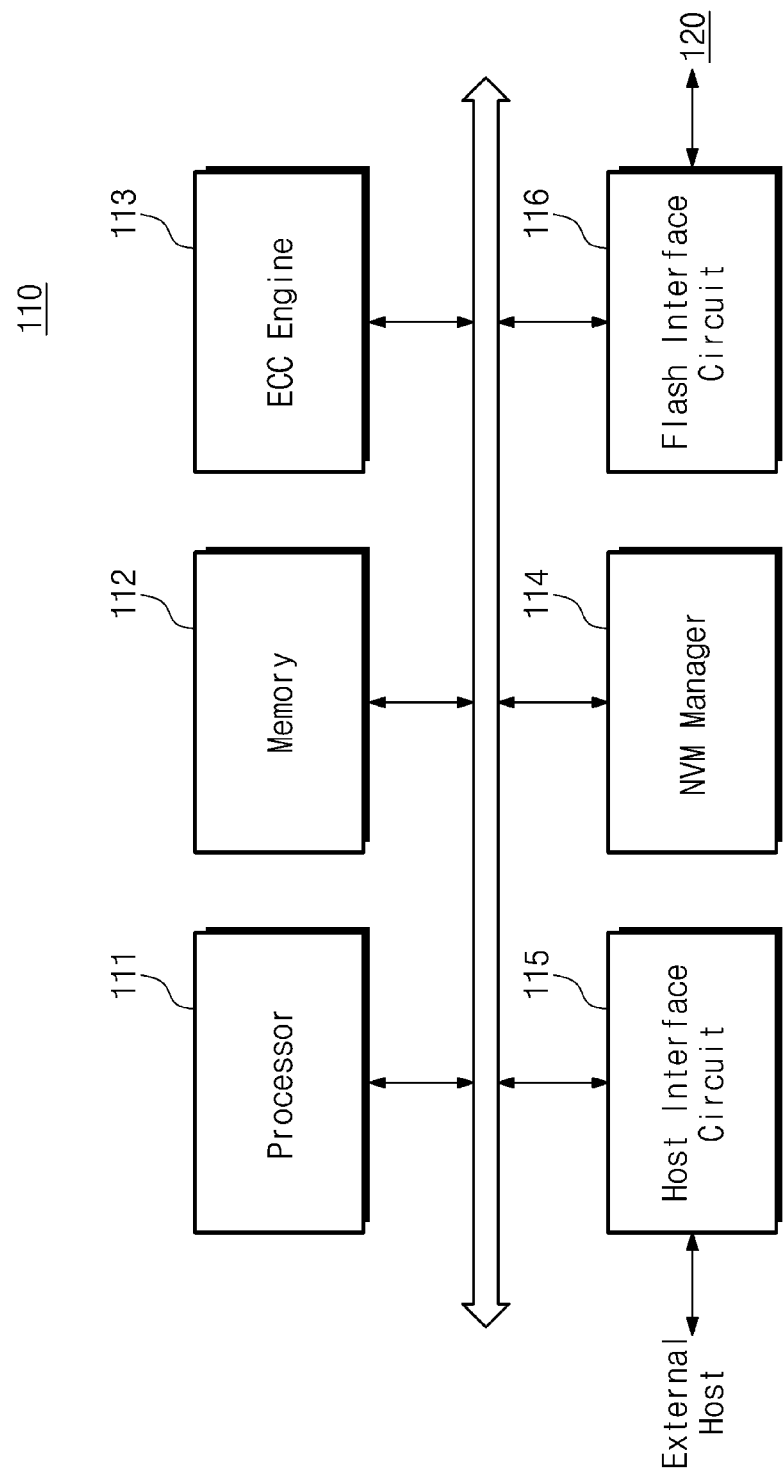
FIG. 2 is a block diagram illustrating a memory controller of FIG. 1.

FIG. 2 is a block diagram illustrating a memory controller of FIG. 1. Referring to FIGS. 1 and 2, the memory controller 110 may include a processor 111, a memory 112, an error correction code (ECC) engine 113, a nonvolatile memory manager 114, a host interface circuit 115, and a flash interface circuit 116.

The processor 111 may control overall operations of the memory controller 110. The memory 112 may be used as a working memory, a buffer memory, or a system memory of the memory controller 110. In an exemplary embodiment, the memory 112 may be a volatile memory such as a static random access memory (SRAM) or a dynamic RAM (DRAM). The processor 111 may process information stored in the memory 112 or may execute a variety of firmware or various program codes stored in the memory 112.

The ECC engine 113 may detect and correct an error of data read from the nonvolatile memory device 120. For example, the ECC engine 113 may generate an error correction code for data to be stored in the nonvolatile memory device 120. The error correction code thus generated may be stored in the nonvolatile memory device 120 together with data corresponding to the error correction code. Afterwards, when the error correction code and the corresponding data are read from the nonvolatile memory device 120, the ECC engine 113 may correct an error of the data read from the nonvolatile memory device 120 using the error correction code. In an exemplary embodiment, the ECC engine 113 may have an error correction capacity of a given level.

The nonvolatile memory manager 114 may perform various management operations on the nonvolatile memory device 120. For example, the nonvolatile memory manager 114 may perform various maintenance operations such as a mapping table managing operation for managing mapping information between physical addresses of the nonvolatile memory device 120 and logical addresses associated with data stored therein, a bad block managing operation for managing a bad block of the nonvolatile memory device 120, a wear leveling operation for managing a wear level of the nonvolatile memory device 120, and a garbage collection operation for securing free memory blocks of the nonvolatile memory device 120. In an exemplary embodiment, the nonvolatile memory manager 114 may be a flash translation layer (FTL) which performs a maintenance operation on the nonvolatile memory device 120. In an exemplary embodiment, the nonvolatile memory manager 114 may be implemented in the form of software, hardware, or a combination thereof. The nonvolatile memory manager 114 that is implemented in the form of software or firmware may be stored in the memory 112, and the nonvolatile memory manager 114 stored in the memory 112 may be executed by the processor 111.

The memory controller 110 may communicate with an external host through the host interface circuit 115. The host interface circuit 115 may be implemented based on a given interface protocol. In an exemplary embodiment, the give interface protocol may include at least one of various interface protocols such as a peripheral component interconnect express (PCI-express) interface, a nonvolatile memory express (NVMe) interface, a serial ATA (SATA) interface, a serial attached SCSI (SAS) interface, and a universal flash storage (UFS) interface, but the inventive concept is not limited thereto.

The memory controller 110 may communicate with the nonvolatile memory device 120 through the flash interface circuit 116. In an exemplary embodiment, the flash interface circuit 116 may be implemented based on a NAND interface, a toggle interface, or an open NAND flash interface (ONFI). In an exemplary embodiment, the flash interface circuit 116 may include a flash memory controller (not illustrated) (FMC) which independently controls a plurality of nonvolatile memories included in the nonvolatile memory device 120.

Figure 3:
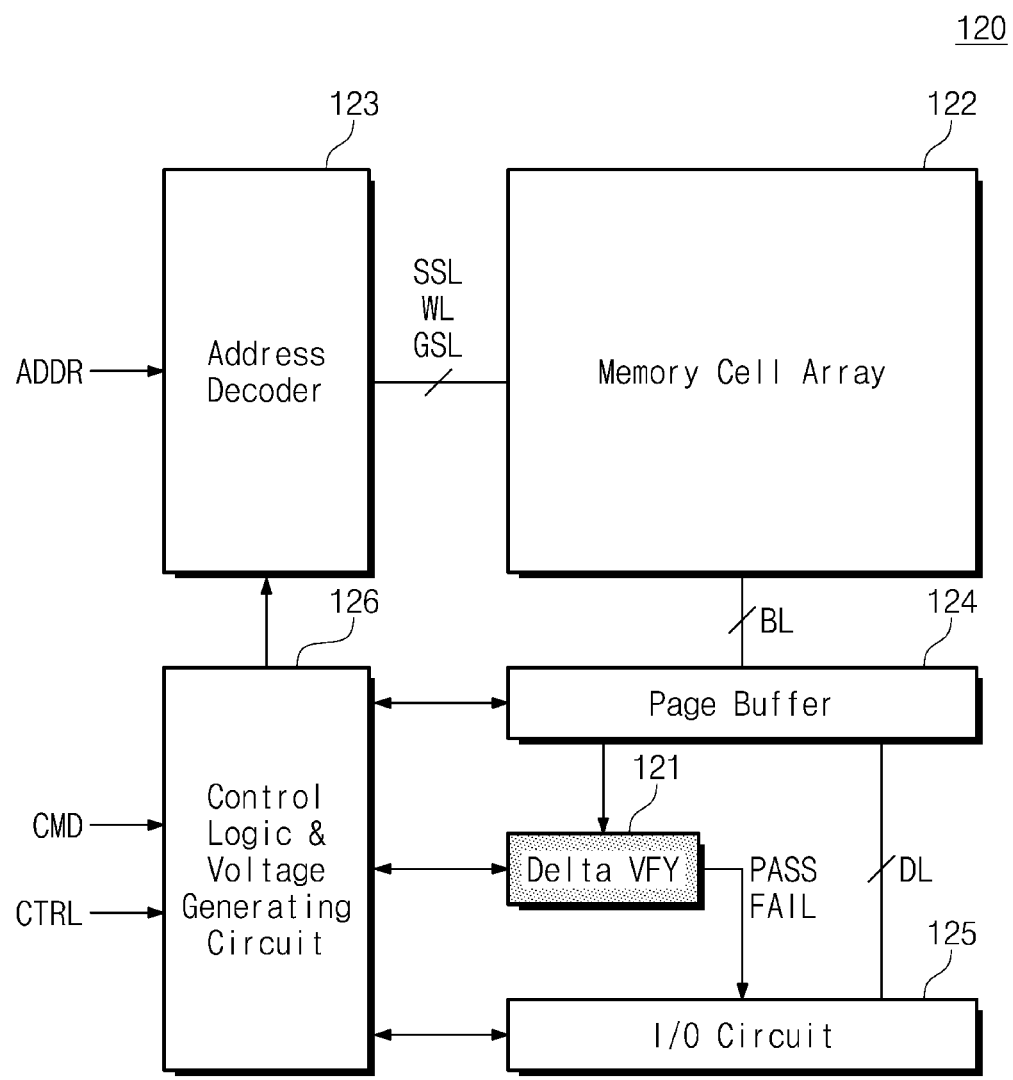
FIG. 3 is a block diagram illustrating a nonvolatile memory device of FIG. 1.

FIG. 3 is a block diagram illustrating a nonvolatile memory device of FIG. 1. Referring to FIGS. 1 and 3, the nonvolatile memory device 120 may include the erase delta verification logic circuit 121, a memory cell array 122, an address decoder 123, a page buffer 124, an input/output circuit 125, and a control logic and voltage generating circuit 126.

The erase delta verification logic circuit 121 may perform the delta verification on a memory block selected for erasing. A configuration and a delta verification operation of the erase delta verification logic circuit 121 will be more fully described with reference to the following drawings.

The memory cell array 122 may include a plurality of memory blocks. Each of the plurality of memory blocks may include a plurality of memory cells. A configuration of a memory block will be more fully described with reference to FIG. 4.

The address decoder 123 may be connected with the memory cell array 122 through string selection lines SSL, wordlines WL, and ground selection lines GSL. The address decoder 123 may decode an address ADDR received from the memory controller 110 and may control the string selection lines SSL, the wordlines WL, and the ground selection lines GSL based on the decoded address.

The page buffer 124 may be connected with the memory cell array 122 through bitlines BL. The page buffer 124 may temporarily store data to be stored in memory cells of the memory cell array 122 through the bitlines BL. Alternatively, the page buffer 124 may control levels of the bitlines BL based on data received from the input/output circuit 125 through data lines DL.

The input/output circuit 125 may receive data from the page buffer 124 through the data lines DL and may transfer the received data to the memory controller 110. Alternatively, the input/output circuit 125 may transfer data received from the memory controller 110 to the page buffer 124 through the data lines DL.

The control logic and voltage generating circuit 126 (hereinafter referred to as a "control logic circuit") may control components of the nonvolatile memory device 120 in response to a command CMD and a control signal CTRL from the memory controller 110. The control logic circuit and voltage generating circuit 126 may generate various voltages necessary for the nonvolatile memory device 120 to operate. For example, the control logic circuit and voltage generating circuit 126 may generate various voltages such as a plurality of program voltages, a plurality of program verification voltages, a plurality of read voltages, a plurality of erase voltages, and a plurality of erase verification voltages. Various voltages (e.g., an erase voltage and an erase verification voltage) to be described below may be generated by the control logic circuit and voltage generating circuit 126 and may be provided to a relevant wordline through the address decoder 123 or to a substrate where the nonvolatile memory device 120 is formed.

Figure 4A:
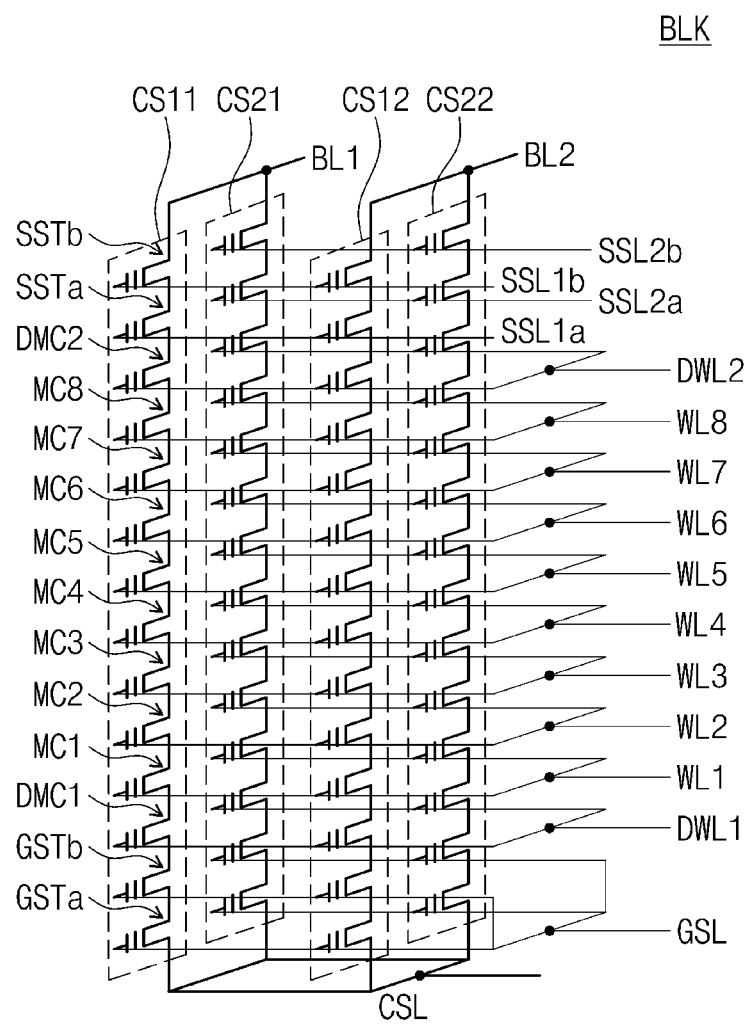
FIG. 4A is a circuit diagram illustrating one memory block BLK of a plurality of memory blocks included in a memory cell array of FIG. 3.

FIG. 4A is a circuit diagram illustrating one memory block BLK of a plurality of memory blocks included in a memory cell array of FIG. 3. One memory block BLK will be described with reference to FIG. 4A, but the inventive concept is not limited thereto. A plurality of memory blocks included in the memory cell array 122 may have a structure that is identical or similar to the structure of the memory block BLK illustrated in FIG. 4A. Referring to FIGS. 3 and 4A, the memory block BLK may include a plurality of cell strings CS11, CS12, CS21, and CS22. The plurality of cell strings CS11, CS12, CS21, and CS22 may be arranged in a row direction and a column direction.

Cell strings placed at the same column from among the plurality of cell strings CS11, CS12, CS21, and CS22 may be connected with the same bitline. For example, the cell strings CS11 and CS21 may be connected with a first bitline BL1, and the cell strings CS12 and CS22 may be connected with a second bitline BL2. Each of the plurality of cell strings CS11, CS12, CS21, and CS22 may include a plurality of cell transistors. Each of the plurality of cell transistors may include a charge trap flash (CTF) memory cell, but the inventive concept is not limited thereto. The plurality of cell transistors may be stacked in a height direction that is a direction perpendicular to a plane (e.g., a semiconductor substrate (not illustrated)) defined by the row direction and the column direction.

In each cell string, the plurality of cell transistors may be connected in series between the corresponding bitline (e.g., BL1 or BL2) and the common source line CSL. For example, the plurality of cell transistors may include string selection transistors SSTa and SSTb, dummy memory cells DMC1 and DMC2, memory cells MC1 to MC8, and ground selection transistors GSTa and GSTb. The string selection transistors SSTa and SSTb that are connected in series may be provided or connected between the serially-connected memory cells MC1 to MC8 and the corresponding bitline (e.g., BL1 and BL2). The ground selection transistors GSTa and GSTb that are connected in series may be provided or connected between the serially-connected memory cells MC1 to MC8 and the common source line CSL. In an exemplary embodiment, the second dummy memory cell DMC2 may be provided between the serially-connected string selection transistors SSTa and SSTb and the serially-connected memory cells MC1 to MC8, and the first dummy memory cell DMC1 may be provided between the serially-connected memory cells MC1 to MC8 and the serially-connected ground selection transistors GSTa and GSTb.

In each of the plurality of cell strings CS11, CS12, CS21, and CS22, memory cells placed at the same height from among the memory cells MC1 to MC8 may share the same wordline. For example, the first memory cells MC1 of the plurality of cell strings CS11, CS12, CS21, and CS22 may be placed at the same height from the substrate (not illustrated) and may share a first wordline WL1. The second memory cells MC2 of the plurality of cell strings CS11, CS12, CS21, and CS22 may be placed at the same height from the substrate and may share a second wordline WL2. Likewise, the third to eighth memory cells MC3 to MC8 of the plurality of cell strings CS11, CS12, CS21, and CS22 may be placed at the same heights from the substrate and may share third to eighth wordlines WL3 to WL8, respectively.

Dummy memory cells positioned at the same height from among the dummy memory cells DMC1 and DMC2 of the plurality of cell strings CS11, CS12, CS21, and CS22 may share the same dummy wordline. For example, the first dummy memory cells DMC1 of the plurality of cell strings CS11, CS12, CS21, and CS22 may share a first dummy wordline DWL1, and the second dummy memory cells DMC2 of the plurality of cell strings CS11, CS12, CS21, and CS22 may share a second dummy wordline DWL2.

String selection transistors placed at the same height and the same row from among the string selection transistors SSTa and SSTb of the plurality of cell strings CS11, CS12, CS21, and CS22 may share the same string selection line. For example, the string selection transistors SSTb of the cell strings CS11 and CS12 may share a string selection line SSL1b, and the string selection transistors SSTa of the cell strings CS11 and CS12 may share a string selection line SSL1a. The string selection transistors SSTb of the cell strings CS21 and CS22 may share a string selection line SSL2b, and the string selection transistors SSTa of the cell strings CS21 and CS22 may share a string selection line SSL2a.

Although not illustrated in FIG. 4A, string selection transistors placed at the same row from among the string selection transistors SSTa and SSTb of the plurality of cell strings CS11, CS12, CS21, and CS22 may share the same string selection line. For example, the string selection transistors SSTb and SSTa of the cell strings CS11 and CS12 may share a first string selection line, and the string selection transistors SSTb and SSTa of the cell strings CS21 and CS22 may share a second string selection line different from the first string selection line.

Ground selection transistors placed at the same height and the same row from among the ground selection transistors GSTa and GSTb of the plurality of cell strings CS11, CS12, CS21, and CS22 may share the same ground selection line. Although not illustrated in FIG. 4A, the ground selection transistors GSTb of the cell strings CS11 and CS12 may be connected with a first ground selection line, and the ground selection transistors GSTa of the cell strings CS11 and CS12 may share a second ground selection line. The ground selection transistors GSTb of the cell strings CS21 and CS22 may be connected with a third ground selection line, and the ground selection transistors GSTa of the cell strings CS21 and CS22 may share a fourth ground selection line.

As illustrated in FIG. 4A, the ground selection transistors GSTb and GSTa of the plurality of cell strings CS11, CS12, CS21, and CS22 may share the same ground selection line GSL. Although not illustrated in FIG. 4A, ground selection transistors placed at the same height from among the ground selection transistors GSTb and GSTa of the plurality of cell strings C S11, CS12, CS21, and CS22 may share the same ground selection line; alternatively, ground selection transistors placed at the same row from among the ground selection transistors GSTb and GSTa of the plurality of cell strings CS11, CS12, CS21, and CS22 may share the same ground selection line.

In an exemplary embodiment, although not illustrated in FIG. 4A, each of the plurality of cell strings CS11, CS12, CS21, and CS22 of the memory block BLK may further include an erase control transistor (ECT). The erase control transistors of the plurality of cell strings CS11, CS12, CS21, and CS22 may be placed at the same height from the substrate and may be connected with the same erase control line (ECL). For example, in each of the plurality of cell strings CS11, CS12, CS21, and CS22, the erase control transistor ECT may be interposed between the ground selection transistor GSTa and the common source line CSL. Alternatively, in each of the plurality of cell strings CS11, CS12, CS21, and CS22, the erase control transistor may be interposed between the corresponding bitline BL1 or BL2 and the string selection transistor SSTb. However, the inventive concept is not limited thereto.

In an exemplary embodiment, the memory block BLK illustrated in FIG. 4A is exemplary. For example, the number of cell strings may increase or decrease, and the number of rows of cell strings and the number of columns of cell strings may increase or decrease depending on the change in the number of cell strings. Also, the number of cell transistors (e.g., GST, MC, DMC, and SST) in the memory block BLK may increase or decrease, and the height of the memory block BLK may increase or decrease depending on the number of cell transistors (e.g., GST, MC, DMC, and SST). In addition, depending on the number of cell transistors, the number of lines (e.g., GSL, WL, DWL, and SSL) connected with the cell transistors may increase or decrease.

Figure 4B:
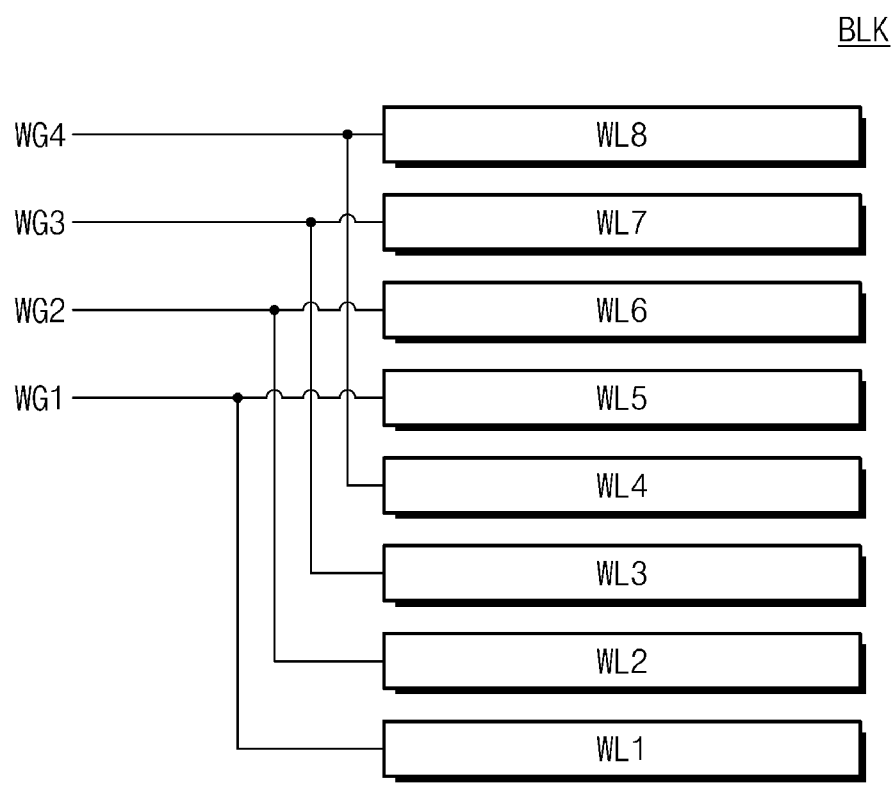
FIG. 4B is a diagrams for describing a wordline group of a memory block of FIG. 4A.

FIG. 4B is a diagrams for describing a wordline group of a memory block of FIG. 4A. Below, the term "wordline group" is used to describe the inventive concept easily. One wordline group may include at least two wordlines connected with one memory block.

For example, referring to FIG. 4B, the memory block BLK may include first to eighth wordlines WL1 to WL8. The first to eighth wordlines WL1 to WL8 may be divided into first to fourth wordline groups WG1 to WG4. In an embodiment, the first wordline group WG1 may include the first and fifth wordlines WL1 and WL5, the second wordline group WG2 may include the second and sixth wordlines WL2 and W6, the third wordline group WG3 may include the third and seventh wordlines WL3 and WL7, and the fourth wordline group WG4 may include the fourth and eighth wordlines WL4 and WL8. In a partial verification operation or a delta verification operation, the first to eighth wordlines WL1 to WL8 may be controlled in units of wordline group.

FIG. 5 is a flowchart illustrating an erase operation of a nonvolatile memory device of FIG. 3. For convenience of description, it is assumed that the nonvolatile memory device 120 performs an erase operation on one memory block (hereinafter referred to as a "selected memory block"). However, the inventive concept is not limited thereto. For example, the nonvolatile memory device 120 may perform the erase operation in units of wordline, sub-block, memory block, or super block, Below, it is assumed that a memory block selected for erasing is the memory block BLK described with reference to FIGS. 4A and 4B. For example, the selected memory block BLK may include the first to eighth wordlines WL1 to WL8 or may be connected with the first to eighth wordlines WL1 to WL8. As described with reference to FIG. 4B, the first to eighth wordlines WL1 to WL8 may be divided into the first to fourth wordline groups WG1 to WG4.

Below, for brevity of drawing and convenience of description, an erase operation in step S100, a block verification operation BV in step S110, a partial verification operation PV in step S120, and a delta verification operation DV in step S130 are illustrated independently of each other, but the inventive concept is not limited thereto. For example, the selected memory block BLK may be erased based on an incremental step pulse erase (ISPE) manner. According to the ISPE manner, one erase procedure may include a plurality of erase loops. Each of the plurality of erase loops may include an erase operation and a verification operation. In the ISPE manner, each loop of the erase procedure may include the erase operation in step S100, and the verification operation may include the block verification operation BV in step S110, the partial verification operation PV in step S120, or the delta verification operation DV in step S130. For example, when a verification result in step S110, step S120, or step S130 indicates a fail (i.e., is determined as a fail), the nonvolatile memory device 120 may perform the next loop of the erase procedure until the number of loop in the erase procedure reaches a predetermined number of erase loops. In the next loop, a magnitude of an erase voltage for an erase operation may stepwise increase. When the erase procedure reaches the predetermined number of erase loops without being determined as a pass, the erase procedure is determined as a fail. When the erase operation in a loop is determined as a pass before the erase procedure reaches the predetermined number of erase loops, the erase procedure ends and is determined as a pass.

Below, for convenience of description, that the verification result in step S110, step S120, or step S130 indicates a fail may mean that a final verification result indicates a fail after performing all the erase loops in the predetermined number of erase loops (i.e., the number of erase loops being in advance determined). For example, the erase operation in step S100 is not again performed when the verification result in step S110, step S120, or step S130 indicates a fail. However, the inventive concept is not limited thereto. For example, as described above, the erase operation in step S100 may be performed by the predetermined number of erase loops. As an erase loop progresses, a magnitude of an erase voltage that is used in the erase operation may stepwise increase. The contents described above are only for describing the inventive concept easily, and it may be understood that the inventive concept is not limited thereto.

Referring to FIGS. 3 and 5, in step S100, the nonvolatile memory device 120 may perform the erase operation on the selected memory block BLK. For example, the nonvolatile memory device 120 may perform the erase operation on the selected memory block BLK by applying the erase voltage to a substrate (not illustrated). In an exemplary embodiment, the nonvolatile memory device 120 may perform the erase operation in step S100 in response to a program command for the selected memory block BLK from the memory controller 110. Alternatively, the nonvolatile memory device 120 may perform the erase operation in step S100 in response to an erase command (e.g., a trim command or a sanitize command) from the memory controller 110.

In step S110, the nonvolatile memory device 120 may perform the block verification operation BV. For example, the nonvolatile memory device 120 may verify a threshold voltage distribution or erase states of memory cells included in the selected memory block BLK by applying a 0-th erase verification voltage EV0 to wordlines connected with the selected memory block BLK. The block verification operation BV will be more fully described with reference to FIGS. 7 to 8C.

When a result of the block verification operation BV indicates FAIL, in step S142, the nonvolatile memory device 120 may determine the erase operation of the selected memory block BLK as FAIL.

When the result of the block verification operation BV indicates PASS, in step S120, the nonvolatile memory device 120 may perform the partial verification operation PV. For example, the nonvolatile memory device 120 may count the number of fail bits for each wordline group using the 0-th erase verification voltage EV0 and may compare the counted number of fail bits for each wordline group with a reference value. The partial verification operation PV will be more fully described with reference to FIGS. 9 to 10B.

When the result of the partial verification operation PV indicates FAIL, in step S142, the nonvolatile memory device 120 may determine the erase operation of the selected memory block BLK as FAIL.

When the result of the partial verification operation PV indicates PASS, in step S130, the nonvolatile memory device 120 may perform the delta verification operation DV. For example, the nonvolatile memory device 120 may count the number of fail bits for each wordline group using a first erase verification voltage EV1. The nonvolatile memory device 120 may determine whether the erase operation passes or fails, based on a difference between the counted numbers of fail bits for respective wordline groups or a distribution of the fail bits for respective wordline groups. In an exemplary embodiment, a level of the first erase verification voltage EV1 used in the delta verification operation DV may be lower than a level of the 0-th erase verification voltage EV0 used in the block verification operation BV or the partial verification operation PV. In an exemplary embodiment, whether memory cells of a wordline have soft defects in the selected memory block BLK may be determined through the delta verification operation DV. The delta verification operation DV will be more fully described with reference to FIGS. 11 to 13B.

When the result of the delta verification operation DV indicates FAIL, in step S142, the nonvolatile memory device 120 may determine the erase operation of the selected memory block BLK as FAIL.

When the result of the delta verification operation DV indicates PASS (i.e., all the results of the block verification operation BV, the partial verification operation PV, and the delta verification operation DV indicate PASS), in step S141, the nonvolatile memory device 120 may determine the erase operation of the selected memory block BLK as PASS.

In an exemplary embodiment, the nonvolatile memory device 120 may provide the memory controller 110 with information about a result (i.e., pass or fail) of the erase operation performed on the selected memory block BLK. Alternatively, when the result of the erase operation of the selected memory block BLK indicates PASS, the nonvolatile memory device 120 may additionally perform the following operation (e.g., may additionally perform a program operation on the erase-passed memory block).

As described above, the nonvolatile memory device 120 according to an embodiment of the inventive concept may detect whether memory cells of a wordline have soft defects in a selected memory block, by performing the delta verification on the selected memory block. Accordingly, the reliability of the nonvolatile memory device 120 may be improved.

The block verification operation BV, the partial verification operation PV, and the delta verification operation DV will be more fully described with reference to the following drawings.

Figure 6:
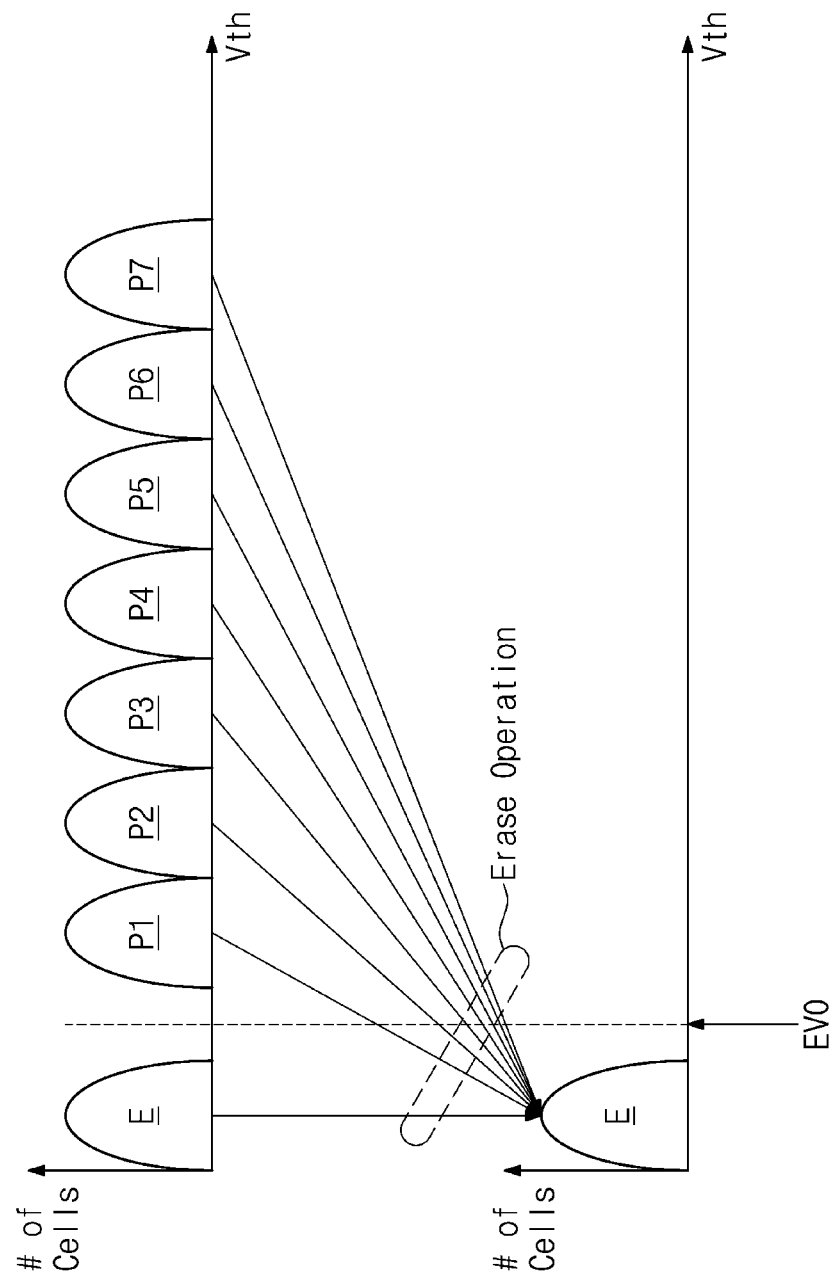
FIG. 6 is a distribution diagram illustrating a threshold voltage distribution of memory cells included in a memory block of FIG. 4A.

FIG. 6 is a distribution diagram illustrating a threshold voltage distribution of memory cells included in a memory block of FIG. 4A. In the distribution diagrams of FIG. 6, a horizontal axis represents a threshold voltage of a memory cell, and a vertical axis represents the number of memory cells. Step S100 of FIG. 5, which is the erase operation, will be described with reference to FIG. 6. For convenience of description, it is assumed that the memory block BLK is a selected memory block and each of memory cells included in the memory block BLK is a triple level cell (TLC) which stores three bits. However, the inventive concept is not limited thereto. For example, each of the memory cells may be a multi-level memory cell which stores at least two or more bits.

Referring to FIGS. 4A and 6, each of the memory cells of the memory block BLK may have one of an erase state "E" and first to seventh program states P1 to P7. In the erase operation, the memory cells of the memory block BLK may be erased to form a threshold voltage distribution of the erase state "E". For example, the nonvolatile memory device 120 may perform the erase operation on the memory block BLK by applying an erase voltage to a substrate where the memory block BLK is placed and applying a wordline erase voltage (e.g., 0V) to wordlines connected with the memory block BLK. However, the inventive concept is not limited thereto. For example, the erase operation may be performed through various manners. In an embodiment, one or more erase cycles of the erase operation may be performed to erase the plurality of memory cells in the memory block BLK. For example, the erase cycles are performed consecutively until a respective erase verify passes or until a certain number of erase cycles are performed without an erase verifying being determined as a pass. Each erase cycle may include an erase verify that may include applying an erase verify voltage for that cycle to wordlines. In an embodiment, the erase verify may include the block verification of step S110, the partial verification of S120, and the delta verification of step S130. The erase verify may include determining whether the memory cells are erased by sensing a current through the memory cells (i.e., current sensing) or a certain voltage level at a sensing node of a bit line (i.e., voltage sensing). For example, a string of memory cells may be determined as erased when a certain level of current passing through the bit line selectively coupled to the string is sensed or a certain level of voltage at a sensing node connected to the bit line selectively coupled to the string is sensed.

In an exemplary embodiment, an upper limit value of the threshold voltage distribution of the erase state "E" may be lower than the 0-th erase verification voltage EV0. In an exemplary embodiment, the 0-th erase verification voltage EV0 may be a level that is in advance determined based on a physical characteristic, an end of life (EOF) characteristic, and the like of the nonvolatile memory device 120. The 0-th erase verification voltage EV0 will be more fully described with reference to FIG. 8A.

Figure 7:
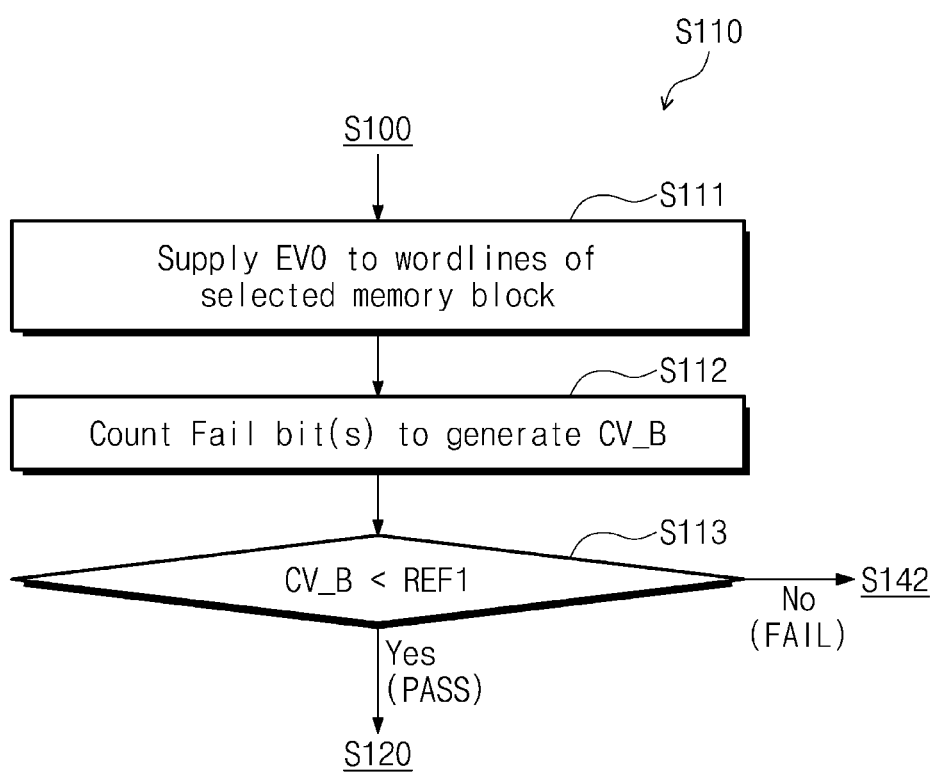
FIG. 7 is a flowchart illustrating step S110 of FIG. 5 which is a block verification operation.

FIG. 7 is a flowchart illustrating step S110 of FIG. 5 which is a block verification operation. Referring to FIGS. 3 to 7, the block verification operation BV in step S110 may include operations in step S111 to step S113.

In step S111, the nonvolatile memory device 120 may apply the 0-th erase verification voltage EV0 to the wordlines WL1 to WL8 of the selected memory block BLK. A pass voltage VPASS is also applied to the select string transistors SSTa and SSTb, and the ground selection transistor GSTa and GSTb, as shown in FIG. 4A. For example, the wordlines WL1 to WL8, the select string transistors SSTa and SSTb, and the ground selection transistor GSTa and GSTb may constitute a plurality of strings. Memory cells of each wordline, two string transistors SSTa and SSTb, two ground selection transistors GSTa and GSTb which are connected in series with each other may constitute a string which is selectively connected to a bit line using the select string transistors SSTa and SSTb. For example, when the memory block BLK is assumed to have 1024 bitlines, the memory block BLK includes at least 1024 strings. Each string may be selectively connected to a corresponding bit line with the two select string transistors SSTa and SSTb of the string. In step S110 of the block verification, a string of memory cells of the wordlines WL1 to WL8 may be determined as erased when a certain level of current passing through the bitline selectively coupled to the string is sensed or a certain level of voltage at a sensing node connected to the bitline selectively coupled to the string is sensed. In the block verification of step S110, each bit line may be verified whether a certain level of current passing through the bitline is sensed or a certain level of voltage at a sensing node connected to the bitline is sensed. Hereinafter, for brevity of description, the block verification of step S110 will be described as using current sensing, but it will be understood that the description is equally applicable to voltage sensing. When a certain level of current passing thorough the bit line is not sensed, the bitline is a fail bitline, and otherwise, the bitline is a pass bitline. The memory cells of the wordlines WL1 to WL8 in a string which is connected to a fail bitline may include at least one memory cell which is not normally erased. All of the memory cells of the wordlines WL1 to WL8 in a string which is connected to a pass bitline may be normally erased.

In step S112, the nonvolatile memory device 120 may count fail bits (i.e., fail bitlines) from the selected memory block BLK to generate a fail bit counting value CV_B of a memory block (for brief expression, hereinafter referred to as a "block counting value"). For example, as illustrated in FIG. 6, when the memory cells of the memory block BLK are normally erased (i.e., when the memory cells have the erase state "E"), threshold voltages of the memory cells may be lower than the 0-th erase verification voltage EV0. In an embodiment, the fail bit counting value CV_B may be a number of fail bitlines among a plurality of bitlines in the memory block BLK or a number of memory cells having a threshold voltage higher than the 0-th erase verification voltage EV0.

In contrast, when the memory cells of the memory block BLK are not normally erased (i.e., when the memory cells do not have the erase state "E", have threshold voltages higher than the threshold voltage distribution of the erase state "E", or have threshold voltages higher than the 0-th erase verification voltage EV0), threshold voltages of specific memory cells may be higher than the 0-th erase verification voltage EV0. The memory cells having threshold voltages higher than the 0-th erase verification voltage EV0 are not turned on by the 0-th erase verification voltage EV0, and a certain level of current passing through the bitline selectively connected to the string of the memory cells is not sensed. The nonvolatile memory device 120 may count the number of fail bits of the memory block BLK based on the number of memory cells not turned on (or based on the number of bitlines respectively corresponding to memory cells not turned on) and may generate the block counting value CV_B.

In step S113, the nonvolatile memory device 120 may compare the block counting value CV_B with a first reference value REF1. In an exemplary embodiment, the first reference value REF1 may be a value corresponding to the error correction capability of the ECC engine 113 described with reference to FIG. 2. Alternatively, the first reference value REF1 may be a value corresponding to the number of errors capable of being recovered through a separate error correction operation or a separate data recovery operation.

For example, when the block counting value CV_B is determined to being equal to or more than the first reference value REF1, data stored in the memory block BLK or data to be programmed later may have errors. When the block counting value CV_B is equal to or more than the first reference value REF1, a result of the block verification operation BV performed on the memory block BLK may be determined as FAIL, and the nonvolatile memory device 120 may perform an operation in step S142.

When the block counting value CV_B is less than the first reference value REF1, the probability is low that data stored in the memory block BLK or data to be programmed later may have errors. When the block counting value CV_B is less than the first reference value REF1, a result of the block verification operation BV performed on the memory block BLK may be determined as PASS, and the nonvolatile memory device 120 may perform an operation in step S120.

Figure 8A:
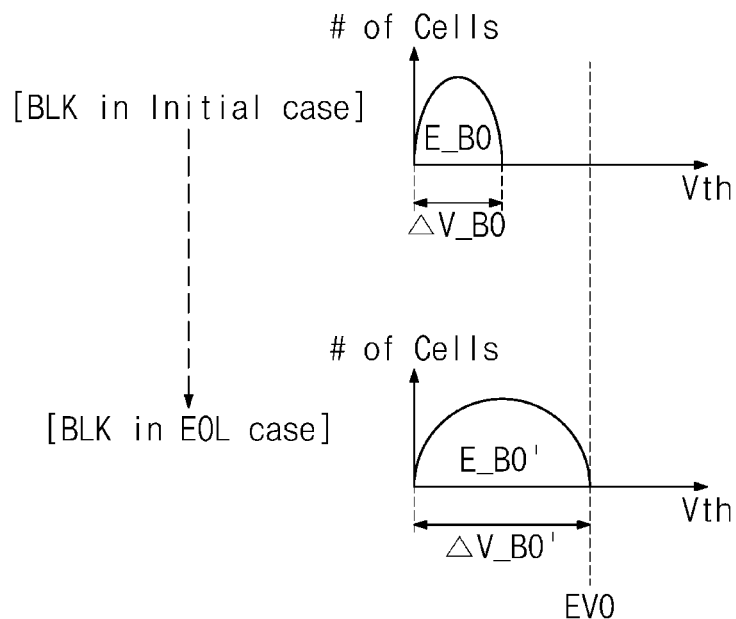
FIGS. 8A to 8C are diagrams for describing a block verification operation of a flowchart of FIG. 7.
Figure 8B:
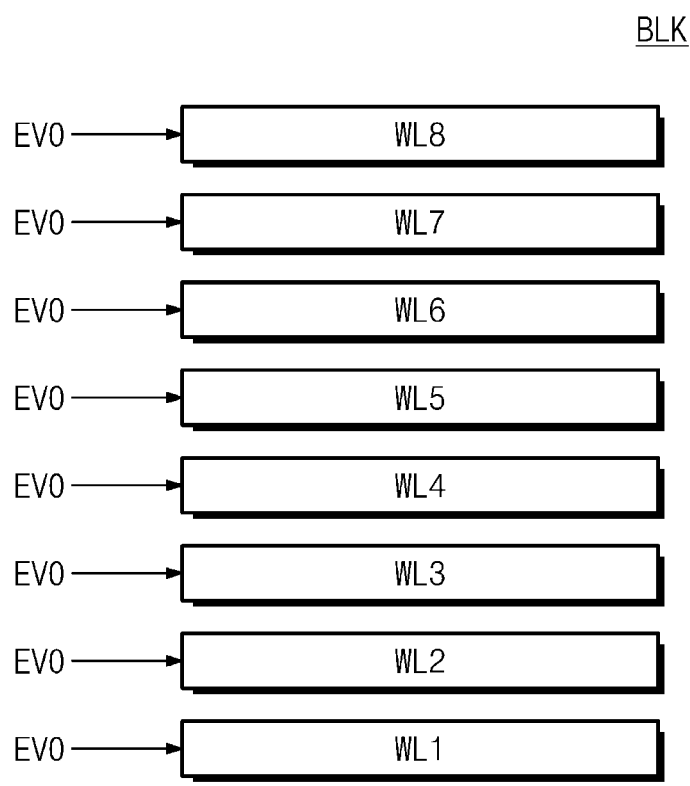
Figure 8C:
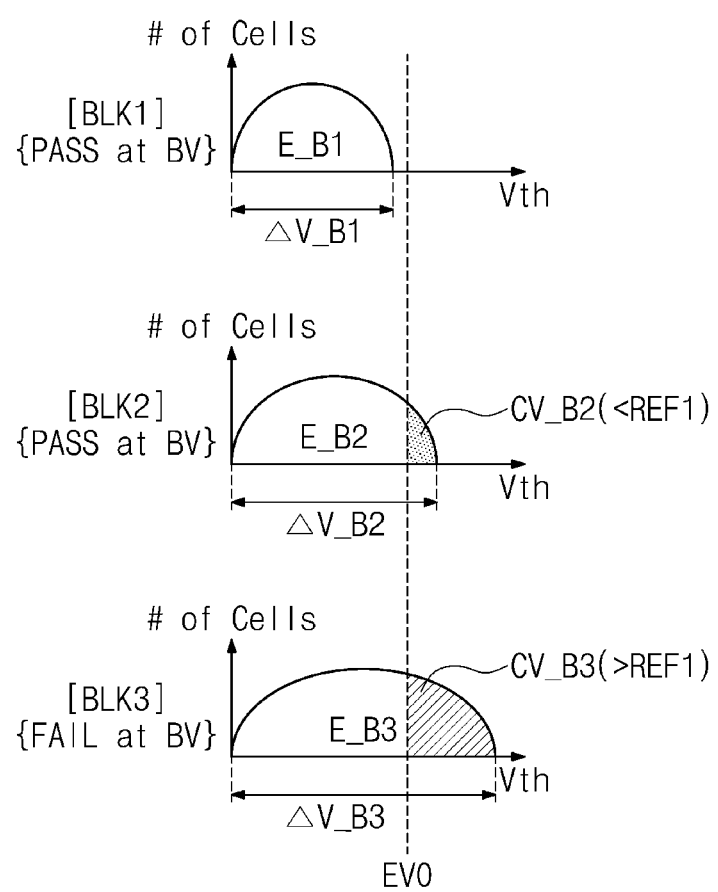

FIGS. 8A to 8C are diagrams for describing a block verification operation of a flowchart of FIG. 7. For brevity of drawing, distribution diagrams corresponding to the erase state "E" of the memory cells of the memory block BLK are illustrated. For convenience of description, a reference sign "X_B" is used. Here, "X_B" means that a component marked by a reference sign "X" corresponds to a memory block. For example, a reference sign "E_B0" may refer to the erase state "E" of the memory cells included in the memory block BLK. However, the above expressions are simple examples for describing the configuration of the inventive concept, and the inventive concept is not limited thereto.

First, referring to FIG. 8A, as the life of the nonvolatile memory device 120 ends (e.g., the number of program/erase cycles increases), the threshold voltage distribution corresponding to the erase state "E" of the memory block BLK may change. For example, the memory cells of the memory block BLK in an initial state may have a block erase state E_B0, and the memory cells of the memory block BLK in an end of life (EOL) state may have a block erase state E_B0'. A width of a threshold voltage distribution of the block erase state E_B0 may be ΔV_B0, and a width of a threshold voltage distribution of the block erase state E_B0' may be ΔV_B0'. ΔV_B0' may be greater than ΔV_B0. As the life of the nonvolatile memory device 120 approaches the EOL state, the threshold voltage distribution of the memory cells may be widely broadened.

In an exemplary embodiment, the 0-th erase verification voltage EV0 that is used in the block verification operation BV may be determined in consideration of the EOL state of the nonvolatile memory device 120. For example, as illustrated in FIG. 8A, the 0-th erase verification voltage EV0 may be determined based on an upper limit value of the threshold voltage distribution of the block erase state E_B0' of the memory block BLK in the EOL state.

This may be for preventing the memory block BLK in the EOL state to be determined as a bad block. For example, when an erase verification voltage is determined based on the block erase state E_B0 of the memory block BLK in the initial state, the block verification operation of the memory block BLK in the EOL state may fail. When an erase verification voltage is determined based on the block erase state E_B0 of the memory block BLK in the initial state, the memory block BLK in the EOL state may be managed as a bad block irrespective of whether the memory block BLK in the EOL state operates as a normal block. Since the memory block BLK in the EOL state which may be used as a normal block is determined as a bad block, the utility or life of the nonvolatile memory device 120 may decrease. As the 0-th erase verification voltage EV0 is determined in consideration of the EOL state of the nonvolatile memory device 120, the utility or life of the nonvolatile memory device 120 may be maintained or improved.

Next, referring to FIG. 8B, in the block verification operation of the memory block BLK, the 0-th erase verification voltage EV0 may be applied to the plurality of wordlines WL1 to WL8 connected with the memory block BLK. As described above, when a threshold voltage of a specific memory cell is higher than the 0-th erase verification voltage EV0, the specific memory cell may be turned off. When the threshold voltage of the specific memory cell is higher than the 0-th erase verification voltage EV0, a fail bit occurs at the specific memory cell or the probability that a fail bit occurs at the specific memory cell is high. The nonvolatile memory device 120 may count the number of specific memory cells turned off or the number of bitlines corresponding to the specific memory cells turned off, and may generate the block counting value CV_B.

Then, referring to FIG. 8C, block erase states E_B1 to E_B3 associated with first to third memory blocks BLK1 to BLK3 are illustrated. Memory cells of the first memory block BLK1 may have the first block erase state E_B1. For example, a width of a threshold voltage distribution of the first block erase state E_B1 may be ΔV_B1, and an upper limit value of the threshold voltage distribution of the first block erase state E_B1 may be lower than the 0-th erase verification voltage EV0. For example, in the block verification operation BV of the first memory block BLK1, fail bits of the first memory block BLK1 are not counted, and a result of the block verification operation BV of the first memory block BLK 1 may be determined as PASS.

Memory cells of the second memory block BLK2 may have the second block erase state E_B2. For example, a width of a threshold voltage distribution of the second block erase state E_B2 may be ΔV_B2, and an upper limit value of the threshold voltage distribution of the second block erase state E_B2 may be higher than the 0-th erase verification voltage EV0. In the block verification operation BV of the second memory block BLK2, the number of fail bits of the second memory block BLK2 may correspond to a second block counting value CV_B2. In an exemplary embodiment, the second block counting value CV_B2 may correspond to the number of memory cells having threshold voltages higher than the 0-th erase verification voltage EV0 from among the memory cells of the second memory block BLK2. The second block counting value CV_B2 may be smaller than the first reference value REF1. Errors occurring at the memory cells of the second memory block BLK2 may be cured through the ECC engine 113 or any other error correction operation. A result of the block verification operation BV performed on the second memory block BLK2 may be determined as PASS.

Memory cells of the third memory block BLK3 may have the third block erase state E_B3. For example, a width of a threshold voltage distribution of the third block erase state E_B3 may be ΔV_B3, and an upper limit value of the threshold voltage distribution of the third block erase state E_B3 may be higher than the 0-th erase verification voltage EV0. In the block verification operation BV of the third memory block BLK3, the number of fail bits of the third memory block BLK3 may correspond to a third block counting value CV_B3. The third block counting value CV_B3 may be greater than the first reference value REF1, and errors occurring at the memory cells of the third memory block BLK3 are not cured through the ECC engine 113 or any other error correction operation. A result of the block verification operation BV performed on the third memory block BLK3 may be determined as FAIL.

As described above, the nonvolatile memory device 120 may perform the erase operation on the selected memory block BLK (i.e., may perform an operation of decreasing threshold voltages of the memory cells of the selected memory block BLK) and may then perform the block verification operation BV on the selected memory block BLK. When a result of the block verification operation BV indicates FAIL, the erase operation of the selected memory block BLK may be determined as FAIL, or the selected memory block BLK may be managed as a bad block by the memory controller 110.

When a result of the block verification operation BV indicates PASS, the nonvolatile memory device 120 may perform the partial verification operation PV to be described with reference to FIGS. 9 to 10B.

Figure 9:
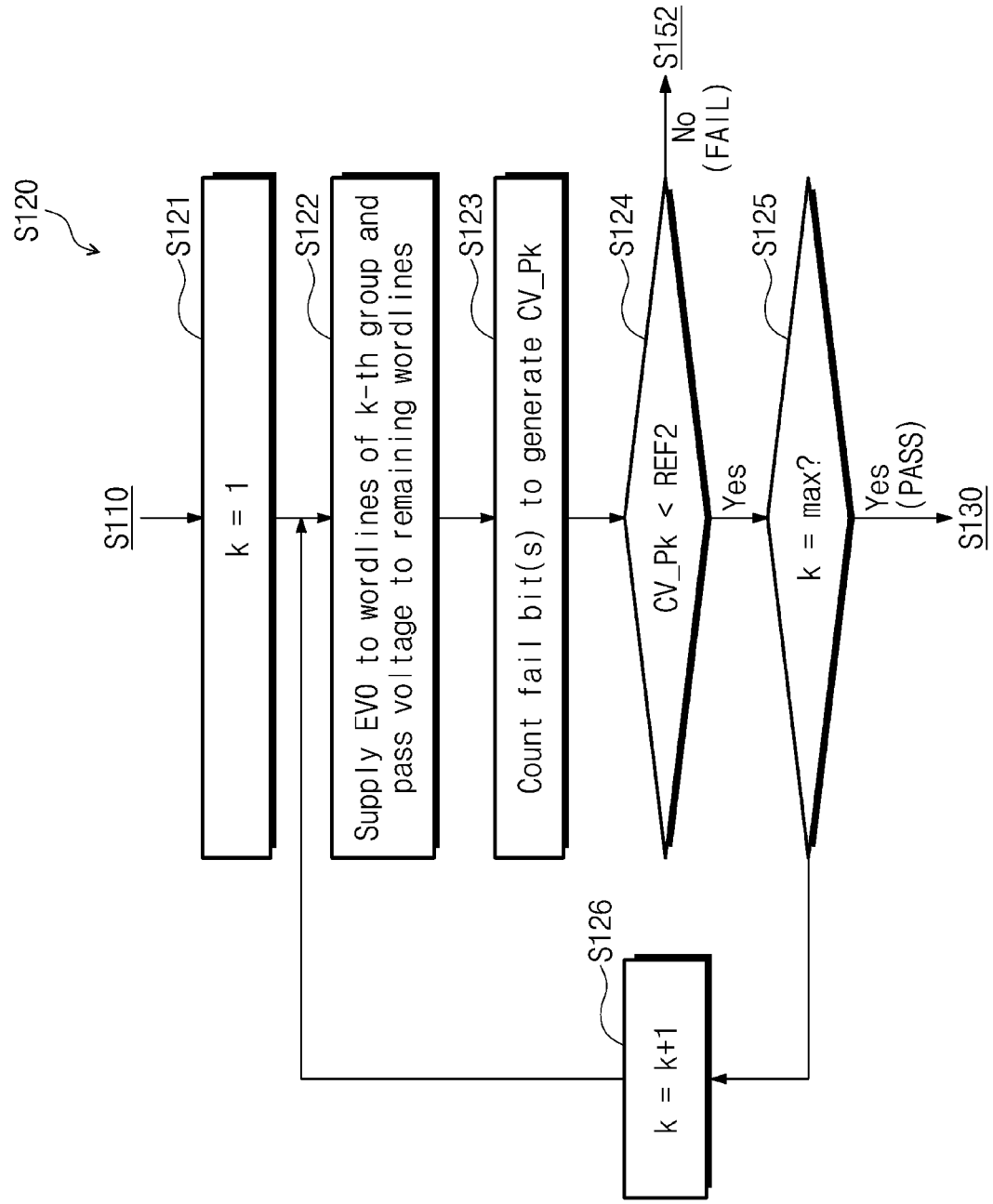
FIG. 9 is a flowchart illustrating step S120 of FIG. 5 which is a partial verification operation.
Figure 10A:
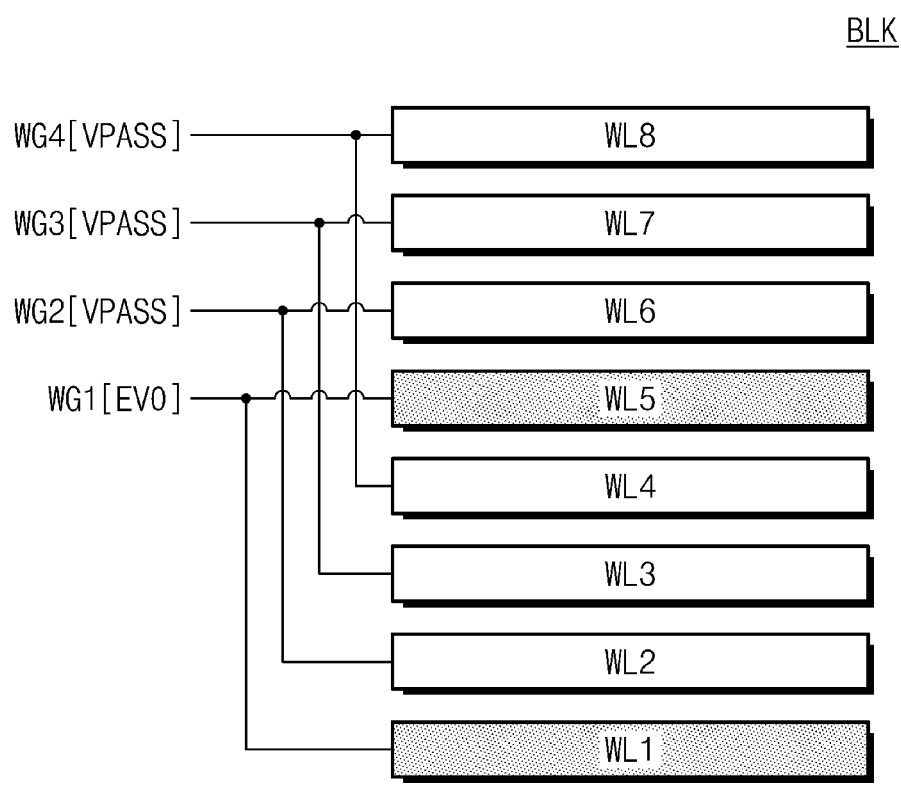
FIGS. 10A and 10B are diagrams for describing a partial verification operation of FIG. 9.

FIG. 9 is a flowchart illustrating step S120 of FIG. 5, that is, a partial verification operation. FIGS. 10A and 10B are diagrams for describing a partial verification operation of FIG. 9. Referring to FIGS. 5 and 9 to 10B, when a result of the block verification operation BV in step S110 indicates PASS, the partial verification operation PV in step S120 may be performed. The partial verification operation PV in step S120 may include operations in step S121 to step S126.

In step S121, a variable "k" may be set to "1". In an exemplary embodiment, the variable "k" is used to describe the iteration of fail bit counting associated with a wordline group, and the inventive concept is not limited thereto.

In step S122, the nonvolatile memory device 120 may apply the 0-th erase verification voltage EV0 to wordlines of a k-th wordline group of wordline groups of the selected memory block BLK and may apply a pass voltage VPASS to wordlines of the remaining wordline groups. The pass voltage VPASS is also applied to the select string transistors SSTa and SSTb, and the ground selection transistor GSTa and GSTb, as shown in FIG. 4A. In step S123, the nonvolatile memory device 120 may count the number of fail bits to generate a fail bit counting value CV_Pk of the k-th wordline group (for brief expression, hereinafter referred to as a "k-th block counting value"). The fail bit counting value CV_Pk of the k-th wordline group may be a number of fail bitlines, or a number of memory cells, having a threshold voltage higher than the 0-th erase verification voltage EV0, among memory cells of the k-th wordline group. In the partial verification, memory cells of wordlines of the k-th wordline group in a string which is connected to a fail bitline may include at least one memory cell which is not normally erased. For example, when each wordline group is formed of two wordlines, at least one of two memory cells of the two wordlines is not normally erased, and thus a certain level of current passing through bitline selectively coupled to the string is not sensed. For example, as illustrated in FIG. 10A, the nonvolatile memory device 120 may apply the 0-th erase verification voltage EV0 to the wordlines (i.e., WL1 and WL5) of the first wordline group WG1 and may apply the pass voltage VPASS to wordlines WL2, WL3, WL4, WL6, WL7, and WL8 of the remaining wordline groups WG2, WG3, and WG4.

The pass voltage VPASS may be a high voltage capable of turning on memory cells regardless of states (i.e., an erase state or a program state) of the memory cells. Memory cells connected with the wordlines WL2, WL3, WL4, WL6, WL7, and WL8 of the remaining wordline groups WG2, WG3, and WG4 may be turned on by the pass voltage VPASS. In contrast, memory cells having threshold voltages higher than the 0-th erase verification voltage EV0 from among memory cells connected with the wordlines (i.e., WL1 and WL5) of the first wordline group WG1 may be turned off. The nonvolatile memory device 120 may generate a first partial counting value CV P1 based on turned-off memory cells of the memory cells connected with the wordlines (i.e., WL1 and WL5) of the first wordline group WG1 or based on bitlines corresponding to the turned-off memory cells.

The k-th partial counting value CV_Pk may correspond to the number of memory cells having threshold voltages higher than the 0-th erase verification voltage EV0 from among the memory cells connected with the wordlines of the k-th wordline group or the number of bitlines associated with the memory cells having threshold voltages higher than the 0-th erase verification voltage EV0.

Below, for convenience of description, the description is given as an erase verification voltage used in the partial verification operation PV is the 0-th erase verification voltage EV0 (i.e., an erase verification voltage used in the block verification operation BV), but the inventive concept is not limited thereto. For example, the erase verification voltage used in the partial verification operation PV may be equal to or smaller than the 0-th erase verification voltage EV0.

In step S124, the nonvolatile memory device 120 may compare the k-th partial counting value CV_Pk with a second reference value REF2. In an exemplary embodiment, the second reference value REF2 may be smaller than the first reference value REF1 used in the block verification operation BV described with reference to FIG. 7. In an exemplary embodiment, the second reference value REF2 may be a value corresponding to the error correction capability of the ECC engine 113 or any other error correction operation.

When the k-th partial counting value CV_Pk is determined as being equal to or greater than the second reference value REF2, data read from memory cells connected with the wordlines of the k-th wordline group may have errors which are not cured by the ECC engine 113 or any other error correction operation. A result of the partial verification operation PV may indicate FAIL, and the nonvolatile memory device 120 may perform an operation in step S142.

In contrast, when the k-th partial counting value CV_Pk is determined as being smaller than the second reference value REF2, the data read from memory cells connected with the wordlines of the k-th wordline group have errors that may be cured by the ECC engine 113 or any other error correction operation. The nonvolatile memory device 120, in response to the k-th partial counting value CV_Pk being smaller than the second reference value REF2, may perform an operation in step S125.

In operation S125, whether the variable "k" is a maximum value is determined. When the variable "k" is not the maximum value, in operation S126, the variable "k" increases by "1". Afterwards, the nonvolatile memory device 120 may return to step S122. The nonvolatile memory device 120 may iteratively perform the partial verification operation PV on all the wordline groups of the selected memory block BLK. When all results of the partial verification operations PV of the respective wordline groups indicate PASS (i.e., in the case of Yes in step S125), the partial verification operation PV of the selected memory block BLK may be determined as PASS, and the nonvolatile memory device 120 may perform the operation in step S130.

Figure 10B:
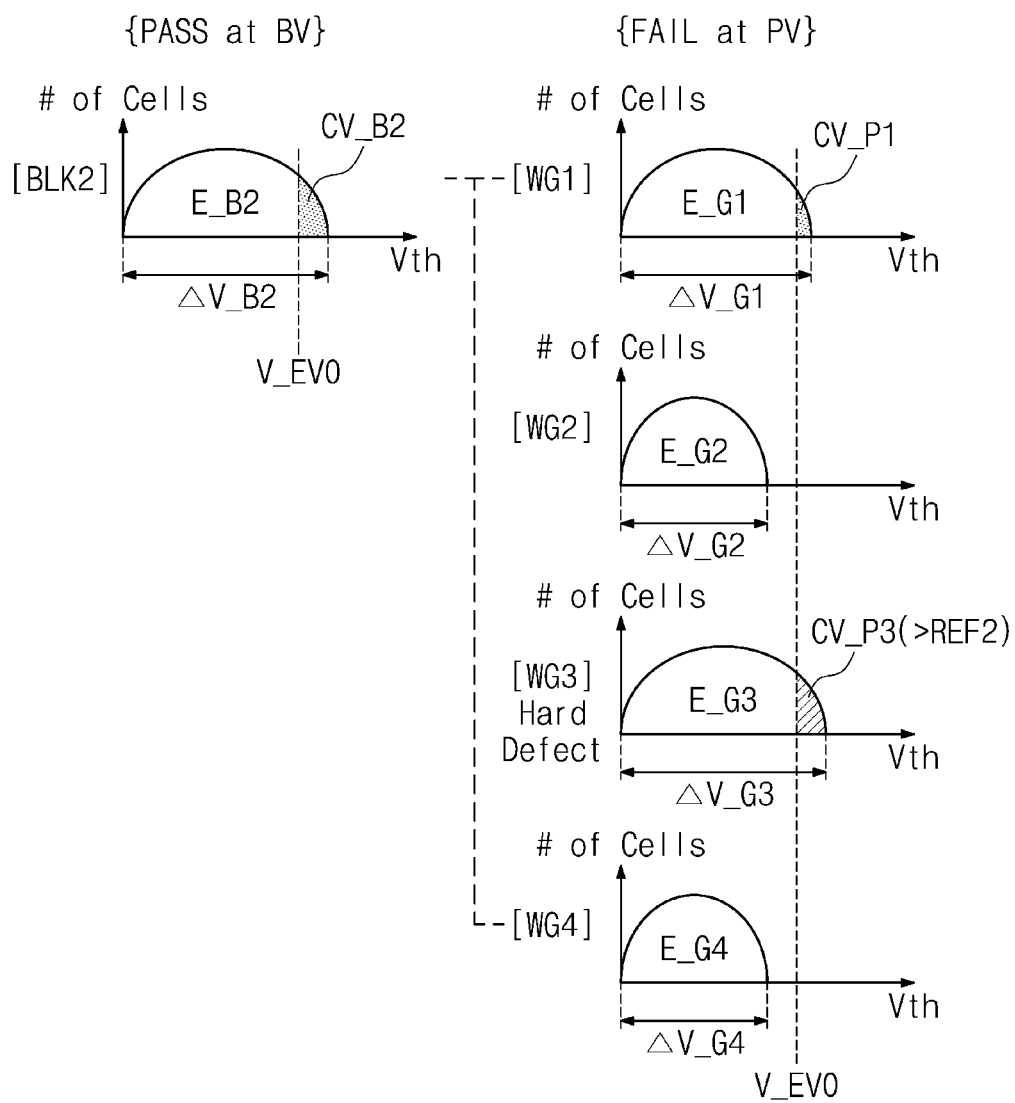

As illustrated in FIG. 10B, the memory cells of the second memory block BLK2 may have the second block erase state E_B2, and the second block counting value CV_B2 generated through the block verification operation BV may be smaller than the first reference value REF1. The second memory block BLK2 may be determined as PASS in the block verification operation BV.

As described above, the nonvolatile memory device 120 may perform the partial verification operation PV on the second memory block BLK2 that is determined as PASS in the block verification operation BV. For example, memory cells corresponding to a first wordline group WG1 from among the memory cells of the second memory block BLK2 may have a first group erase state E_G1, memory cells corresponding to a second wordline group WG2 from among the memory cells of the second memory block BLK2 may have a second group erase state E_G2, memory cells corresponding to a third wordline group WG3 from among the memory cells of the second memory block BLK2 may have a third group erase state E_G3, and memory cells corresponding to a fourth wordline group WG4 from among the memory cells of the second memory block BLK2 may have a fourth group erase state E_G4. Widths of threshold voltage distributions of the first to fourth group erase states E_G1 to E_G4 may be $\Delta V\_G1$, $\Delta V\_G2$, $\Delta V\_G3$, and $\Delta V\_G4$, respectively.

The nonvolatile memory device 120 may count fail bits associated with the first wordline group WG1 of the second memory block BLK2 using the 0-th erase verification voltage EV0 and may generate a first partial counting value CV P1, and the nonvolatile memory device 120 may count fail bits associated with the third wordline group WG3 of the second memory block BLK2 using the 0-th erase verification voltage EV0 and may generate a third partial counting value CV_P3. Because upper limit values of threshold voltage distributions of the second and fourth group erase states E_G2 and E_G4 are lower than the 0-th erase verification voltage EV0, a fail bit counting operation is not performed on the second and fourth wordline groups WG2 and WG4.

For the first wordline group WG1, the first partial counting value CV P1 may be smaller than the second reference value REF2. For example, fail memory cells having threshold voltages higher than the 0-th erase verification voltage EV0 from among memory cells corresponding to the first wordline group WG1 may exist, but an error due to the fail memory cells may be cured by the ECC engine 113 or any other error correction operation. In contrast, for the third wordline group WG3, the third partial counting value CV_P3 may be greater than the second reference value REF2. For example, an error due to fail memory cells having threshold voltages higher than the 0-th erase verification voltage EV0 from among memory cells corresponding to the third wordline group WG3 may not be cured by the ECC engine 113 or any other error correction operation. In response to that the third partial counting value CV_P3 is greater than the second reference value REF2, the nonvolatile memory device 120 may detect that a hard defect occurs at the third wordline group WG3. The nonvolatile memory device 120 may determine the partial verification operation PV of a memory block (i.e., BLK2) in which a wordline group where a hard defect occurs is included, as FAIL.

In an exemplary embodiment, a hard defect occurring at a memory block, a wordline group, or a wordline indicates the case where the number of fail bits detected based on the 0-th erase verification voltage EV0 is greater than a reference value (e.g., REF1 or REF2). For example, in the case where a hard defect occurs at a specific memory block, a specific wordline group, or a specific wordline, an error may occur at data stored in memory cells of the specific memory block, the specific wordline group, or the specific wordline and may not be corrected by error correction. As described above, the nonvolatile memory device 120 may detect a hard defect of a memory block or a specific wordline group through the block verification operation BV or the partial verification operation PV and may determine an erase operation of the corresponding memory block as FAIL based on the detected hard defect.

When a result of the partial verification operation PV indicates PASS, the nonvolatile memory device 120 may perform the delta verification operation DV to be described with reference to FIGS. 11 to 13B.

Figure 11:
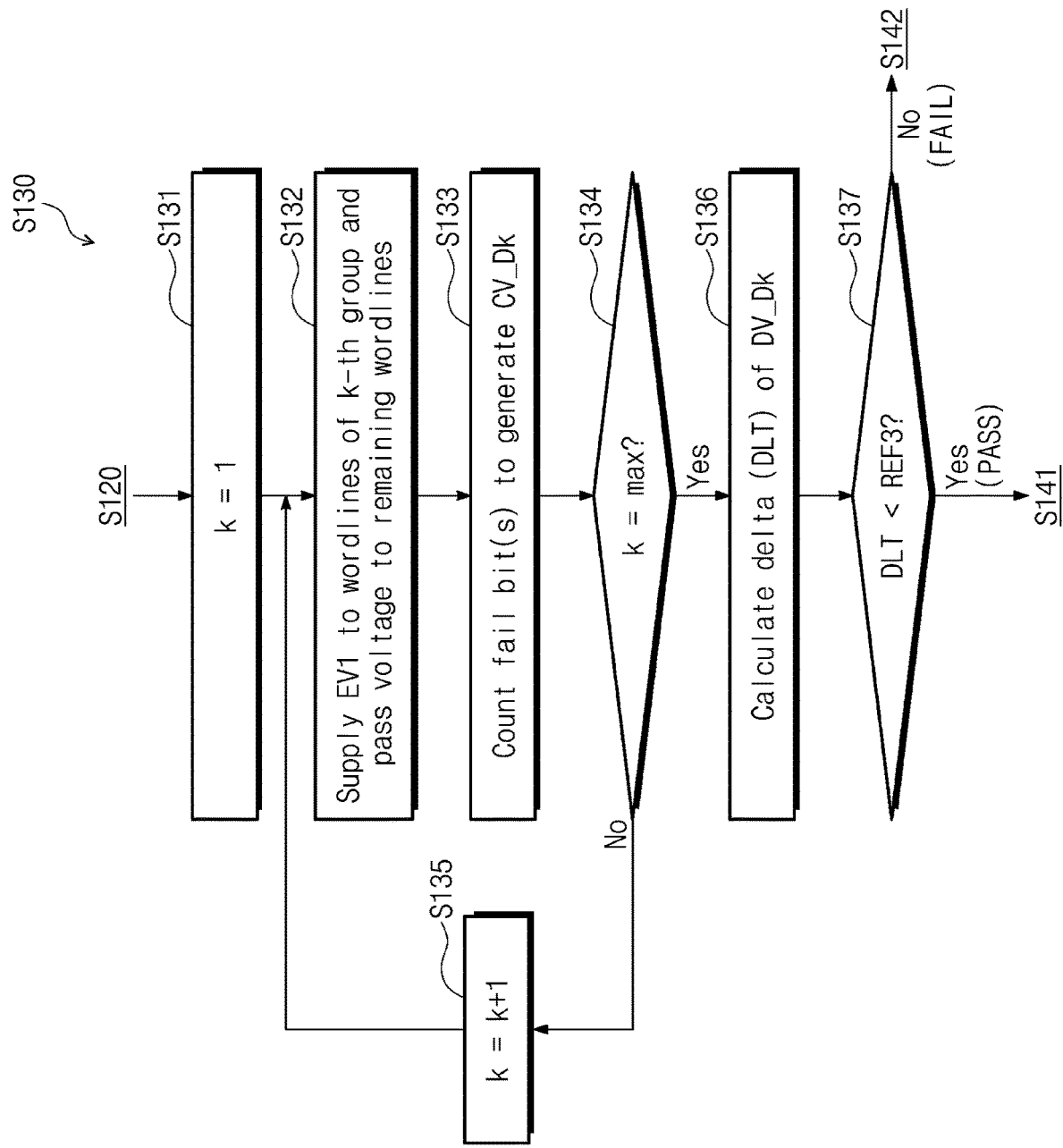
FIG. 11 is a flowchart illustrating step S130 of FIG. 5 which is a delta verification operation.
Figure 12A:
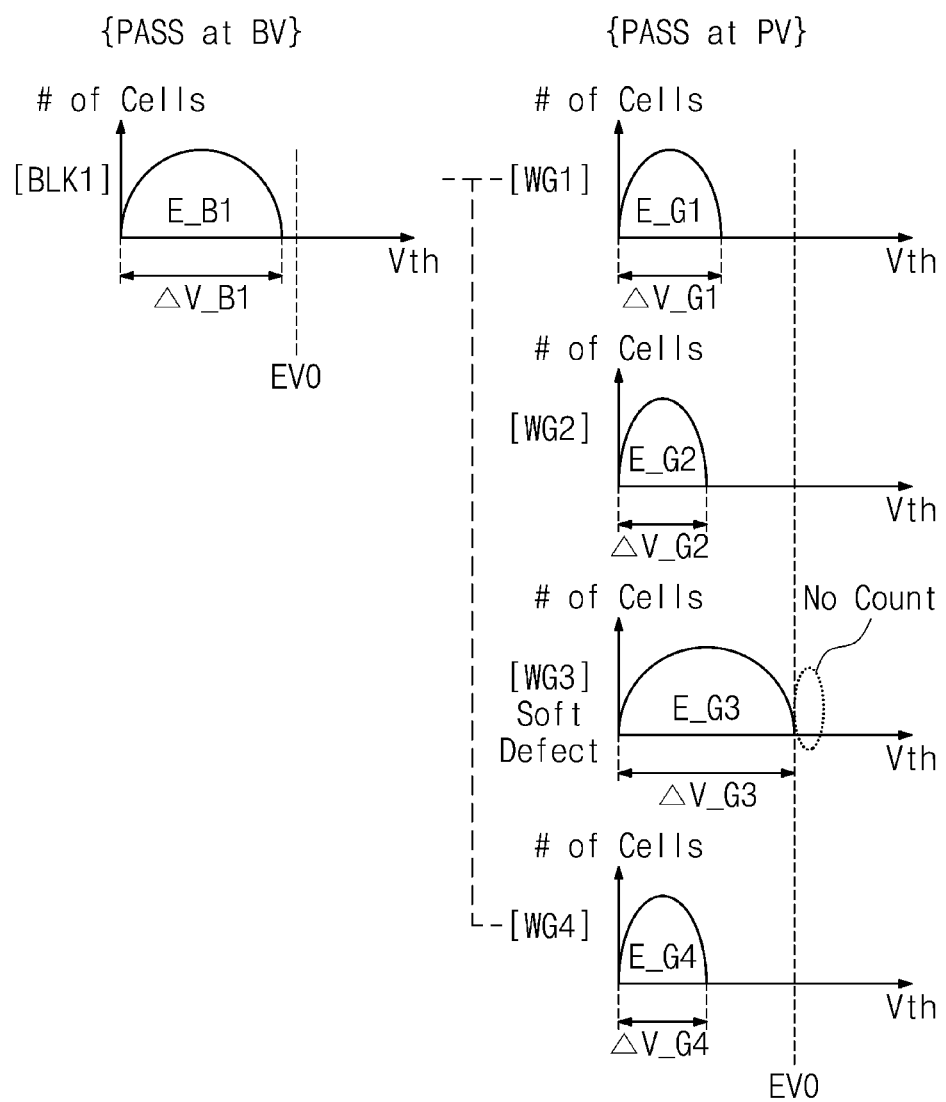
FIGS. 12A, 12B, and 12C are diagrams for describing a delta verification operation according to a flowchart of FIG. 11.
Figure 12B:
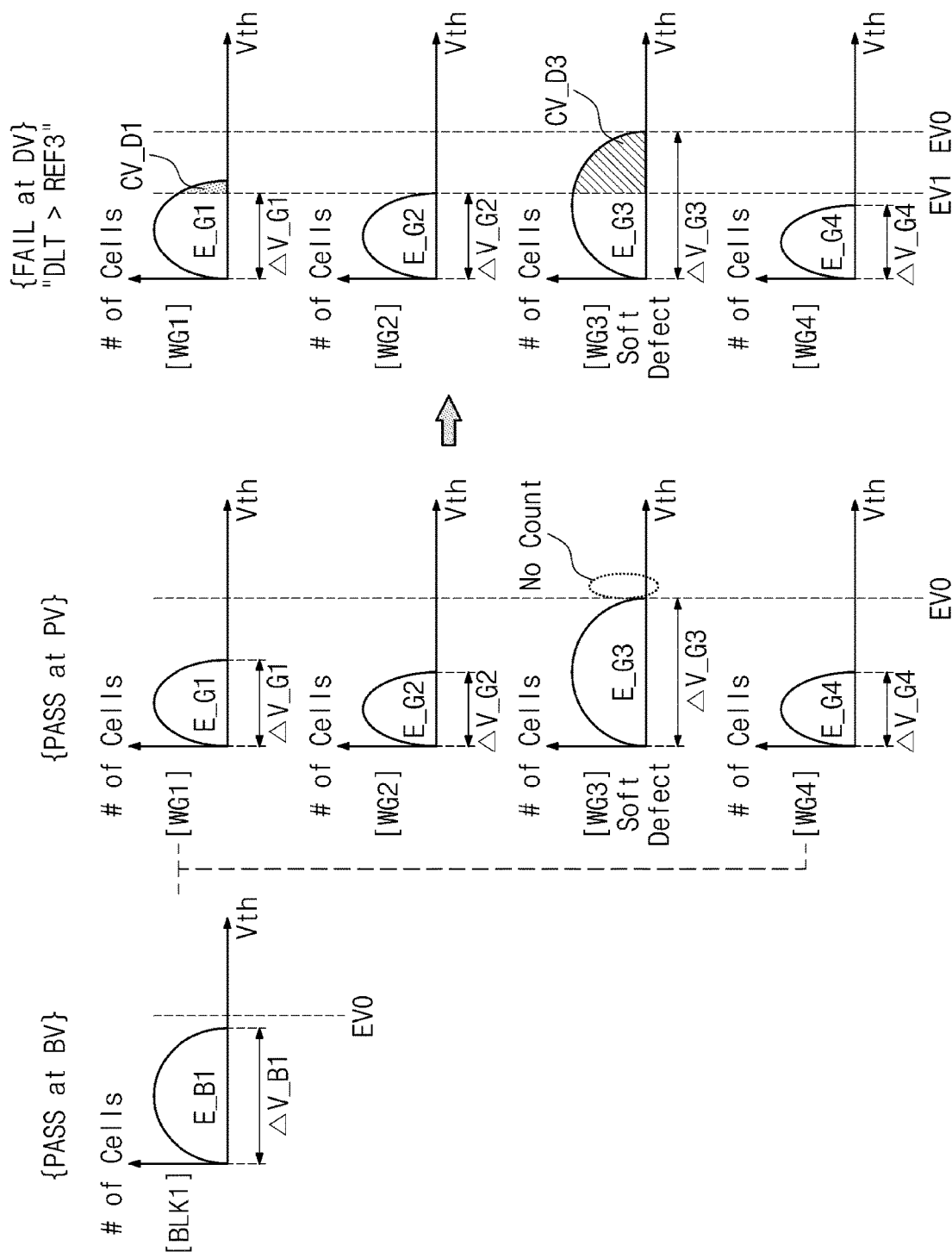
Figure 12C:
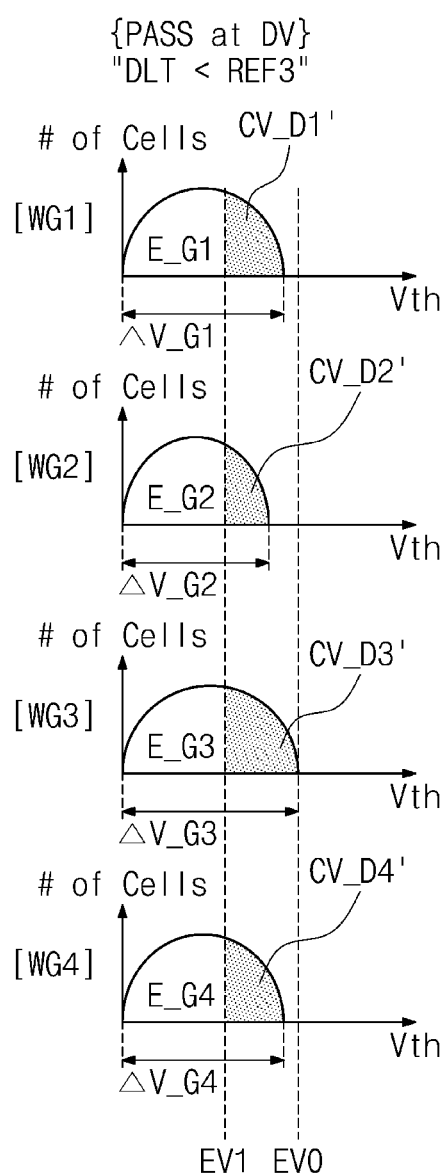

FIG. 11 is a flowchart illustrating step S130 of FIG. 5 which is a delta verification operation. FIGS. 12A to 12C are diagrams for describing a delta verification operation according to a flowchart of FIG. 11. Referring to FIGS. 5 and 11 to 12C, when the partial verification operation PV in step S120 is determined as PASS, the nonvolatile memory device 120 may perform the delta verification operation DV in step S130. The delta verification operation DV in step S130 may include operations in step S131 to step S137.

In operation S131, a variable "k" is set to "1". The variable "k" is used to describe the iteration of fail bit counting associated with a wordline group. For example, the variable "k" identifies a specific wordline group among the plurality of wordline groups.

In step S132, the nonvolatile memory device 120 may apply the first erase verification voltage EV1 to wordlines of a k-th wordline group of wordline groups of the selected memory block BLK and may apply the pass voltage VPASS to wordlines of the remaining wordline groups. In step S133, the nonvolatile memory device 120 may count the number of fail bits to generate a fail bit counting value CV_Dk of the k-th wordline group (for brief expression, hereinafter referred to as a "k-th delta counting value"). The fail bit counting value CV_Dk of the k-th wordline group may be a number of fail bitlines, or a number of memory cells, having a threshold voltage higher than the first erase verification voltage EV1, among memory cells of the k-th wordline group. In the delta verification, memory cells of wordlines of the k-th wordline group in a string which is connected to a fail bitline may include at least one memory cell which is not normally erased. For example, when each wordline group is formed of two wordlines, at least one of two memory cells of the two wordlines is not normally erased, and thus a certain level of current passing through bitline selectively coupled to the string having the two memory cells is not sensed.

In an exemplary embodiment, operations in step S132 and step S133 are similar to the operations in step S122 and step S123 of the partial verification operation PV described with reference to FIGS. 9 to 10B except for an erase verification voltage, and thus, additional description will be omitted to avoid redundancy. In an exemplary embodiment, the first erase verification voltage EV1 used in the delta verification operation DV may be smaller than the 0-th erase verification voltage EV0 used in the partial verification operation PV.

In operation S134, whether the variable "k" is a maximum value is determined. When the variable "k" is not the maximum value, in operation S135, the variable "k" increases by "1". Afterwards, the nonvolatile memory device 120 returns to step S132. For example, the nonvolatile memory device 120 generates delta counting values CV_Ds for respective wordline groups of the selected memory block BLK using the first erase verification voltage EV1.

When a determination result in step S134 indicates that the variable "k" is the maximum value, in step S136, the nonvolatile memory device 120 may generate a delta value DLT based on the generated delta counting values CV_Ds. In an embodiment, the delta value DLT may indicate a difference between the generated delta counting values CV_Ds, or a distribution or a dispersion of the generated delta counting values CV_Ds. In another exemplary embodiment, the delta value DLT may indicate a difference between a maximum value and a minimum value of the generated delta counting values CV_Ds. In another exemplary embodiment, the delta value DLT may indicate a difference between a maximum value and an intermediate value of the generated delta counting values CV_Ds. In another exemplary embodiment, the delta value DLT may indicate a difference between a maximum value and an average value of the generated delta counting values CV_Ds. However, the inventive concept is not limited thereto.

In step S137, the nonvolatile memory device 120 may compare the delta value DLT with a third reference value REF3. When the delta value DLT is equal to or greater than the third reference value REF3, the nonvolatile memory device 120 may perform an operation in step S142. For example, when the delta value DLT is equal to or greater than the third reference value REF3, the nonvolatile memory device 120 determines the erase operation of the selected memory block BLK as FAIL.

When the delta value DLT is smaller than the third reference value REF3, the nonvolatile memory device 120 may perform an operation in step S141. For example, when the delta value DLT is smaller than the third reference value REF3, the nonvolatile memory device 120 may determine the erase operation of the selected memory block BLK as PASS.

For example, as illustrated in FIG. 12A, memory cells of the first memory block BLK1 may have the first block erase state E_B1. For example, a width of a threshold voltage distribution of the first block erase state E_B1 is ΔV_B1, and an upper limit value of the threshold voltage distribution of the first block erase state E_B1 is lower than the 0-th erase verification voltage EV0. A result of the block verification operation BV performed on the first memory block BLK1 may indicate PASS.

Because the result of the block verification operation BV performed on the first memory block BLK1 is PASS, as described above, the partial verification operation PV may be performed on the first memory block BLK1. For the sake of description, first to fourth wordline groups WG1 to WG4 of the first memory block BLK1, as described in FIG. 12A, may have first to fourth group erase states E_G1 to E_G4, respectively. As illustrated in FIG. 12A, because all upper limit values of threshold voltage distributions of the first to fourth group erase states E_G1 to E_G4 are lower than the 0-th erase verification voltage EV0, a result of the partial verification operation PV performed on the first memory block BLK1 may indicate PASS.

For the first to fourth wordline groups WG1 to WG4, the widths of the threshold voltage distributions of the first to fourth group erase states E_G1 to E_G4 may be ΔV_G1, ΔV_G2, ΔV_G3, and ΔV_G4, respectively. As illustrated in FIG. 12A, the first, second, and forth wordline groups WG1, WG2, and WG4 may have similar widths of the threshold voltage distributions ΔV_G1, ΔV_G2, and ΔV_G4, and the third wordline group WG3 may have the width ΔV_G3 which is greater than the remaining widths ΔV_G1, ΔV_G2, and ΔV_G4. Memory cells of the third wordline group WG3 corresponding to the third group erase state E_G3 having the width of ΔV_G3 may have soft defects. Unlike the hard defect described above, the soft defect may indicate a defect that is not detected by the 0-th erase verification voltage EV0 determined in advance based on a physical characteristic and an EOL state of the nonvolatile memory device 120. As illustrated in FIG. 12A, the third wordline group WG3 does not have fail bits which are determined as hard defects using the 0-th erase verification voltage EV0, but may be determined as having a soft defect. Hereinafter, the phrase of "a soft error may occur at a wordline group or a wordline" means that memory cells of the wordline group or memory cells of the wordline may have soft errors.

In the case where a specific wordline group or a specific wordline (in other words, in the case where a threshold voltage distribution of an erase state of specific memory cells is relatively wider than a threshold voltage distribution of an erase state of other memory cells) is determined as having a soft defect, memory cells of the specific wordline group or the specific wordline may have a soft error when reading and/or programming the memory cells. The error is not cured by the ECC engine 113, because given that a program operation or a read operation of the same memory block is performed through similar parameters, in the case where a deviation of a threshold voltage distribution of an erase state at a specific wordline group or a specific wordline is relatively greater than those at the remaining wordline groups or the remaining wordlines, a plurality of errors may occur at data stored in memory cells of the specific wordline group or the specific wordline beyond the error correction capacity of the ECC engine 113.

The nonvolatile memory device 120 according to an embodiment of the inventive concept may perform the delta verification operation DV to detect a soft defect occurring at the selected memory block BLK. For example, as illustrated in FIG. 12B, results of the block verification operation BV and the partial verification operation PV performed on the first memory block BLK1 may indicate PASS. The block verification operation BV and the partial verification operation PV performed on the first memory block BLK1 illustrated in FIG. 12B are described with reference to FIG. 12A, and thus, additional description will be omitted to avoid redundancy. After the block verification operation BV and the partial verification operation PV being determined as being passed, the nonvolatile memory device 120 may perform the delta verification operation DV on the first memory block BLK1.

The nonvolatile memory device 120 may generate the first delta counting value CV_D1 by counting fail bits of the first wordline group WG1 under the condition that the first erase verification voltage EV1 is applied to the first wordline group WG1 of the first memory block BLK1 and the pass voltage VPASS is applied to the remaining wordline groups WG2, WG3, and WG4. The pass voltage VPASS is also applied to the select string transistors SSTa and SSTb, and the ground selection transistor GSTa and GSTb, as shown in FIG. 4A. The first delta counting value CV_D1 may correspond to the number of memory cells having threshold voltages higher than the first erase verification voltage EV1 from among the memory cells corresponding to the first wordline group WG1 or the number of bitlines corresponding to the memory cells. For the sake of description, it is assumed that each wordline group has two word lines, the memory block BL1 has 1024 bit lines, two memory cells of the first wordline group WG1 are connected to a corresponding bit line of the 1024 bit lines. The step S133 of FIG. 11 is performed on each bit line to generate the first delta counting value CV_D1 and the third delta counting value CV_D3. For example, when at least one of the two memory cells connected to each bit line has a threshold voltage higher than the first erase verification voltage EV1, the corresponding bit line is counted to generate the first delta counting value CV_D1 and the third delta counting value CV_D3. For example, when the first delta counting value CV_D1 is determined as 516, at least one memory cell connected to each of the 516 bit lines has a threshold voltage higher than the first erase verification voltage EV1. For example, when the third delta counting value CV_D2 is determined as 256, at least one memory cell connected to each of the 256 bit lines has a threshold voltage higher than the first erase verification voltage EV1. As in the above operation of the first wordline group WG1, the nonvolatile memory device 120 may generate delta counting values CV_D2 to CV_D4 of the second to fourth wordline groups WG2 to WG4. In the embodiment of FIG. 12C, the third delta counting value CV_D3 of the third wordline group WG3 may be generated. Because upper limit values of threshold voltage distributions of the second and fourth group erase states E_G2 and E_G4 corresponding to the second and fourth wordline groups WG2 and WG4 are lower than the first erase verification voltage EV1, delta counting values of the second and fourth wordline groups WG2 and WG4 may not be counted.

The nonvolatile memory device 120 may generate the delta value DLT based on the generated delta counting values CV_D1 and CV_D3. As described above, the delta value DLT may be a value that is generated by using various combinations of the delta counting values CV_D1 and CV_D3. For convenience of description, it is assumed that the delta value DLT is a difference between a maximum value and a minimum value of the delta counting values CV_D1 and CV_D3.

For example, the delta value DLT may be calculated through an equation of "CV_D3−CV_D1", and the calculated delta value DLT may be greater than the third reference value REF3. When a threshold voltage distribution of memory cells of a specific wordline group of a plurality of wordline groups of the selected memory block BLK is wider than threshold voltage distributions of the remaining wordline groups, the memory cells of the specific wordline group may have soft defects, and the calculated delta value DLE may be determined as being greater than the third reference value REF3. In the embodiment of FIG. 12B, an example where a soft defect occurs at the third wordline group WG3 is illustrated. In an exemplary embodiment, a soft defect may occur in an initial state of the nonvolatile memory device 120.

In an exemplary embodiment, even though a delta counting value is detected from each wordline group, in the case where the delta value DLT is smaller than the third reference value REF3, it may be determined that a soft defect does not occur. For example, as illustrated in FIG. 12C, a first delta counting value CV_D1' may be generated as a result of the delta verification operation DV for the first wordline group WG1, a second delta counting value CV_D2' may be generated as a result of the delta verification operation DV for the second wordline group WG2, a third delta counting value CV_D3' may be generated as a result of the delta verification operation DV for the third wordline group WG3, and a fourth delta counting value cV_D4' may be generated as a result of the delta verification operation DV for the fourth wordline group WG4. Compared to the embodiment of FIG. 12B, in the embodiment of FIG. 12C, even though the first to fourth delta counting values CV_D1' to CV_D4' are respectively counted from the wordline groups WG1 to WG4, the delta value DLT calculated based on the first to fourth delta counting values CV_D1' to CV_D4' may be smaller than the third reference value REF3. Accordingly, it may be determined that a soft defect does not occur. As shown in FIG. 12C, a result of the delta verification operation DV may indicate PASS.

When all erase states of wordline groups WG1 to WG4 of a selected memory block, even being widely distributed, have similar threshold distributions in light of widths of the threshold voltage distributions of the wordline groups WG1 to WG4, errors occurring at the memory cells of the selected memory block may decrease by identically applying various operation parameters to the selected memory block. For example, in the case of the embodiment of FIG. 12B in which a threshold voltage distribution of an erase state of a specific wordline group is wider than threshold voltage distributions of the remaining wordline groups, a plurality of errors may occur due to a soft defect; in contrast, in the case of the embodiment of FIG. 12C in which threshold voltage distributions of all the wordline groups are similar to each other, an error may occur relatively less by adjusting any other operation parameters. As a result, when the delta value DLT is smaller than the third reference value REF3, errors that occur at the nonvolatile memory device 120 may be curable errors.

As described above, the nonvolatile memory device 120 according to an embodiment of the inventive concept may generate delta counting values of respective wordline groups using the first erase verification voltage EV1 lower than the 0-th erase verification voltage EV0 determined in advance based on a physical characteristic and an EOL state of the nonvolatile memory device 120 and may detect a soft defect occurring at a memory block based on the delta value DLT that is based on a difference between the generated delta counting values or a distribution or a dispersion of the generated delta counting values. In the case where a soft defect is detected at a specific memory block through the delta verification operation DV, the erase operation of the specific memory block may be determined as FAIL, or the specific memory block may be managed as a bad block by the memory controller 110.

Figure 13A:
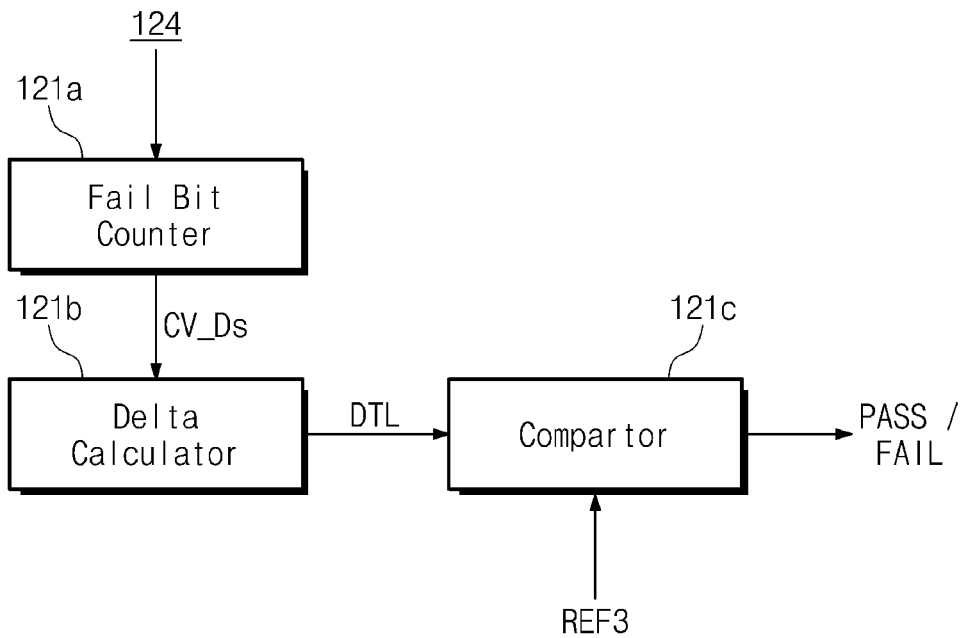
FIG. 13A is a block diagram illustrating an erase delta verification logic circuit of a nonvolatile memory device which performs a delta verification operation described with reference to FIGS. 11 to 12C.
Figure 13B:
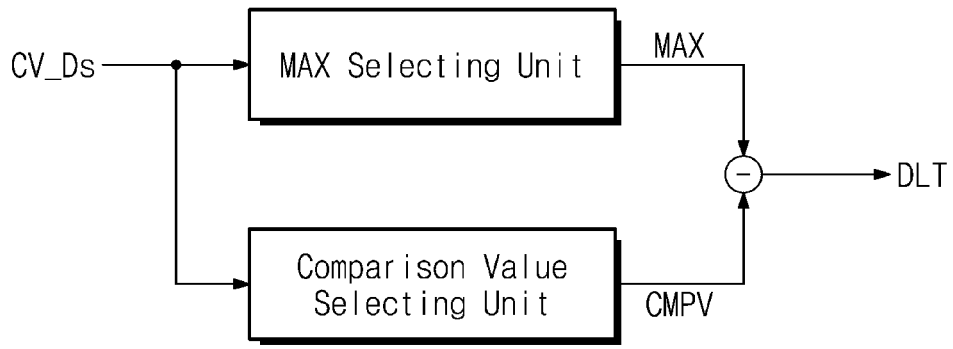
FIG. 13B is a block diagram illustrating a delta calculator of FIG. 13A.

FIG. 13A is a block diagram illustrating an erase delta verification logic circuit of a nonvolatile memory device, which performs a delta verification operation described with reference to FIGS. 11 to 12C. FIG. 13B is a block diagram illustrating a delta calculator of FIG. 13A.

Referring to FIGS. 13A and 13B, the erase delta verification logic circuit 121 may include a fail bit counter 121a, a delta calculator 121b, and a comparator 121c. The fail bit counter 121a may count fail bits for respective wordline groups to generate delta counting values CV_Ds.

The delta calculator 121b may generate the delta value DLT based on the delta counting values CV_Ds generated by the fail bit counter 121a. For example, as illustrated in FIG. 13B, the delta calculator 121b may include a maximum value selecting unit and a comparison value selecting unit.

The maximum value selecting unit may select and output a maximum value MAX of the delta counting values CV_Ds. The comparison value selecting unit may generate a comparison value CMPV based on the delta counting values CV_Ds. In an exemplary embodiment, the comparison value CMPV may indicate a minimum value, an intermediate value, or a specific value (e.g., the second greatest value) of the delta counting values CV_Ds. Alternatively, the comparison value CMPV may indicate an average value of the delta counting values CV_Ds. A difference between the maximum value MAX and the comparison value CMPV may be output as the delta value DLT. However, the inventive concept is not limited thereto. For example, the delta value DLT may be calculated as various values indicating a difference between the delta counting values CV_Ds or a distribution or a dispersion of the delta counting values CV_Ds.

The comparator 121c may compare the delta value DLT and the third reference value REF3 and may output information of whether the delta verification operation is determined as PASS or FAIL as a comparison result. For example, when the delta value DLT is determined as being smaller than the third reference value REF3, memory cells of a selected memory block may have no soft defects, and the comparator 121c may output information of the delta verification operation being determined as PASS. In contrast, when that the delta value DLT is determined as being equal to or greater than the third reference value REF3, memory cells of the selected memory block may have soft defects, and the comparator 121c may output information of the delta verification being determined as FAIL.

As described above, the nonvolatile memory device 120 according to an embodiment of the inventive concept may detect a soft defect of a selected memory block targeted for erasing through the delta verification operation DV. The nonvolatile memory device 120 may include the erase delta verification logic circuit 121 which performs the delta verification operation DV. In an embodiment, a hardware component which performs the delta verification operation DV may be embedded in the nonvolatile memory device 120 in the form of an on-chip, and thus, the reliability of the nonvolatile memory device 120 may be improved.

Figure 14:
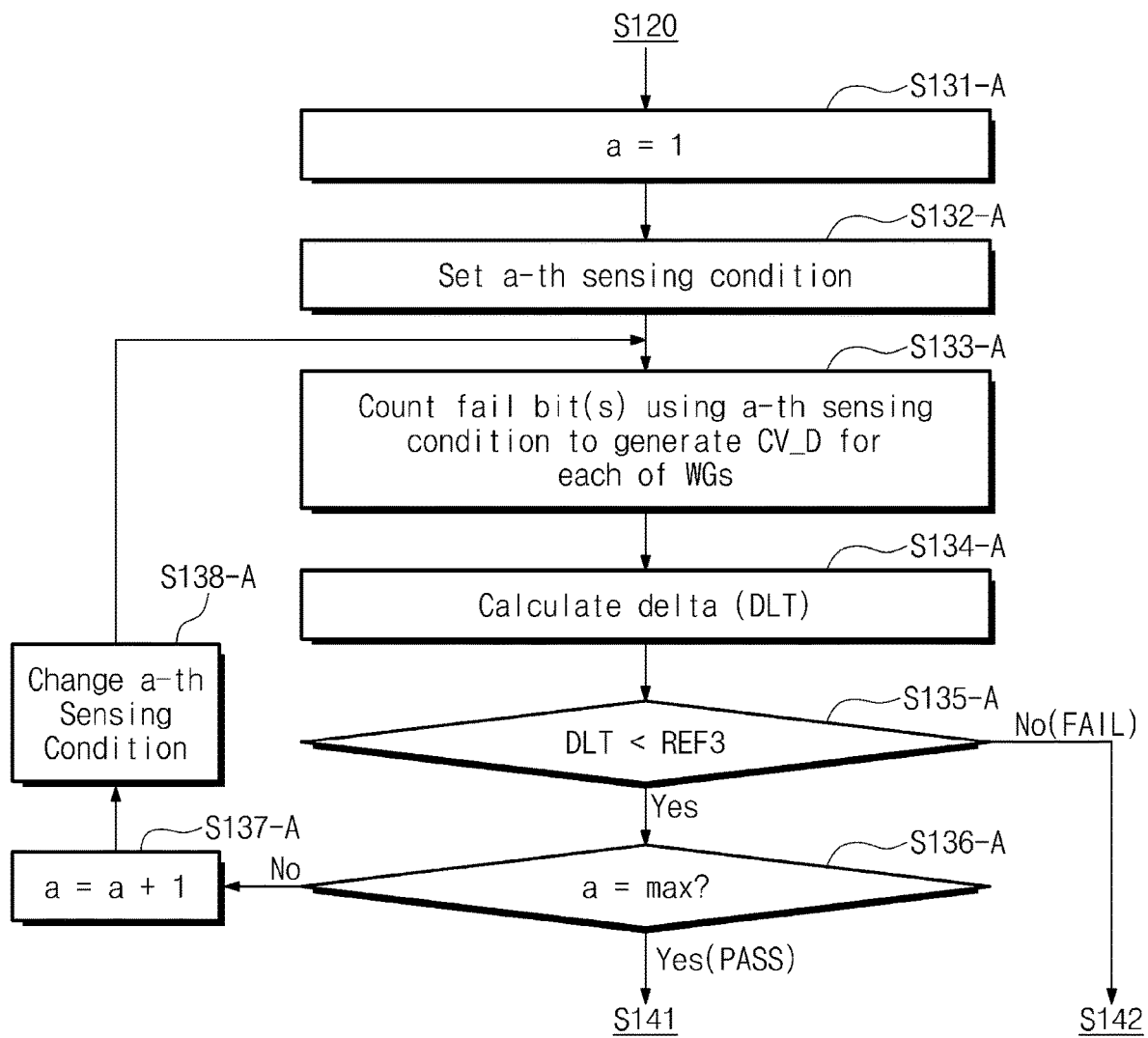
FIG. 14 is a flowchart illustrating an operation (i.e., a delta verification operation) in step S130 of FIG. 5.

FIG. 14 is a flowchart illustrating an operation (i.e., a delta verification operation) in step S130 of FIG. 5. In an exemplary embodiment, the nonvolatile memory device 120 may repeatedly perform a delta verification operation, and the nonvolatile memory device 120 may change a sensing condition in each delta verification operation. For convenience of description, additional description associated with the components described above will be omitted to avoid redundancy.

Referring to FIGS. 1, 5 and 14, in step S131-A, a variable "a" may be set to "1". In an exemplary embodiment, it may be understood that the variable "a" is only for describing an iterative operation of the nonvolatile memory device 120, not involving any other technical meaning.

In step S132-A, the nonvolatile memory device 120 may set an a-th sensing condition. In an exemplary embodiment, the sensing condition may indicate various operation parameters that are used for the nonvolatile memory device 120 to perform the delta verification operation. For example, the sensing condition may include information about the delta verification operation such as a level of an erase verification voltage to be applied to a selected memory block, a develop time of a sensing node which is a time necessary to count fail bits, or a resolution of a counter circuit implemented with a mass bit counter.

In step S133-A, the nonvolatile memory device 120 may count fail bits of the selected memory block using the a-th sensing condition set in step S132-A. For example, the nonvolatile memory device 120 may count fail bits in units of wordline group and may generate a counting value CV_D (hereinafter referred to as a "delta counting value") for each wordline group.

In step S134-A, the nonvolatile memory device 120 may generate the delta value DLT based on the delta counting values CV_Ds counted for respective wordline groups. For example, the delta value DLT may indicate a difference between a maximum value and a minimum value of the delta counting values CV_Ds thus counted. In another exemplary embodiment, the delta value DLT may indicate a difference between an average value and a maximum value of the delta counting values CV_Ds thus counted. In another exemplary embodiment, the delta value DLT may indicate a difference between an intermediate value and a maximum value of the delta counting values CV_Ds thus counted. However, the inventive concept is not limited thereto.

In step S135-A, the nonvolatile memory device 120 may compare the delta value DLT with the third reference value REF3. When the delta value DLT is equal to or greater than the third reference value REF3 (i.e., FAIL in step S135-A), the nonvolatile memory device 120 may perform an operation in step S142. For example, when the delta value DLT is determined as being equal to or greater than the third reference value REF3, the nonvolatile memory device 120 may determine the erase operation of the selected memory block BLK as FAIL.

When the delta value DLT is smaller than the third reference value REF3, the nonvolatile memory device 120 may perform an operation in step S136-A. In operation S136-A, the nonvolatile memory device 120 may determine whether the variable "a" is a maximum value. When the variable "a" is not the maximum value, in operation S137-A, the variable "a" may increase by "1"; in step S138-A, the nonvolatile memory device 120 may change the a-th sensing condition. Afterwards, the nonvolatile memory device 120 may return to step S133-A. For example, the nonvolatile memory device 120 may repeatedly perform the delta verification operation DV by a predetermined number of times. Each time when the delta verification operation DV is performed, the sensing condition that is used in each delta verification operation DV may change.

The sensing condition that is used in the delta verification operation DV will be more fully described with reference to the following drawings.

Figure 15A:
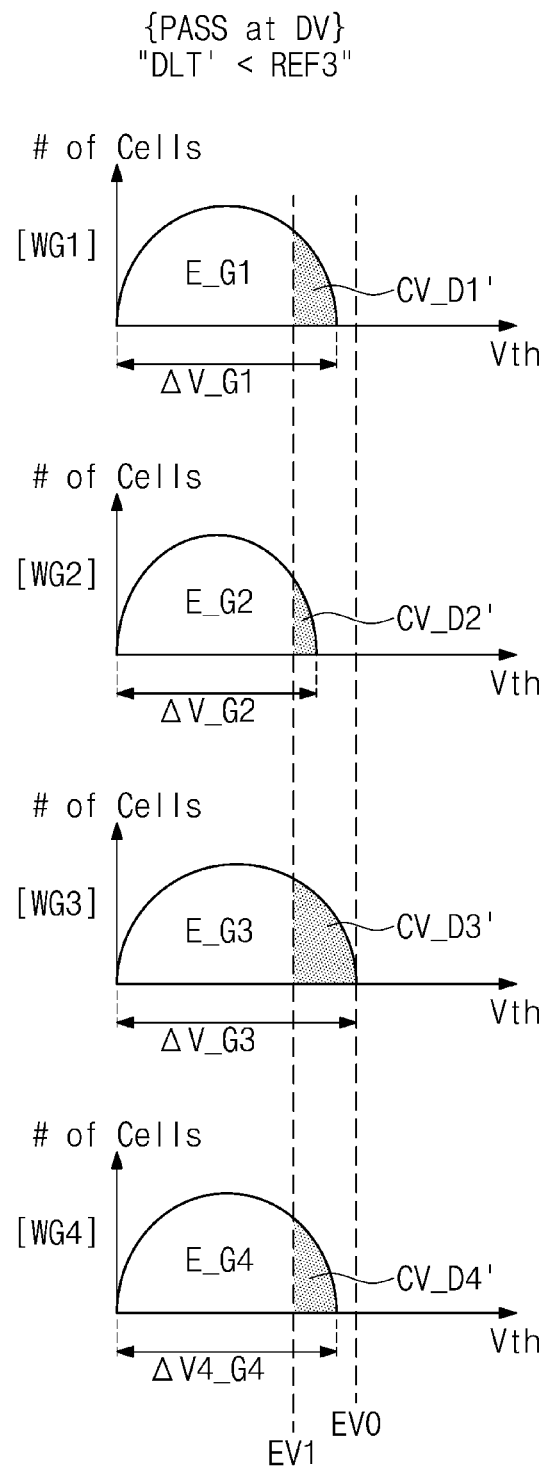
FIGS. 15A and 15B are diagrams for describing a change of an erase verification voltage used in a delta verification operation.
Figure 15B:
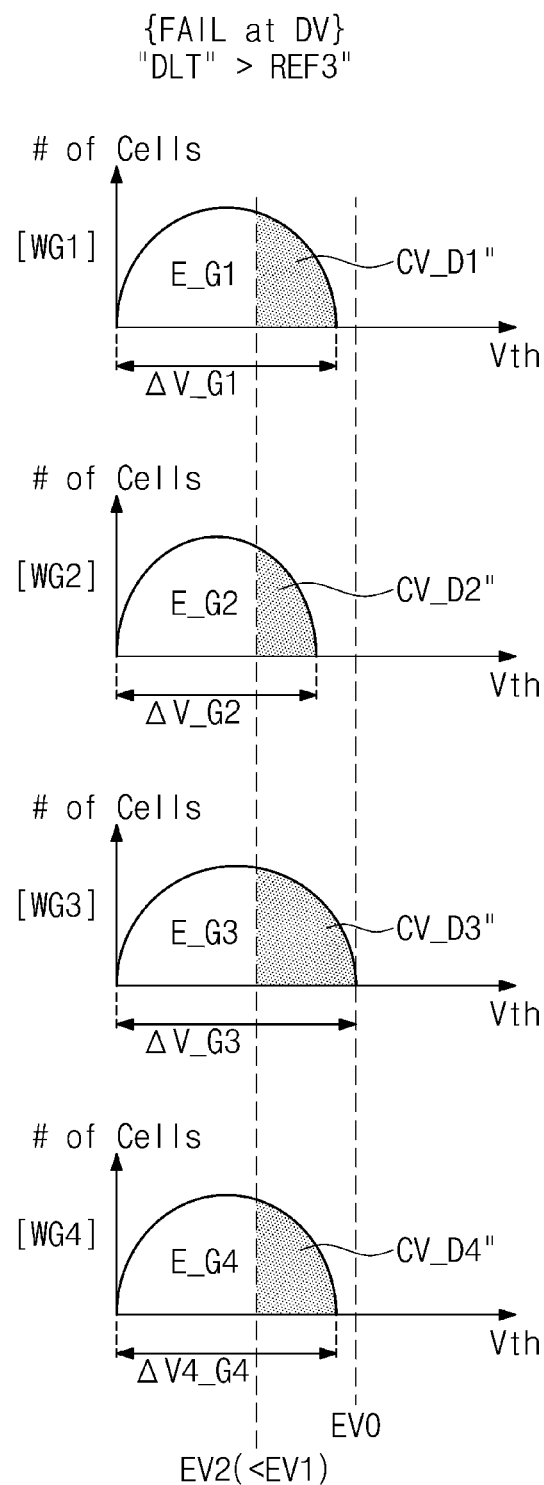

FIGS. 15A and 15B are diagrams for describing a change of an erase verification voltage used in a delta verification operation. In threshold voltage distribution diagrams of FIGS. 15A and 15B, a horizontal axis represents a threshold voltage of a memory cells, and a vertical axis represents the number of memory cells.

First, referring to FIG. 15A, when the block verification operation BV and the partial verification operation PV are determined as PASS, the delta verification operation DV may be performed using the first erase verification voltage EV1. In an exemplary embodiment, the first erase verification voltage EV1 may be different from the 0-th erase verification voltage EV0 used in the block verification operation BV and the partial verification operation PV. The first erase verification voltage EV1 may be lower in level than the 0-th erase verification voltage EV0 used in the block verification operation BV and the partial verification operation PV.

Assuming that a fail bit counting operation is performed under the condition that the first erase verification voltage EV1 is applied to each wordline group, the number of fail bits associated with the first wordline group WG1 may be a first delta counting value CV_D1', the number of fail bits associated with the second wordline group WG2 may be a second delta counting value CV_D2', the number of fail bits associated with the third wordline group WG3 may be a third delta counting value CV_D3', and the number of fail bits associated with the fourth wordline group WG4 may be a fourth delta counting value CV_D4'. The delta value DLT' that is calculated based on the first to fourth delta counting values CV_D1' to CV_D4' thus counted may be smaller than the third reference value REF3. When the wordline groups WG1 to WG4 of a block has threshold voltage distributions as shown in FIG. 15A, the delta verification operation may be determined as PASS.

When the delta verification operation performed at the first erase verification voltage EV1 is determined as PASS, the nonvolatile memory device 120 may change an erase verification voltage and perform another delta verification operation. For example, as illustrated in FIG. 15B, the nonvolatile memory device 120 may change an erase verification voltage from the first erase verification voltage EV1 to a second erase verification voltage EV2, and perform another delta verification operation at the second erase verification voltage EV2. In an exemplary embodiment, the second erase verification voltage EV2 may be smaller than the first erase verification voltage EV1.

Assuming that a fail bit counting operation is performed under the condition that the second erase verification voltage EV2 is applied to each wordline group, the number of fail bits associated with the first wordline group WG1 may be a first delta counting value CV_D1", the number of fail bits associated with the second wordline group WG2 may be a second delta counting value CV_D2", the number of fail bits associated with the third wordline group WG3 may be a third delta counting value CV_D3", and the number of fail bits associated with the fourth wordline group WG4 may be a fourth delta counting value CV_D4". A delta value DLT" may be calculated based on the first to fourth delta counting values CV_D1" to CV_D4" thus counted. The delta value DLT' based on the first erase verification voltage EV1 as illustrated in FIG. 15A and the delta value DLT" based on the second erase verification voltage EV2 as illustrated in FIG. 15B may be different, for example, due to a difference between threshold voltage distributions of memory cells of respective wordline groups.

In an exemplary embodiment, the delta value DLT" that is based on the second erase verification voltage EV2 may be greater than the third reference value REF3, and as shown in FIG. 15B, the delta verification operation may be determined as FAIL. In other words, the result of the delta verification operation performed using the first erase verification voltage EV1 may indicate PASS, but the result of the delta verification operation performed using the second erase verification voltage EV2 may indicate FAIL. For example, change in a sensing condition such as an erase verification voltage may detect a soft defect associated with a specific wordline group.

As described above, the nonvolatile memory device 120 may detect a soft defect occurring at a specific wordline group by performing a plurality of delta verification operations under the condition that a sensing condition such as an erase verification voltage is variable.

Figure 16A:
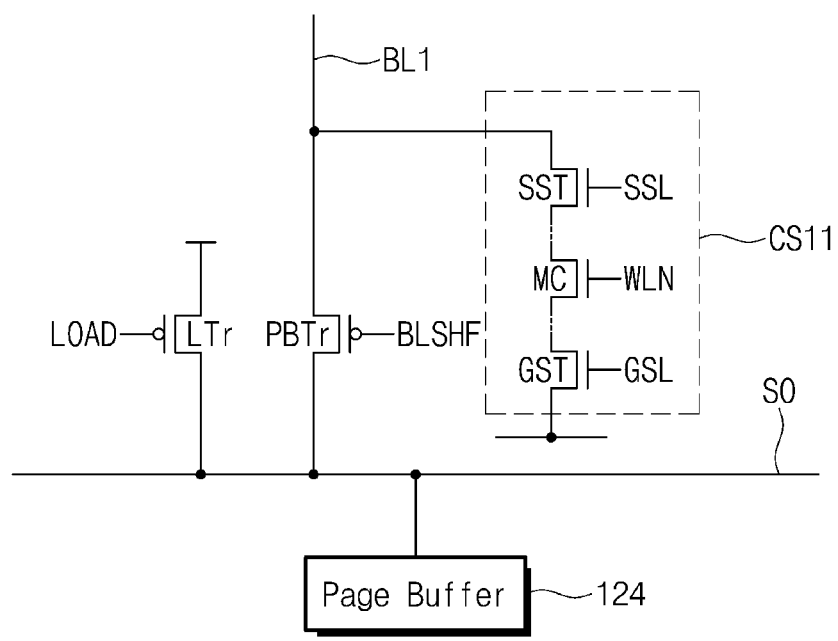
FIGS. 16A and 16B are diagrams for describing a change of a develop time used in a delta verification operation.
Figure 16B:
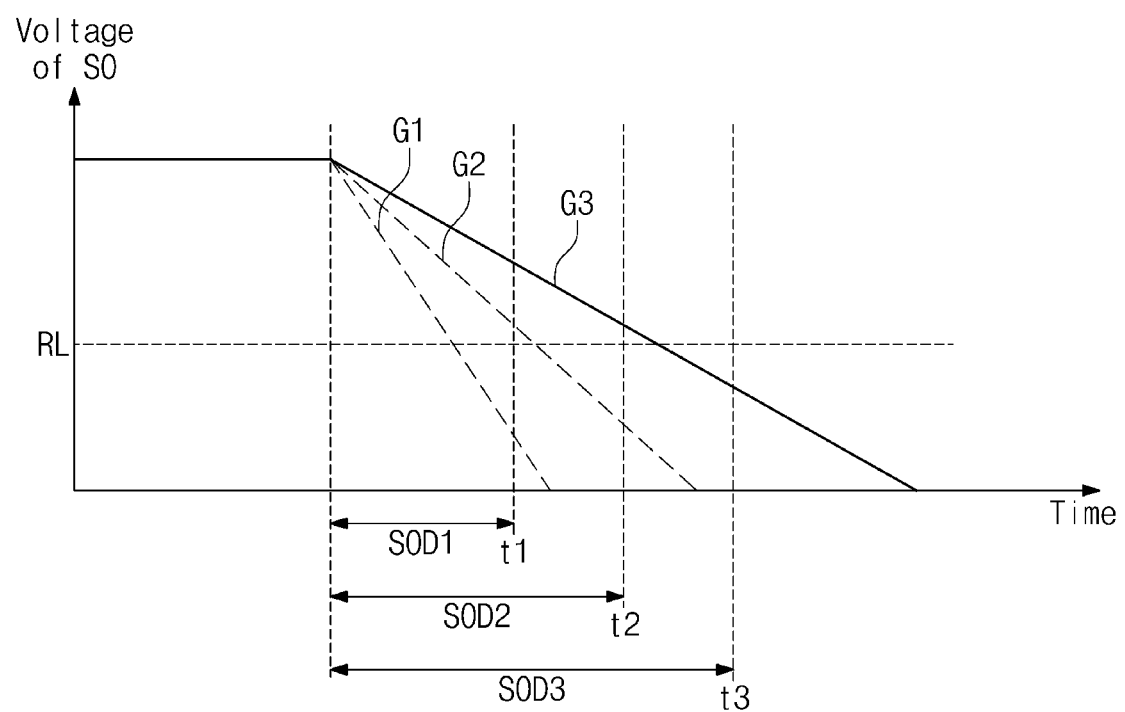

FIGS. 16A and 16B are diagrams for describing a change of a develop time used in a delta verification operation. For convenience of description, the detailed description associated with the remaining components other than a component adjusting a develop time being one of sensing conditions available in the delta verification operation will be omitted.

Referring to FIGS. 3, 14, 16A, and 16B, the cell string CS11 of a memory block included in the nonvolatile memory device 120 may include a string selection transistor SST, a memory cell MC, and a ground selection transistor GST and may be connected with the first bitline BL1. The first bitline BL1 may be connected with a sensing node SO through a page buffer transistor PBTr. The page buffer transistor PBTr may operate in response to a bitline voltage control signal BLSHF.

A load transistor LTr may be connected between a bias voltage (not illustrated) and the sensing node SO. The load transistor LTr may operate in response to a load signal LOAD. The page buffer 124 may be connected with the sensing node SO and may latch a signal corresponding to a level of the sensing node SO.

In an exemplary embodiment, the nonvolatile memory device 120 may repeatedly perform a delta verification operation with a different sensing condition from the previous sensing condition. For example, the sensing condition may include a develop time of the sensing node SO. During a time when the delta verification operation is performed, a relevant erase verification voltage may be applied to wordlines WL, and a level of the sensing node SO may vary depending on states of memory cells. In an exemplary embodiment, a time from when the erase verification voltage is applied to the wordlines WL to when the page buffer 124 senses a level of the sensing node SO may be the develop time of the sensing node SO. In an exemplary embodiment, a delta counting value may be determined based on a level of the sensing node SO at a time when the page buffer 124 senses the level of the sensing node SO. When the develop time of the sensing node SO is changed, a delta counting value may be changed.

For example, as illustrated by first, second, and third graphs G1, G2, and G3 of FIG. 16B, a slope at which a level of the sensing node SO decreases may vary depending on a threshold voltage state of the memory cell MC included in the cell string CS11. When the develop time of the sensing node SO is a first develop time SOD1, the delta counting value may be determined as a first time t1; when the develop time of the sensing node SO is a second develop time SOD2, the delta counting value may be determined as a second time t2; and, when the develop time of the sensing node SO is a third develop time SOD3, the delta counting value may be determined as a third time t3.

When the delta counting value is determined at the first time t1, a level corresponding to the first graph G1 may be lower than a reference level RL, and a delta counting value of a relevant wordline group may be counted as "0". In contrast, when the delta counting value is determined at the first time t1, a level corresponding to each of the second and third graphs G2 and G3 may be higher than the reference level RL, and a delta counting value of each of relevant wordline groups may be counted as a value corresponding to each level.

When the delta counting value is determined at the second time t2, a level corresponding to each of the first and second graphs G1 and G2 may be lower than the reference level RL, and a delta counting value of each of relevant wordline groups may be counted as "0". In contrast, when the delta counting value is determined at the second time t2, a level corresponding to the third graph G3 may be higher than the reference level RL, and a delta counting value of a relevant wordline group may be counted as a value corresponding to the level.

When the delta counting value is determined at the third time t3, a level corresponding to each of the first, second, and third graphs G1, G2, and G3 may be lower than the reference level RL, and a delta counting value of each of relevant wordline groups may be counted as "0".

As described above, in the case where the develop time of the sensing node SO is adjusted, a delta counting value of each wordline group may change. In an exemplary embodiment, as the develop time of the sensing node SO decreases, a delta counting value counted with respect to the same wordline group may increase. In an exemplary embodiment, as the delta verification operation is repeatedly performed, the develop time of the sensing node SO may decrease.

In an exemplary embodiment, the erase delta verification logic circuit 121 may count a delta counting value using a mass bit counter (MBC) circuit. The MBC circuit may generate a delta counting value corresponding to each wordline group by converting an analog level into a digital signal. In an exemplary embodiment, as the delta verification operation is repeatedly performed, the resolution of the MBC circuit may be adjusted. As the resolution of the MBC circuit increases, a maximum value of a delta counting value counted with respect to the same wordline group may increase.

As described above, according to an embodiment of the inventive concept, the nonvolatile memory device 120 may perform the delta verification operation to detect a soft defect of a memory block. For example, the nonvolatile memory device 120 may repeatedly perform the delta verification operation, and may change a sensing condition (e.g., an erase verification voltage, a develop time of a sensing node, a resolution associated with a delta counting value, or a resolution of the MBC circuit) in each delta verification operation. In the case where a sensing condition is fixed to one given condition, there is a chance that a soft defect may be detected from a first nonvolatile memory device, but a soft defect is not detected from a second nonvolatile memory device different from the first nonvolatile memory device. However, according to an embodiment of the inventive concept, because the delta verification operation is performed using various sensing conditions, the issue that a soft defect is not detected due to a difference between physical characteristics of wordline groups or a difference between physical characteristics of nonvolatile memory devices may be prevented.

Figure 17:
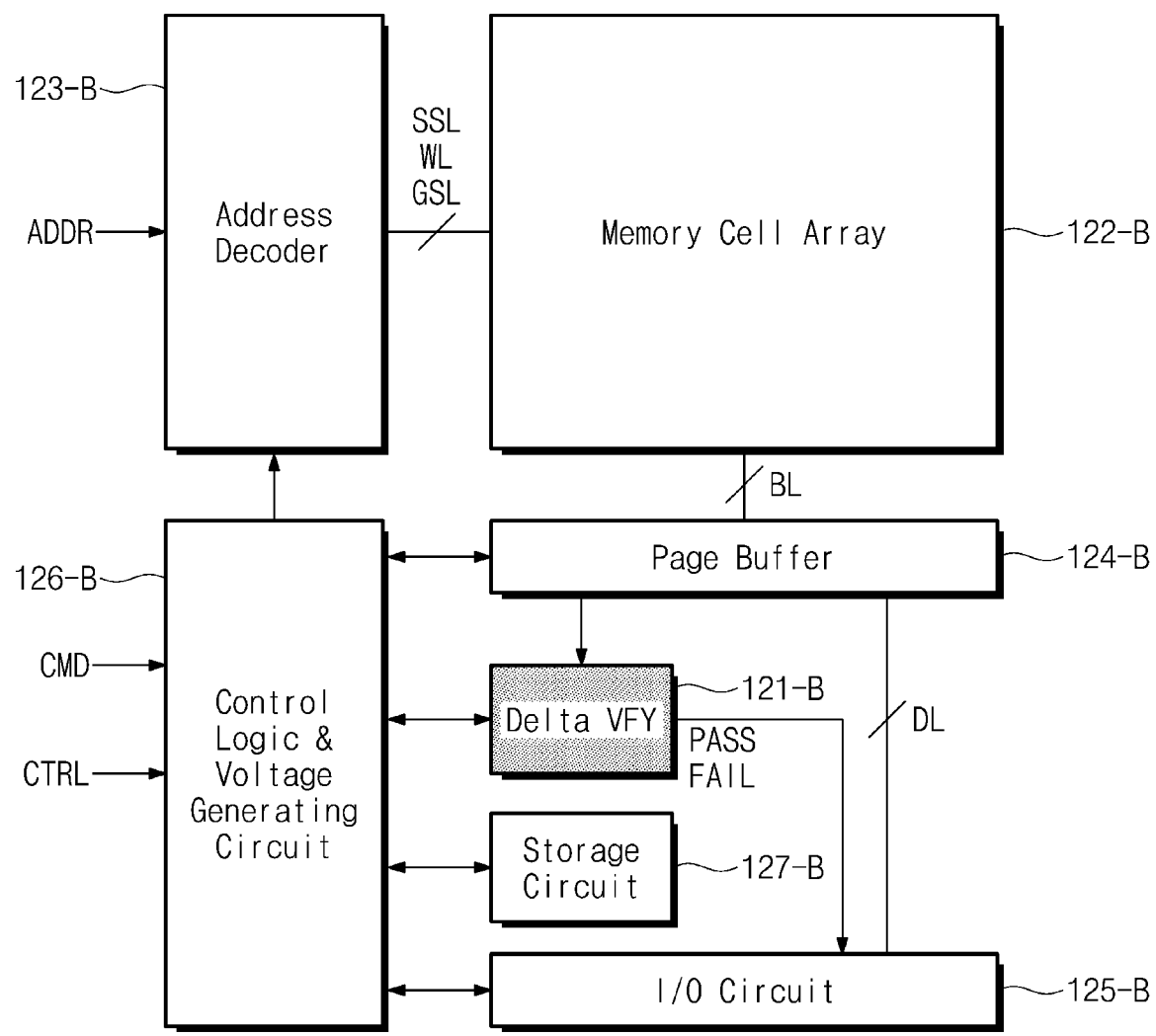
FIG. 17 is a block diagram illustrating a nonvolatile memory device according to an embodiment of the inventive concept.

FIG. 17 is a block diagram illustrating a nonvolatile memory device according to an embodiment of the inventive concept. Referring to FIG. 17, a nonvolatile memory device 120-B may include an erase delta verification logic circuit 121-B, a memory cell array 122-B, an address decoder 123-B, a page buffer 124-B, an input/output circuit 125-B, a control logic and voltage generating circuit 126-B (hereinafter referred to as a "control logic circuit"), and a storage circuit 127-B. Components such as the erase delta verification logic circuit 121-B, the memory cell array 122-B, the address decoder 123-B, the page buffer 124-B, the input/output circuit 125-B, and the control logic circuit and voltage generating circuit 126-B are described above, and thus, additional description will be omitted to avoid redundancy.

The nonvolatile memory device 120-B of FIG. 17 may further include the storage circuit 127-B. The storage circuit 127-B may store information about a sensing condition used in a previous delta verification operation. For example, the nonvolatile memory device 120-B may store information about a sensing condition used in the delta verification operation of a previous erase operation in the storage circuit 127-B.

The nonvolatile memory device 120-B may set a sensing condition to be used in the delta verification operation based on the information stored in the storage circuit 127-B. For example, when results of the block verification operation BV and the partial verification operation PV indicate PASS, the control logic circuit and voltage generating circuit 126-B may set a first sensing condition based on the information stored in the storage circuit 127-B. The control logic circuit and voltage generating circuit 126-B may control the address decoder 123-B, the page buffer 124-B, and the erase delta verification logic circuit 121-B such that the delta verification operation is performed based on the first sensing condition. When a result of the delta verification operation indicates PASS, the control logic circuit and voltage generating circuit 126-B may set a second sensing condition different from the first sensing condition and may control the address decoder 123-B, the page buffer 124-B, and the erase delta verification logic circuit 121-B such that the following delta verification operation is performed based on the second sensing condition thus set.

In an exemplary embodiment, after the delta verification operation is repeatedly performed by a predetermined number of times, information about sensing conditions used in the delta verification operations may be stored in the storage circuit 127-B. In an exemplary embodiment, when the result of the delta verification operation indicates FAIL, information about a sensing condition used in the delta verification operation determined as FAIL may be stored in the storage circuit 127-B. The information stored in the storage circuit 127-B may be used to set an initial sensing condition of the delta verification operation of the erase operation to be performed later.

In an exemplary embodiment, an operation of storing a sensing condition in the storage circuit 127-B may be performed periodically or randomly. In an exemplary embodiment, an operation of storing a sensing condition in the storage circuit 127-B may be performed every given number of times of a program/erase cycle.

Figure 18:
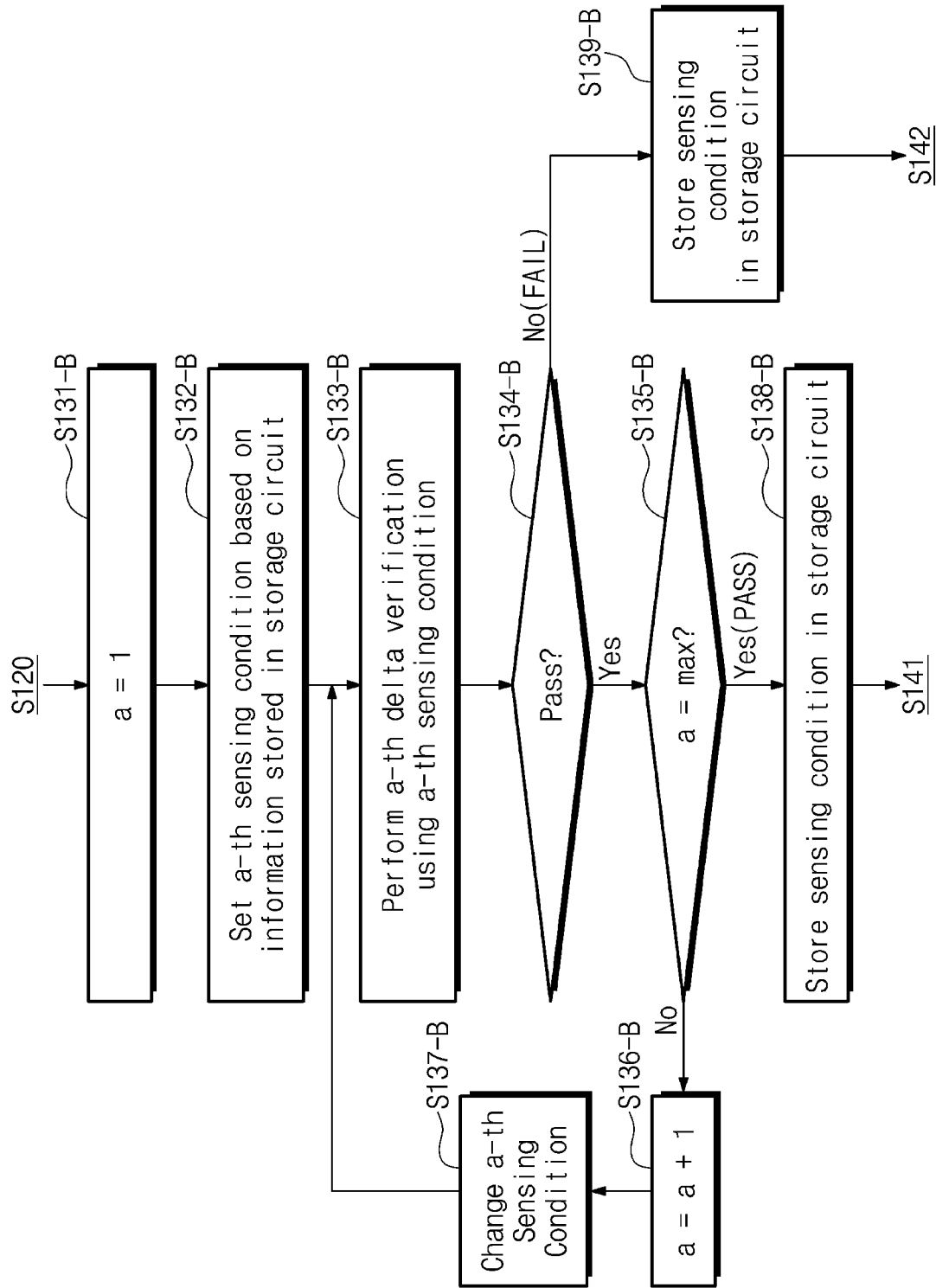
FIG. 18 is a flowchart illustrating a delta verification operation of a nonvolatile memory device of FIG. 17.

FIG. 18 is a flowchart illustrating a delta verification operation of a nonvolatile memory device of FIG. 17. For convenience of description, additional description associated with the components described above will be omitted to avoid redundancy. Referring to FIGS. 17 and 18, when results of the block verification operation BV and the partial verification operation PV indicate PASS, the nonvolatile memory device 120-B may perform operations in step S131-B to step S137-B. The operations in step S131-B to step S137-B may be similar to the operations in step S131-A to step S137-A except that, in step S132-B, an initial sensing condition to be used in the delta verification operation is set based on information stored in the storage circuit 127-B. Thus, additional description will be omitted to avoid redundancy.

When the delta verification operation is performed by a predetermined number of times (i.e., Yes in step S135-B: PASS), in step S138-B, the nonvolatile memory device 120 may store information about sensing conditions used in the delta verification operations in the storage circuit 127-B. For example, information about erase verification voltages used in the delta verification operations, information about develop times of a sensing node used in the delta verification operations, or information about resolutions of the MBC circuit used in the delta verification operations may be stored in the storage circuit 127-B. Alternatively, information about an average value of erase verification voltages used in the delta verification operations, information about an average value of develop times of a sensing node used in the delta verification operations, or information about an average value of resolutions of the MBC circuit used in the delta verification operations may be stored in the storage circuit 127-B.

When a result of the delta verification operation indicates FAIL (i.e., No in step S134-B: FAIL), in step S139-B, the nonvolatile memory device 120 may store information about a sensing condition used in the delta verification operation determined as FAIL in the storage circuit 127-B. For example, information about an erase verification voltage used in the delta verification operation determined as FAIL, information about a develop time of a sensing node used in the delta verification operation determined as FAIL, or information about a resolution of the MBC circuit used in the delta verification operation determined as FAIL may be stored in the storage circuit 127-B. In an exemplary embodiment, an operation in step S138-B may be omitted. Alternatively, one of the operation in step S138-B and the operation in step S139-B may be selectively performed.

The information about the sensing condition stored in the storage circuit 127-B may be used to set an initial sensing condition of the delta verification operation of the erase operation to be performed later.

As described above, the nonvolatile memory device 120-B according to an embodiment of the inventive concept may perform the delta verification operation in the erase operation to detect a soft defect occurring at memory cells of a specific wordline group. The nonvolatile memory device 120-B may accumulate or manage information about a sensing condition used in the delta verification operation of each erase operation and may set an initial sensing condition to be used in the delta verification operation of the following erase operation based on the accumulated or managed information. Accordingly, the accuracy of soft defect detection may be improved in a plurality of nonvolatile memory devices having different physical characteristics, and in addition, a soft defect may be normally detected even though a physical characteristic of a single nonvolatile memory device varies depending on a life of the single nonvolatile memory device.

Figure 19:
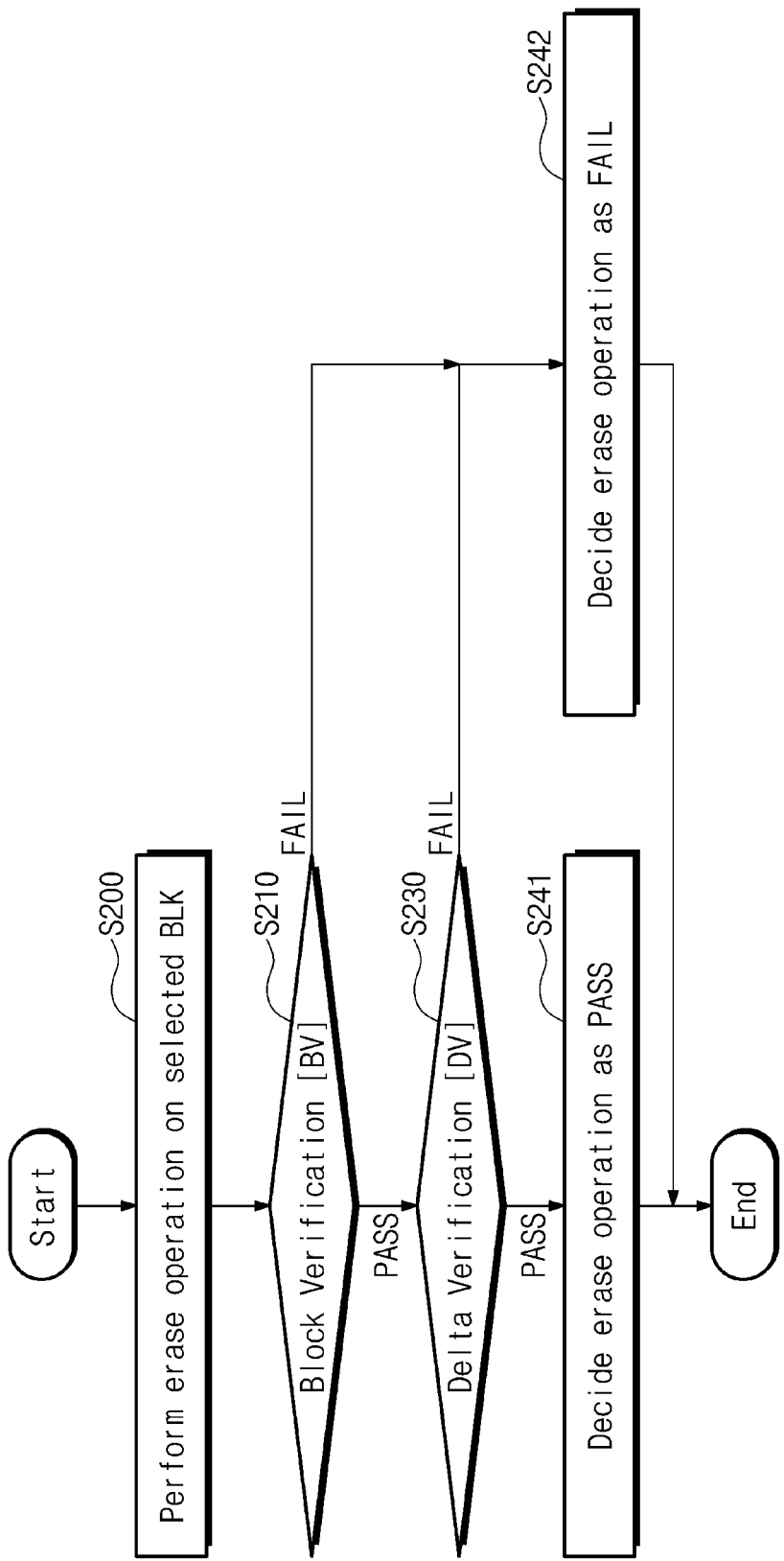
FIG. 19 is a flowchart illustrating an operation of a nonvolatile memory device of FIG. 3.

FIG. 19 is a flowchart illustrating an operation of a nonvolatile memory device of FIG. 3. For convenience of description, additional description associated with the components described above will be omitted to avoid redundancy. Referring to FIGS. 3 and 19, the nonvolatile memory device 120 may perform operations in step S200 and step S210. The operations in step S200 and step S210 are similar to the operations in step S100 and step S110 of FIG. 5, and thus, additional description will be omitted to avoid redundancy.

When a result of the operation in step S210 indicates FAIL, the nonvolatile memory device 120 may perform an operation in step S242. When the result of the operation in step S210 indicates PASS, the nonvolatile memory device 120 may perform an operation in step S230. When a result of the operation in step S230 indicates PASS, the nonvolatile memory device 120 may perform an operation in step S241. The operations in step S230, step S241, and step S242 are similar to the operations in step S130, step S141, and step S142 of FIG. 5, and thus, additional description will be omitted to avoid redundancy.

The embodiment of FIG. 19 is different from the embodiment of FIG. 5 in that the partial verification operation PV is omitted. For example, according to the embodiment of FIG. 19, when a result of the block verification operation BV indicates PASS, the nonvolatile memory device 120 may perform the delta verification operation DV. For example, a time necessary for erase verification may be shortened by omitting the partial verification operation PV. The embodiment of FIG. 19 is similar to the embodiment of FIG. 5 except that the partial verification operation PV is omitted, and thus, additional description will be omitted to avoid redundancy.

In an exemplary embodiment, the nonvolatile memory device 120 according to an embodiment of the inventive concept may perform the partial verification operation PV and the delta verification operation DV without performing the block verification operation BV. For example, after the erase operation is performed, the nonvolatile memory device 120 may perform the partial verification operation PV and the delta verification operation DV depending on a result of the partial verification operation PV. However, the inventive concept is not limited thereto.

Figure 20:
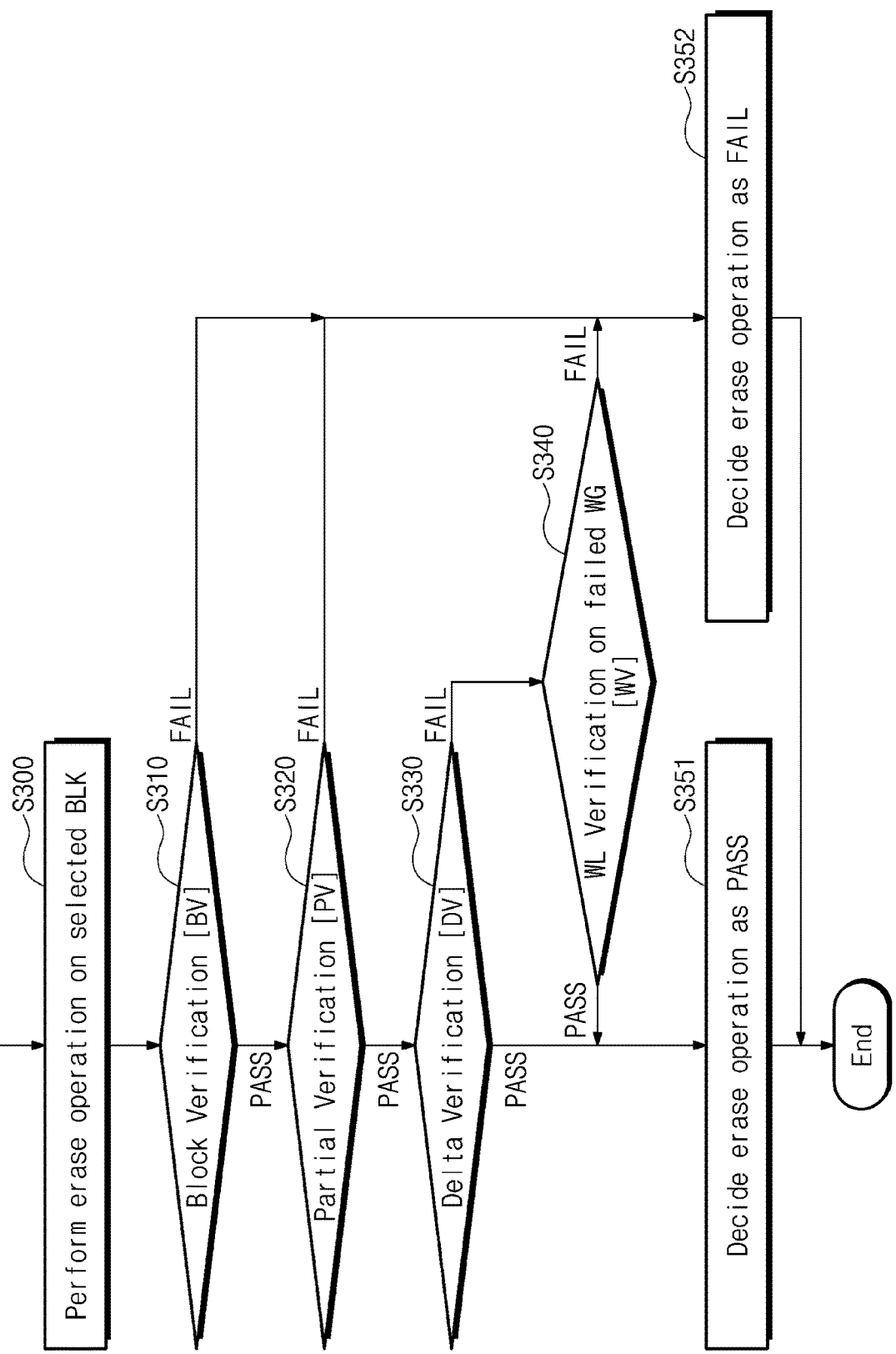
FIG. 20 is a flowchart illustrating an operation of a nonvolatile memory device of FIG. 3.

FIG. 20 is a flowchart illustrating an operation of a nonvolatile memory device of FIG. 3. Referring to FIGS. 3 and 20, the nonvolatile memory device 120 may perform operations in step S300, step S310, step S320, step S330, step S340, step S351, and step S352. The operations in step S300, step S310, step S320, step S330, step S351, and step S352 are similar to the operations in step S100, step S110, step S120, step S130, step S141, and step S142 of FIG. 5, and thus, additional description will be omitted to avoid redundancy.

According to the flowchart of FIG. 20, when a result of the delta verification operation DV indicates FAIL, in step S340, the nonvolatile memory device 120 may perform a wordline verification operation WV. The wordline verification operation WV may indicate an operation of detecting and verifying fail bits of each of wordlines of a wordline group, which is determined in the delta verification operation DV as a soft defect exists. When a result of the wordline verification operation WV indicates FAIL, the nonvolatile memory device 120 may perform an operation in step S352; when the result of the wordline verification operation WV indicates PASS, the nonvolatile memory device 120 may perform an operation in step S351. For example, even though the result of the delta verification operation DV indicates FAIL, the erase operation of the selected memory block may be determined as PASS depending on the result of the wordline verification operation WV. The wordline verification operation WV will be more fully described with reference to FIGS. 21 to 23.

Figure 21:
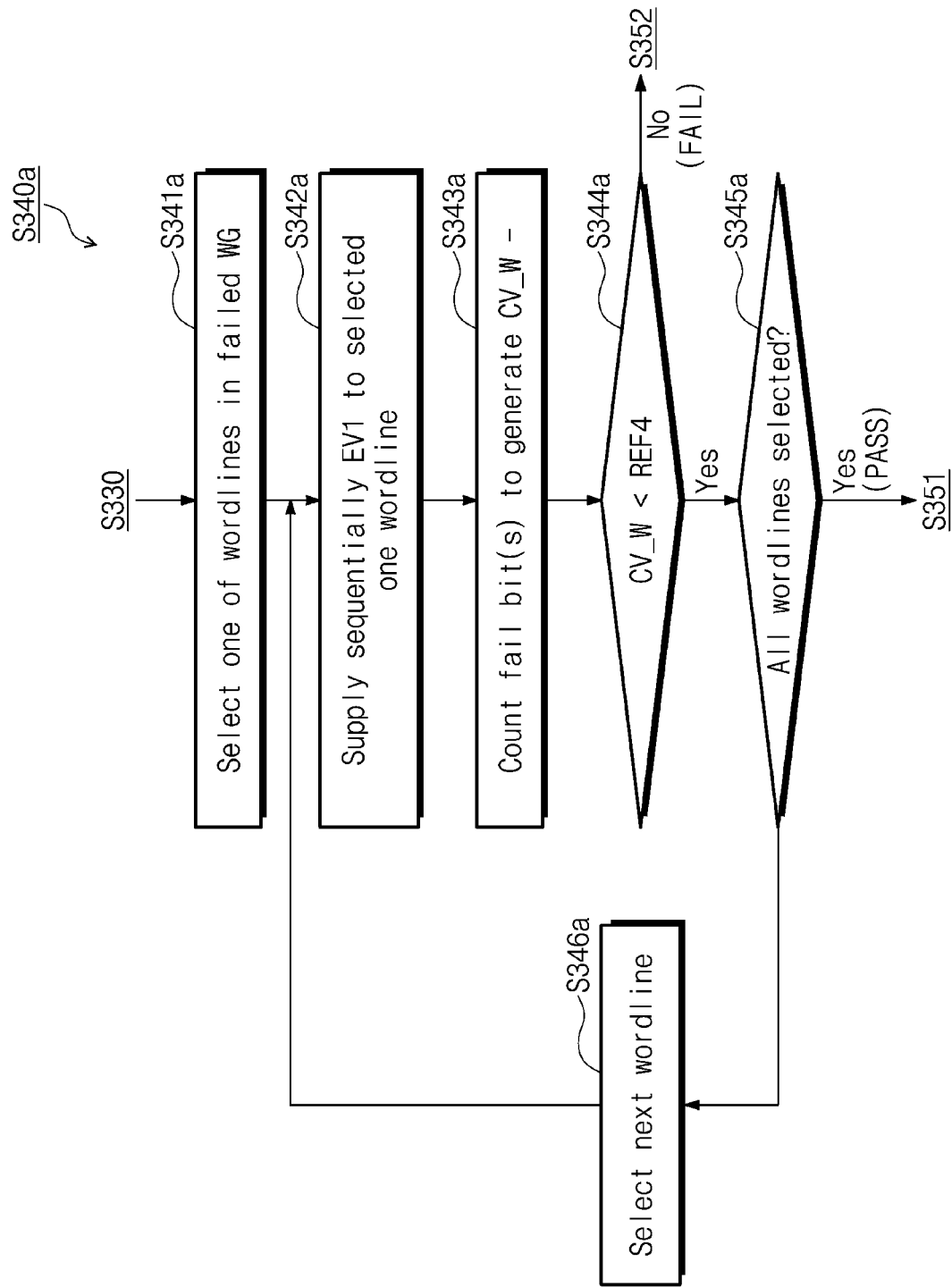
FIG. 21 is a flowchart illustrating an operation in step S340 of FIG. 20 which is a wordline verification operation.

FIG. 21 is a flowchart illustrating an operation in step S340 of FIG. 20 which is a wordline verification operation. Referring to FIGS. 3, 20, and 21, when a result of the delta verification operation DV in step S330 indicates FAIL, the nonvolatile memory device 120 may perform the wordline verification operation WV, for example, an operation in step S340a. The operation in step S340a may include operations in step S341a, step S342a, step S343a, step S344a, step S345a, and step S346a.

In step S341a, the nonvolatile memory device 120 may select one of wordlines of a wordline group which was determined as FAIL. Memory cells of the wordline group which was determined as FAIL in the delta verification operation DV may include a soft defect.

In step S342a, the nonvolatile memory device 120 may apply the first erase verification voltage EV1 to the selected wordline and may apply the pass voltage VPASS to the remaining wordlines. Below, for convenience of description, the description will be given as the wordline verification operation WV is performed using the first erase verification voltage EV1 (i.e., an erase verification voltage used in the delta verification operation DV), but the inventive concept is not limited thereto. For example, the erase verification voltage used in the wordline verification operation WV may be smaller than the 0-th erase verification voltage EV0 and may be different from the first erase verification voltage EV1.

In step S343a, the nonvolatile memory device 120 may count fail bits from data read from memory cells of the selected wordline to generate a counting value CV_W of the selected wordline (for brief expression, hereinafter referred to as a "wordline counting value"). In the wordline verification operation, since an erase verify operation is performed on memory cells of each wordline, the number of fail bits which is obtained in each wordline verification operation may be equal to the number of fail bit lines.

In step S344a, the nonvolatile memory device 120 may compare the wordline counting value CV_W with a fourth reference value REF4.

When the wordline counting value CV_W is equal to or greater than the fourth reference value REF4, the nonvolatile memory device 120 may perform an operation in step S352. For example, when the wordline counting value CV_W is equal to or more than the fourth reference value REF4, a result of the wordline verification operation WV may be determined as FAIL.

When the wordline counting value CV_W is smaller than the fourth reference value REF4, in step S345a, the nonvolatile memory device 120 may determine whether all the wordlines of the wordline group, which was determined as FAIL, are selected. When an unselected wordline exists, in step S346a, the nonvolatile memory device 120 may select a next wordline of the wordlines of the wordline group, which was determined as FAIL, and may return to step S342a.

In step S345a, when it is determined that all the wordlines of the wordline group, which was determined as FAIL, are selected, the nonvolatile memory device 120 may perform an operation in step S351. For example, when it is determined that all the wordlines of the wordline group, which was determined as FAIL, are selected, the wordline verification operation WV may be determined as PASS.

Figure 22A:
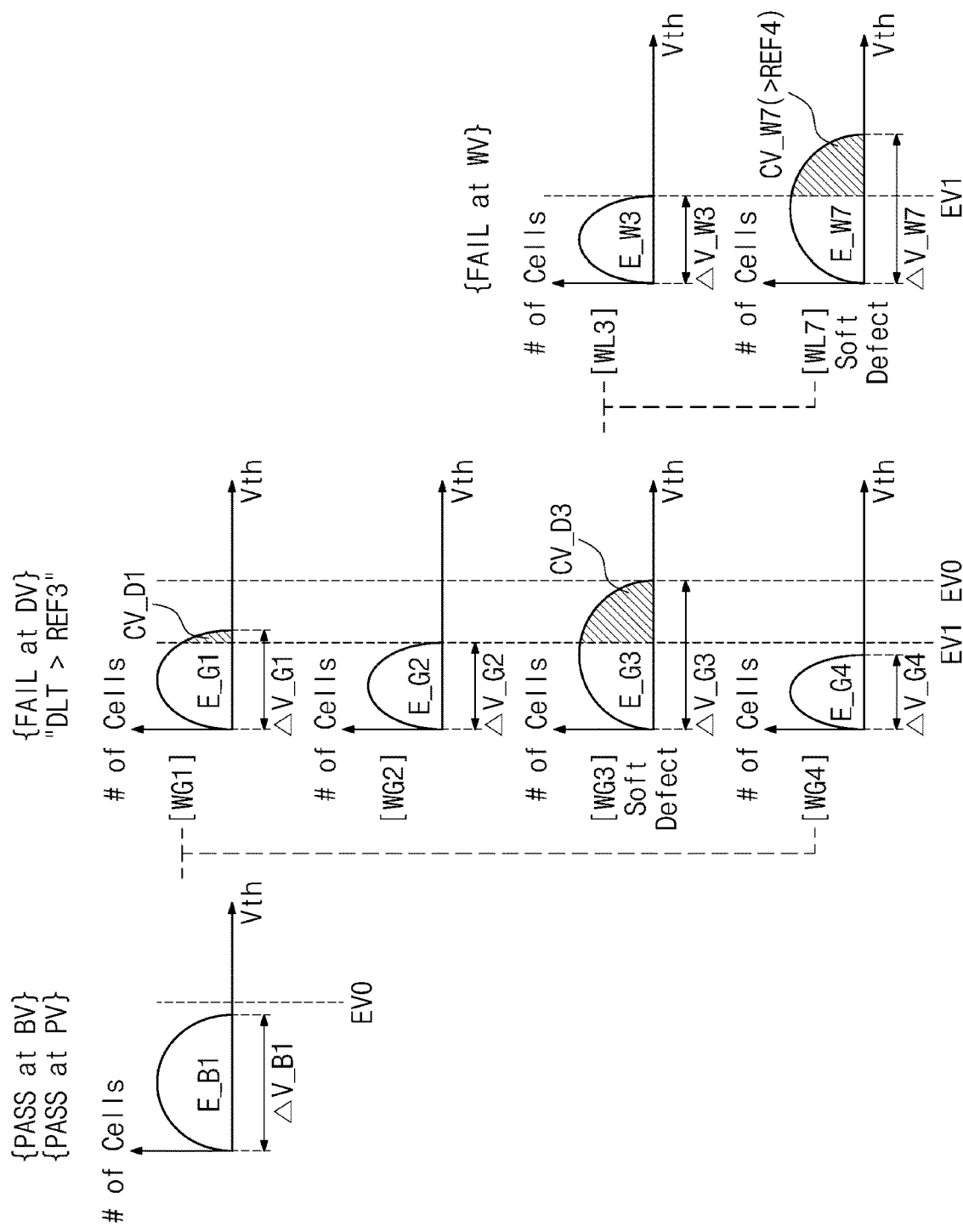
FIGS. 22A and 22B are diagrams for describing a wordline verification operation according to a flowchart of FIG. 21.
Figure 22B:
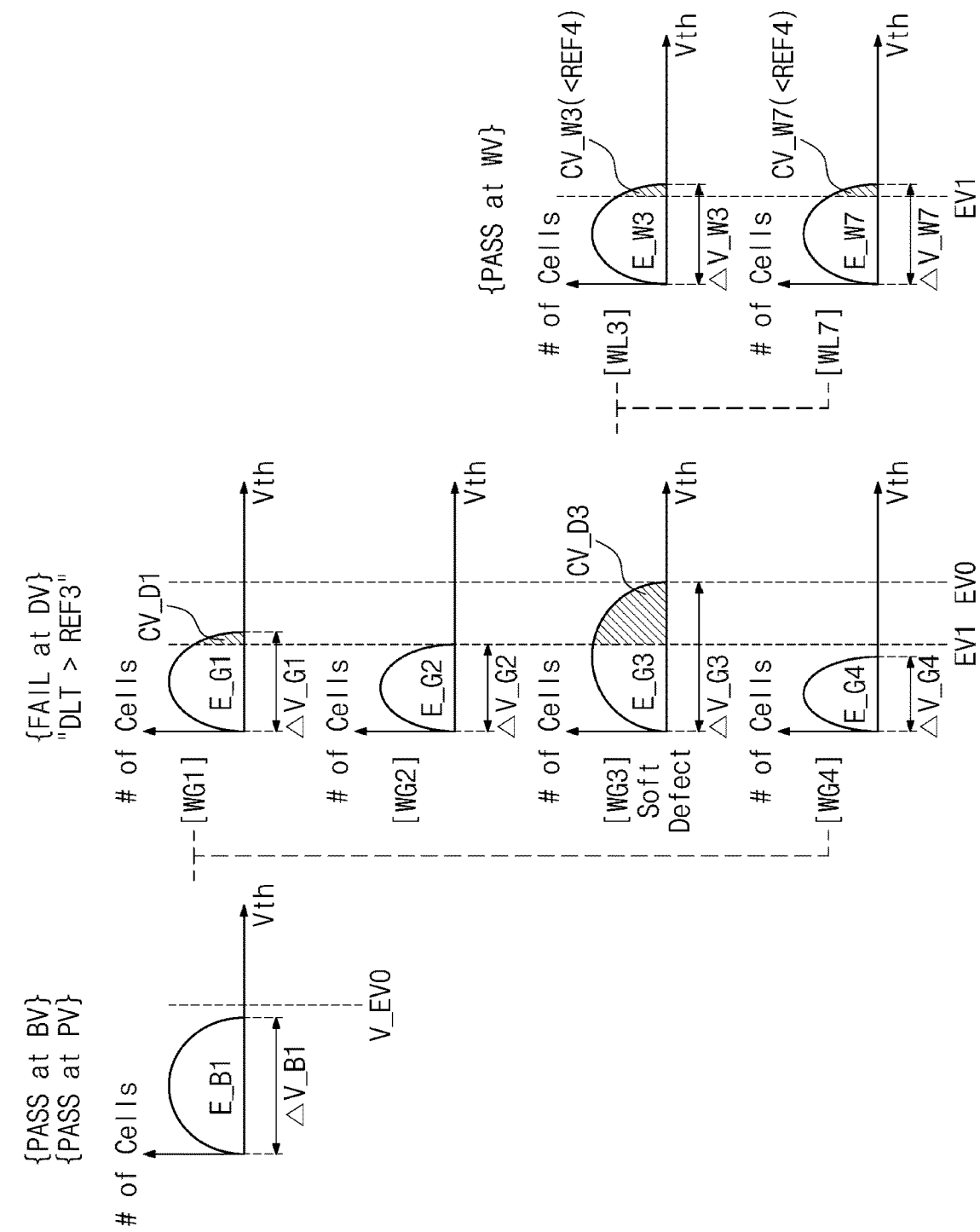

FIGS. 22A and 22B are threshold voltage distribution diagrams for describing a wordline verification operation according to a flowchart of FIG. 21. For convenience of description, additional description associated with the components described above will be omitted to avoid redundancy. Referring to FIGS. 22A and 22B, memory cells of the first memory block BLK1 may have the first block erase state E_B1, and the first to fourth wordline groups WG1 to WG4 of the first memory block BLK1 may have the first to fourth group erase states E_G1 to E_G4, respectively. The first block erase state E_B1 and the first to fourth group erase states E_G1 to E_G4 are described above, and thus, additional description will be omitted to avoid redundancy. As described above, all the results of the block verification operation BV and the partial verification operation PV performed on the first memory block BLK1 may indicate PASS, and the result of the delta verification operation DV performed on the third wordline group WG3, may indicate FAIL.

The nonvolatile memory device 120, in response to the delta verification operation DV being determined as FAIL, may perform the wordline verification operation WV on the third wordline group WG3 determined as having a soft defect. For example, as described with reference to FIG. 4B, the third wordline group WG3 may include the third and seventh wordlines WL3 and WL7. The nonvolatile memory device 120 may apply the first erase verification voltage EV1 to the third wordline WL3 and applying the pass voltage VPASS to the remaining wordlines and may count the number of memory cells having threshold voltages greater than the first erase verification voltage EV1 from among memory cells connected with the third wordline WL3 (i.e., the number of fail bits from data read from the memory cells having threshold voltages greater than the first erase verification voltage EV1). As in the above description, the nonvolatile memory device 120 may count fail bits associated with the seventh wordline WL7.

The memory cells of the third wordline WL3 may have a third wordline erase state E_W3, and the memory cells of the seventh wordline WL7 may have a seventh wordline erase state E_W7. Widths of threshold voltage distributions of the third and seventh wordline erase states E_W3 and E_W7 may be $\Delta V\_W3$ and $\Delta V\_W7$, respectively.

For the threshold voltage distribution as shown in FIG. 22A, the nonvolatile memory device 120 does not count fail bits associated with the third wordline WL3 in the wordline verification operation WV (i.e., an upper limit value of the third wordline erase state E_W3 being smaller than the first erase verification voltage EV1), and count the number of fail bits associated with the seventh wordline WL7 as a seventh wordline counting value CV_W7 in the wordline verification operation WV. As illustrated in FIG. 22A, because the seventh wordline counting value CV_W7 is greater than a fourth reference value REF4, a soft defect occurs at the seventh wordline WL7. As such, the nonvolatile memory device 120 may determine a result of the wordline verification operation WV as FAIL.

In contrast, for the threshold voltage distribution of FIG. 22B, the nonvolatile memory device 120 counts the number of fail bits associated with the third wordline WL3 as a third wordline counting value CV_W3, and the number of fail bits associated with the seventh wordline WL7 as the seventh wordline counting value CV_W7. Because the fail bits of the wordline group WG3 in the delta verification operation DV occur at both the third and seventh wordlines WL3 and WL7, each of the third and seventh block counting values CV_W3 and CV_W7 may be smaller than the fourth reference value REF4, and the nonvolatile memory device 120 may determine a result of the wordline verification operation WV as PASS. Even when a specific wordline group is determined as having a soft defect in the delta verification, a soft defect does not occur at each of a plurality of wordlines included in the specific wordline group. Because data stored in memory cells of each wordline do not have errors beyond the correction capability of various error correction operations, the specific memory block may be determined as PASS and used as a normal block.

In an exemplary embodiment, the above partial verification operation PV may be an operation of comparing fail bit counting values obtained from respective wordline groups of a selected memory block using the 0-th erase verification voltage EV0, but the wordline verification operation WV described with reference to FIGS. 21 to 22B may be an operation of comparing fail bit counting values obtained from respective wordlines, which belong to a wordline group determining as having a soft defect, using the first erase verification voltage EV1.

Figure 23:
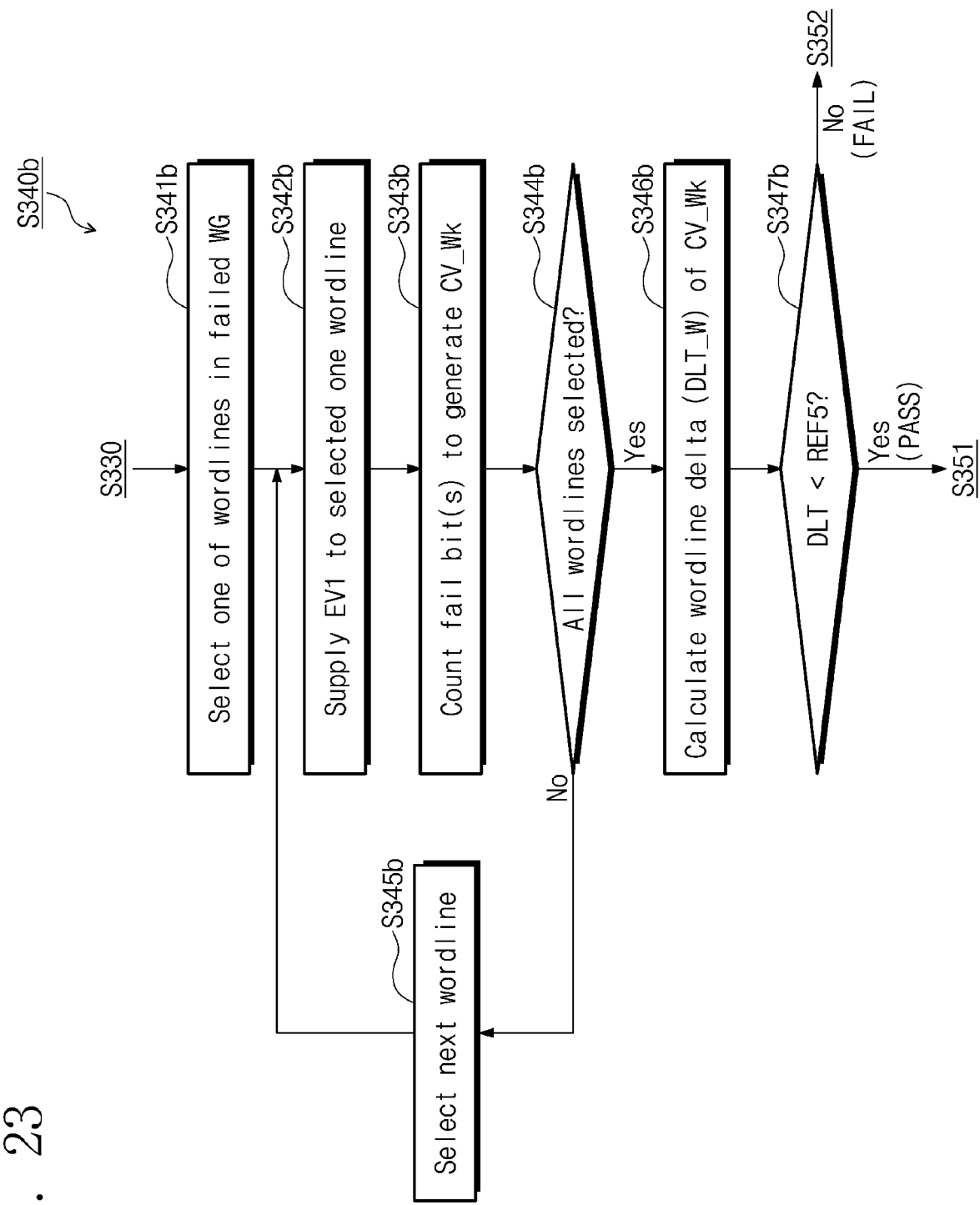
FIG. 23 is a flowchart illustrating a wordline verification operation in step S340 of FIG. 20.

FIG. 23 is a flowchart illustrating a wordline verification operation in step S340 of FIG. 20. For convenience of description, additional description associated with the components described above will be omitted to avoid redundancy. Referring to FIGS. 3, 20, and 23, when a result of the delta verification operation DV in step S330 indicates FAIL, the nonvolatile memory device 120 may perform the wordline verification operation WV, for example, an operation in step S340b. The operation in step S340b may include operations in step S341b, step S342b, step S343b, step S344b, step S345b, step S346b, and step S347b.

The nonvolatile memory device 120 may perform the operations in step S341b to step S343b. The operations in step S347b to step S343b are similar to the operations in step S341a to step S343a of FIG. 21, and thus, additional description will be omitted to avoid redundancy.

In step S344b, the nonvolatile memory device 120 may determine whether all the wordlines of the wordline group, which was determined as FAIL, are selected. When an unselected wordline exists, in step S345b, the nonvolatile memory device 120 may select a next wordline of the wordlines of the wordline group, which was determined as FAIL, and may return to step S342b.

When it is determined that all the wordlines of the wordline group, which was determined as FAIL, are selected, in step S346b, the nonvolatile memory device 120 may calculate a delta value DLT_W (for convenience of description, referred to as a "wordline delta value") based on wordline counting values. Like the delta value DLT described above, the wordline delta value DLT_W may be a value indicating a difference between wordline counting values or a distribution or a dispersion of the wordline counting values. For example, the wordline delta value DLT_W may indicate a difference between a maximum value and a minimum value of the wordline counting values, a difference between a maximum value and an intermediate value of the wordline counting values, a difference between a maximum value and an average value of the wordline counting values, or the like, but the inventive concept is not limited thereto.

In step S347b, the nonvolatile memory device 120 may compare the delta value DLT with a fifth reference value REF5. When the delta value DLT is equal to or greater than the fifth reference value REF5, the nonvolatile memory device 120 may perform an operation in step S352. For example, when the delta value DLT is equal to or greater than the fifth reference value REF5, a result of the wordline verification operation WV may be determined as FAIL (i.e., a result of the wordline verification operation WV may be determined as a soft defect is present at a specific wordline). When the delta value DLT is smaller than the fifth reference value REF5, the nonvolatile memory device 120 may perform an operation in step S351. For example, when the delta value DLT is smaller than the fifth reference value REF5, the result of the wordline verification operation WV may be determined as PASS.

In an exemplary embodiment, the wordline verification operation WV described with reference to FIG. 21 is similar to the delta verification operation DV described above except that a verification target is a specific wordline group determined as having a soft defect and a verification unit is a wordline unit, and thus, additional description will be omitted to avoid redundancy. In an exemplary embodiment, the wordline verification operation WV according to the flowchart of FIG. 23 may be performed by the erase delta verification logic circuit 121 described with reference to FIGS. 13A and 13B.

Figure 24:
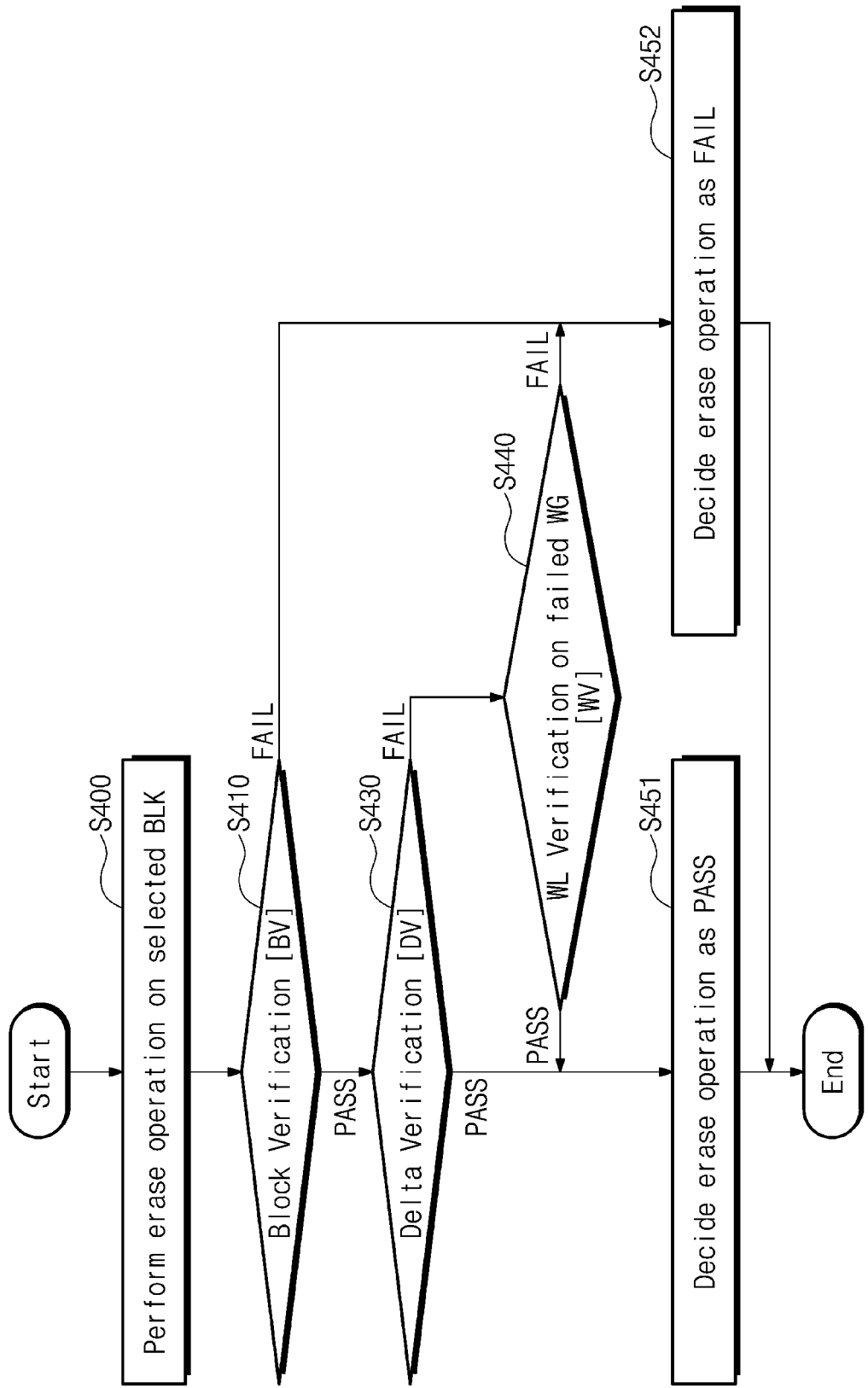
FIG. 24 is a flowchart illustrating an exemplary operation of a nonvolatile memory system of FIG. 3.

FIG. 24 is a flowchart illustrating an exemplary operation of a nonvolatile memory system of FIG. 3. For convenience of description, additional description associated with the components described above will be omitted to avoid redundancy. Referring to FIGS. 3 and 24, the nonvolatile memory device 120 may perform operations in step S400 to step S430. The operations in S400, step S410, and step S430 are similar to the operations in step S200, step S210, and step S230 of FIG. 19, and thus, additional description will be omitted to avoid redundancy.

When a result of the delta verification operation DV in step S430 indicate FAIL, the nonvolatile memory device 120 may perform the wordline verification operation WV in step S440. When the result of the operation in step S430 indicates PASS or a result of the wordline verification operation WV in step S440 indicates PASS, the nonvolatile memory device 120 may perform an operation in step S451. When the result of the operation in step S410 indicates FAIL or the result of the wordline verification operation WV in step S440 indicates FAIL, the nonvolatile memory device 120 may perform an operation in step S452. The operations in step S440, step S451, and step S452 are similar to the operations in step S340, step S351, and step S352 of FIG. 20, and thus, additional description will be omitted to avoid redundancy.

Compared to the operation according to the flowchart of FIG. 20, the operation according to the flowchart of FIG. 24 may not include the partial verification operation PV. This is similar to the operation described with reference to FIG. 19, and thus, additional description will be omitted to avoid redundancy.

As described above, after the erase operation is performed on a selected memory block, the nonvolatile memory device 120 according to an embodiment of the inventive concept may detect a hard defect of the selected memory block through the block verification operation BV or the partial verification operation PV, and may detect a soft defect of the selected memory block through the delta verification operation DV or the wordline verification operation WV. The first erase verification voltage EV1 used in the delta verification operation DV or the wordline verification operation WV may be smaller than the 0-th erase verification voltage EV0 used in the block verification operation BV or the partial verification operation PV. Accordingly, because a soft defect of a memory block or of one wordline which may occur in an initial operation of the nonvolatile memory device 120 or under a specific condition may be detected, the reliability of the nonvolatile memory device 120 may be improved.

The above embodiments are exemplary embodiments for describing the inventive concept easily, and the inventive concept is not limited thereto. For example, the erase operation of a selected memory block may be determined as PASS or FAIL depending on various verification operations (e.g., the block verification operation, the partial verification operation, the delta verification operation, or the wordline verification operation) according to embodiments of the inventive concept. Alternatively, a nonvolatile memory device according to an embodiment of the inventive concept may perform the delta verification operation by a predetermined number of times (e.g., two or more times). Each time when the delta verification is performed, the sensing conditions that are used in respective delta verification operations may change. Alternatively, a sequence of various verification operations according to an embodiment of the inventive concept may be different from that according to the illustrated embodiments and may be changed or modified in various manners.

Figure 25:
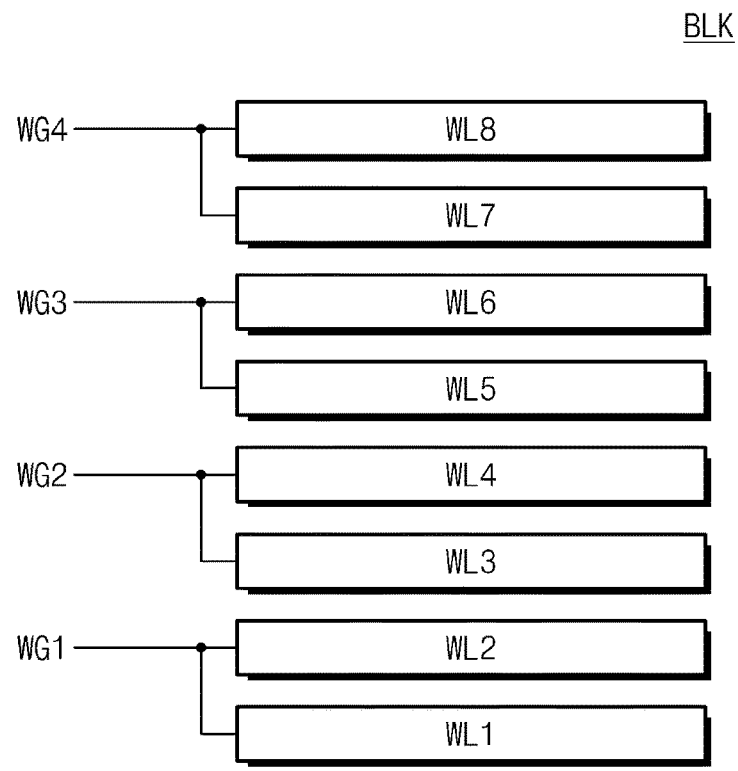
FIGS. 25 and 26 are diagrams for describing a wordline group of a memory block.
Figure 26:
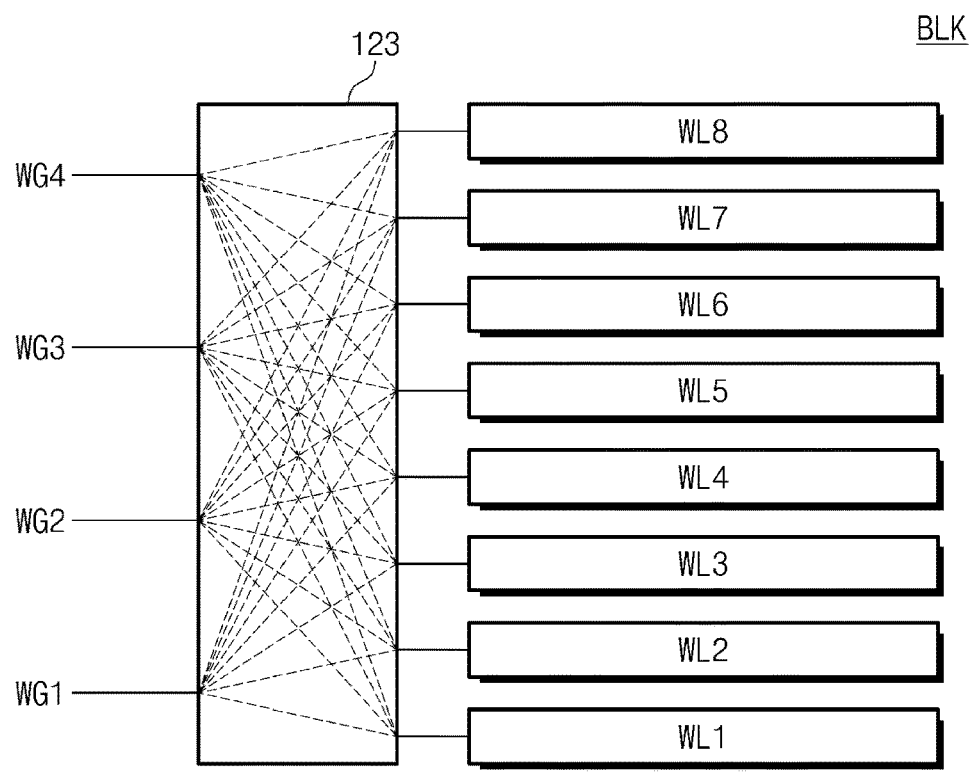

FIGS. 25 and 26 are diagrams for describing a wordline group of a memory block. The wordline groups WG1 to WG4 described with reference to FIG. 4B are defined such that the plurality of wordlines WL1 to WL8 are selected in the form of a finger or intersection. However, the inventive concept is not limited thereto. For example, one wordline group may include a plurality of wordlines adjacent to each other. In detail, as illustrated in FIG. 25, the memory block BLK may include the first to eighth wordlines WL1 to WL8. The first to eighth wordlines WL1 to WL8 may be sequentially stacked from a substrate (not illustrated) in structure.

The first and second wordlines WL1 and WL2 may form the first wordline group WG1, the third and fourth wordlines WL3 and WL4 may form the second wordline group WG2, the fifth and sixth wordlines WL5 and WL6 may form the third wordline group WG3, and the seventh and eighth wordlines WL7 and WL8 may form the fourth wordline group WG4. The first and second wordlines WL1 and WL2 may be adjacent to each other, the third and fourth wordlines WL3 and WL4 may be adjacent to each other, the fifth and sixth wordlines WL5 and WL6 may be adjacent to each other, and the seventh and eighth wordlines WL7 and WL8 may be adjacent to each other.

Alternatively, wordline groups may correspond to a plurality of wordlines in various manners. For example, as illustrated in FIG. 26, the first to eighth wordlines WL1 to WL8 may be connected with the address decoder 123. The address decoder 123 may classify or divide the plurality of wordlines WL1 to WL8 into the plurality of wordline groups WG1 to WG4 in various manners, under control of the control logic circuit and voltage generating circuit 126 (refer to FIG. 3).

In an exemplary embodiment, a level of the first erase verification voltage EV1 that is used in the delta verification operation DV or the wordline verification operation WV may be variously changed or modified depending on a way to classify wordline groups, a physical location of a wordline group (e.g., a height of a wordline, which is the closest to the substrate, from among wordlines included in a wordline group from the substrate), or a physical characteristic of a wordline group.

In an exemplary embodiment, a level of the first erase verification voltage EV1 that is used in the delta verification operation DV or the wordline verification operation WV may be variously changed or modified depending on various characteristics such as the number of program/erase cycles of the nonvolatile memory device 120 or a selected memory block or a temperature of the nonvolatile memory device 120.

Figure 27A:
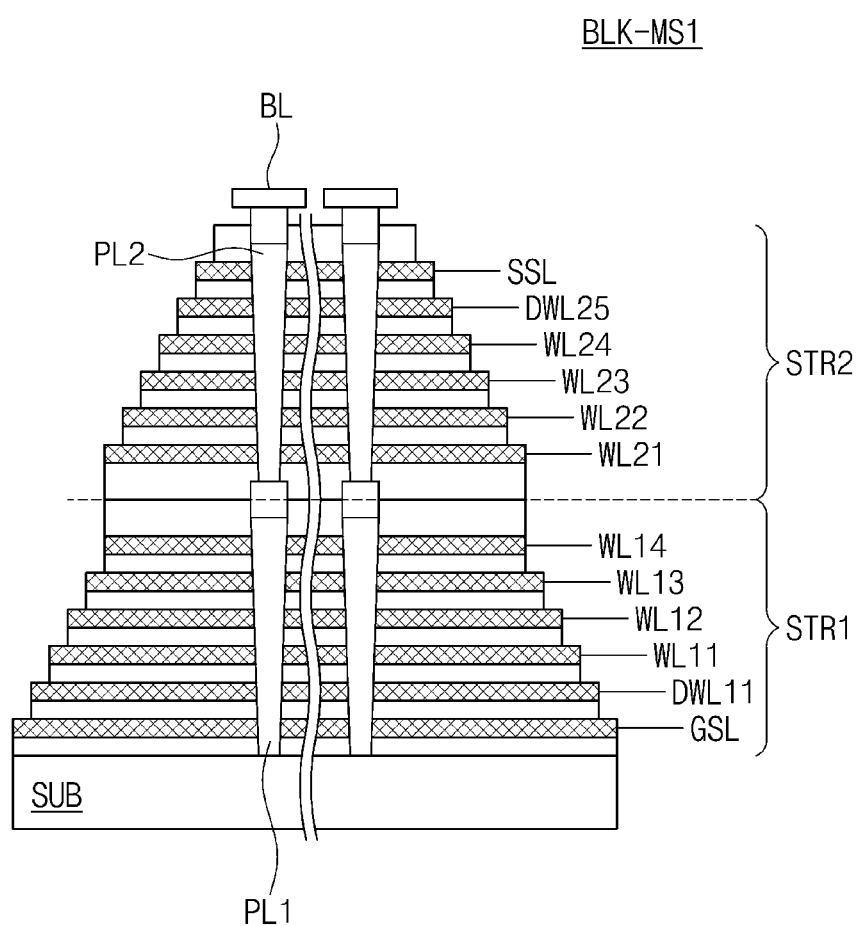
FIGS. 27A and 27B are diagrams illustrating a memory block included in a memory cell array of FIG. 3.
Figure 27B:
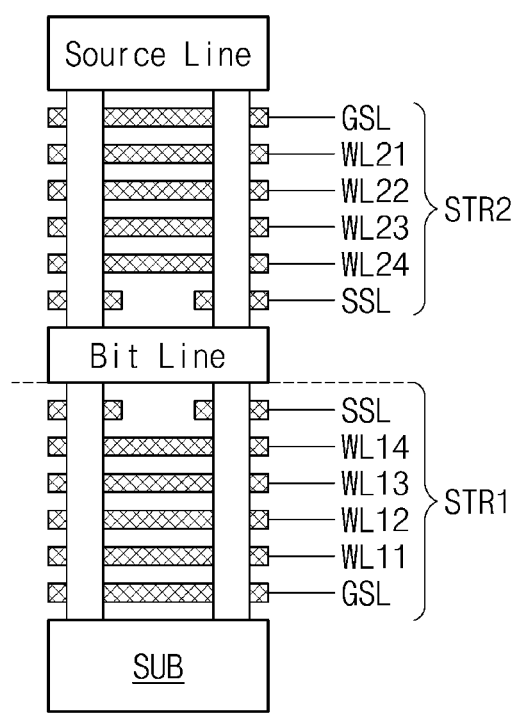

FIGS. 27A and 27B are diagrams illustrating a memory block included in a memory cell array of FIG. 3. In an exemplary embodiment, memory blocks BLK-MS1 and BLK-MS2 having a multi-stack structure will be described with reference to FIGS. 27A and 27B.

Referring to FIG. 27A, a first multi-stack memory block BLK-MS1 may include a first memory structure STR1 and a second memory structure STR2 stacked in a direction perpendicular to a substrate SUB. Each of the first and second memory structures STR1 and STR2 may be a three-dimensional memory cell structure including memory cells stacked in the direction perpendicular to the substrate SUB. The first memory structure STR1 may include a ground selection line GSL, a dummy wordline DWL11, and a plurality of wordlines WL11 to WL14, and the ground selection line GSL, the dummy wordline DWL11, and the plurality of wordlines WL11 to WL14 may be stacked in the direction perpendicular to the substrate SUB. The first memory structure STR1 may include a first pillar PL1 penetrating the ground selection line GSL, the dummy wordline DWL11, and the plurality of wordlines WL11 to WL14.

The second memory structure STR2 may be formed above the first memory structure STR1. The second memory structure STR2 may include a plurality of wordlines WL21 to WL24, a dummy wordline DWL25, and a string selection line SSL, and the plurality of wordlines WL21 to WL24, the dummy wordline DWL21, and the string selection line SSL may be stacked in the direction perpendicular to the substrate SUB. The second memory structure STR2 may include a second pillar PL2 penetrating the plurality of wordlines WL21 to WL24, the dummy wordline DWL21, and the string selection line SSL. The first pillar PL1 of the first memory structure STR1 and the second pillar PL2 of the second memory structure STR2 may be electrically connected.

A bitline BL (or a bitline pad) may be formed above the second memory structure STR2, and the bitline BL may be electrically connected with the second pillar PL2 of the second memory structure STR2.

Referring to FIG. 27B, a second multi-stack memory block BLK-MS2 may include a first memory structure STR1 and a second memory structure STR2 stacked in the direction perpendicular to the substrate SUB. Each of the first and second memory structures STR1 and STR2 may be a three-dimensional memory cell structure including memory cells stacked in the direction perpendicular to the substrate SUB. The first memory structure STR1 may include a ground selection line GSL, a plurality of wordlines WL11 to WL14, and a string selection line SSL, and the ground selection line GSL, the plurality of wordlines WL11 to WL14, and the string selection line SSL may be stacked in the direction perpendicular to the substrate SUB. The second memory structure STR2 may include a string selection line SSL, a plurality of wordlines WL21 to WL24, and a ground selection line GSL, and the string selection line SSL, the plurality of wordlines WL21 to WL24, and the ground selection line GSL may be stacked in the direction perpendicular to the substrate SUB.

A bitline may be provided above the first memory structure STR1, and the second memory structure STR2 may be provided above the bitline. Unlike the first multi-stack memory block BLK-MS1 of FIG. 27A, in the second multi-stack memory block BLK-MS2 of FIG. 27B, the bitline may be provided between the first and second memory structures STR1 and STR2.

The above multi-stack memory blocks are only exemplary, and the inventive concept is not limited thereto. An example is illustrated in FIGS. 27A and 27B as the multi-stack memory blocks BLK-MS1 and BLK-MS2 have a two-layer stack structure, but the inventive concept is not limited thereto. For example, a multi-stack memory block may be implemented in a structure in which "n" memory structures (n being an integer more than 2) are stacked in a direction perpendicular to a substrate.

Alternatively, in each of a plurality of memory structures included in a multi-stack memory block, the number of wordlines, the number of string selection lines, and the number of ground selection lines may be variously changed or modified.

Figure 28A:
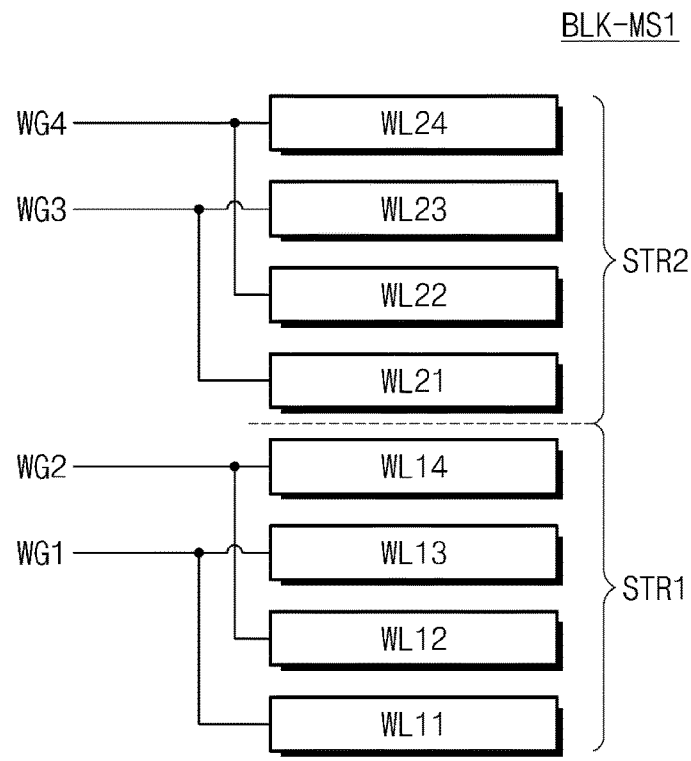
FIGS. 28A and 28B are diagrams for describing a wordline group of a first multi-stack memory block of FIG. 27A.
Figure 28B:
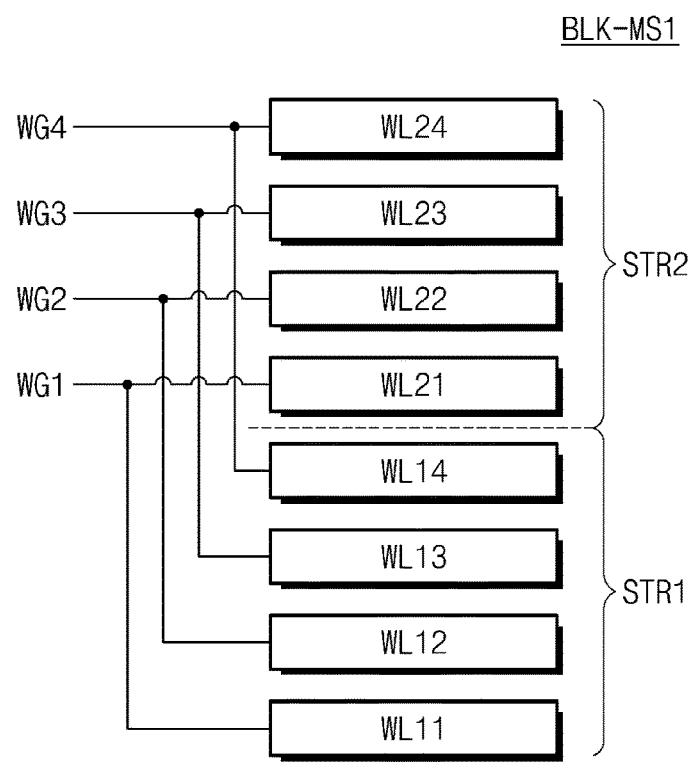

FIGS. 28A and 28B are diagrams for describing a wordline group of a first multi-stack memory block of FIG. 27A. For convenience of description, a way to classify or divide a plurality of wordlines into the first to fourth wordline groups WG1 to WL4 will be described with reference to the first multi-stack memory block BLK-MS1, but the inventive concept is not limited thereto.

Referring to FIGS. 27A, 28A, and 28B, the first multi-stack memory block BLK-MS1 may include the first and second memory structures STR1 and STR2, the first memory structure STR1 may include the plurality of wordlines WL11 to WL14, and the second memory structure STR2 may include the plurality of wordlines WL21 to WL24.

Each of the plurality of wordline groups WG1 to WG4 may be defined to include wordlines of the same memory structure. For example, as illustrated in FIG. 28A, the first wordline group WG1 may include the wordlines WL11 and WL13 of the first memory structure STR1, and the second wordline group WG2 may include the wordlines WL12 and WL14 of the first memory structure STR1. The third wordline group WG3 may include the wordlines WL21 and WL23 of the second memory structure STR2, and the fourth wordline group WG4 may include the wordlines WL22 and WL24 of the second memory structure STR2.

Alternatively, each of the plurality of wordline groups WG1 to WG4 may be defined to include wordlines that respectively belong to the first and second memory structures STR1 and STR2 and have the same height. For example, a height of the wordline WL11 from the bottom of the first memory structure STR1 may be identical to a height of the wordline WL21 from the bottom of the second memory structure STR2. For example, as illustrated in FIG. 28B, the wordline WL11 of the first memory structure STR1 and the wordline WL21 of the second memory structure STR2 may be included in the first wordline group WG1. Likewise, wordline pairs WL12 and WL22, WL13 and WL23, and WL14 and WL24 each including wordlines of the same height may be included in the second, third, and fourth wordline groups WG2, WG3, and WG4, respectively.

The above multi-stack memory block structure and the above wordline groups are only exemplary, and the inventive concept is not limited thereto.

In an exemplary embodiment, as described above, wordline groups of memory blocks having a multi-stack structure may be determined based on various manners, and a nonvolatile memory device may perform the delta verification operation described with reference to FIGS. 1 to 24 based on the wordline groups determined in various manners.

Figure 29:
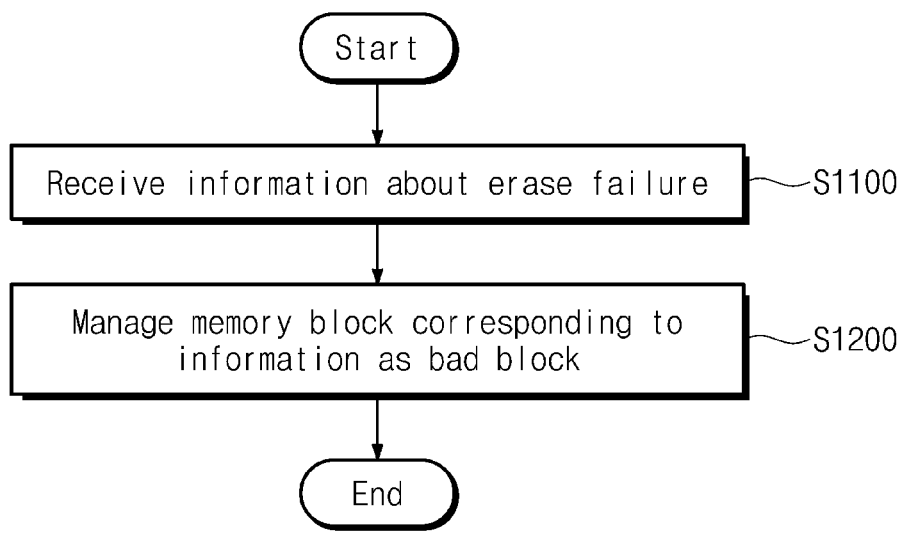
FIG. 29 is a flowchart illustrating an exemplary operation of a memory controller of FIG. 2.

FIG. 29 is a flowchart illustrating an exemplary operation of a memory controller of FIG. 2. Referring to FIGS. 2 and 29, in step S1100, the memory controller 110 may receive information about erase failure. For example, the nonvolatile memory device 120 may perform the erase operation and the erase verification operation (e.g., the block verification operation BV, the partial verification operation PV, the delta verification operation DV, or the wordline verification operation WV) based on the methods described with reference to FIGS. 1 to 28B. In the erase verification operation, when the erase failure occurs, the nonvolatile memory device 120 may provide the memory controller 110 with information about a memory block where the erase failure occurs.

In step S1200, the memory controller 110 may manage the memory block corresponding to the received information as a bad block. For example, the memory controller 110 may manage the memory block where the erase failure occurs, as a bad block, and may update mapping information about the memory block, in which the erase failure occurs, so as to be mapped onto any other normal block. In an exemplary embodiment, the above bad block managing operation may be performed by the nonvolatile memory manager 114 (or an FTL) described with reference to FIG. 2.

Figure 30:
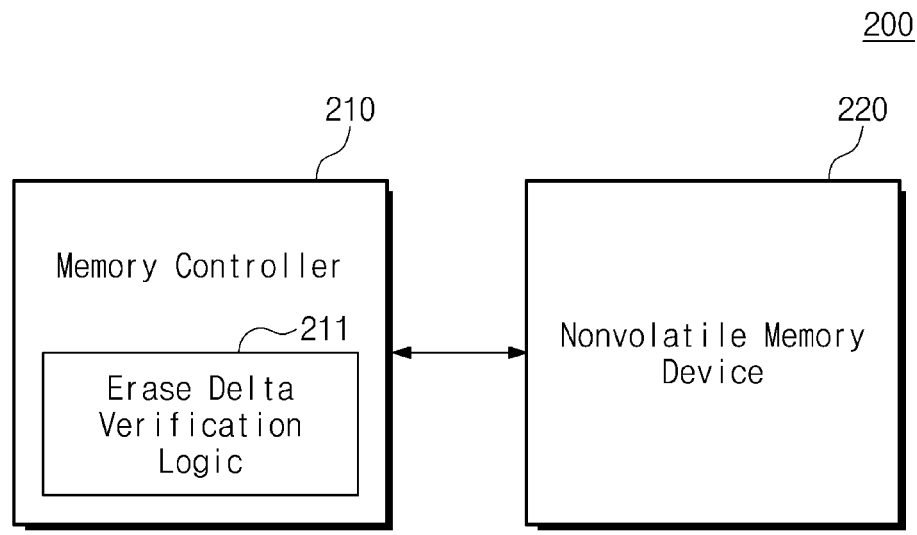
FIG. 30 is a block diagram illustrating a storage device according to an embodiment of the inventive concept.

FIG. 30 is a block diagram illustrating a storage device according to an embodiment of the inventive concept. Referring to FIG. 30, a storage device 200 may include a memory controller 210 and a nonvolatile memory device 220. The erase verification manner described with reference to FIGS. 1 to 28B may be performed by the nonvolatile memory device 120 or may be performed by the erase delta verification logic circuit 121 implemented in the nonvolatile memory device 120 in the form of an on-chip.

In contrast, in the embodiment of FIG. 30, instead of the nonvolatile memory device 220, the memory controller 210 may perform the delta verification operation DV. For example, the nonvolatile memory device 220 may perform the delta verification operation DV under control of the memory controller 210. The nonvolatile memory device 220 may provide the memory controller 210 with a delta counting value of each wordline group during the delta verification operation DV described with reference to FIGS. 1 to 28B. The memory controller 210 may calculate the delta value DLT based on the delta counting value as described above and may determine whether a soft defect occurs at a selected memory block based on the calculated delta value DLT. In an exemplary embodiment, the above delta verification operation DV of the memory controller 210 may be performed by erase delta verification logic 211 included in the memory controller 210. The erase delta verification logic 211 may be implemented in the form of software, firmware, hardware, or a combination thereof.

Figure 31:
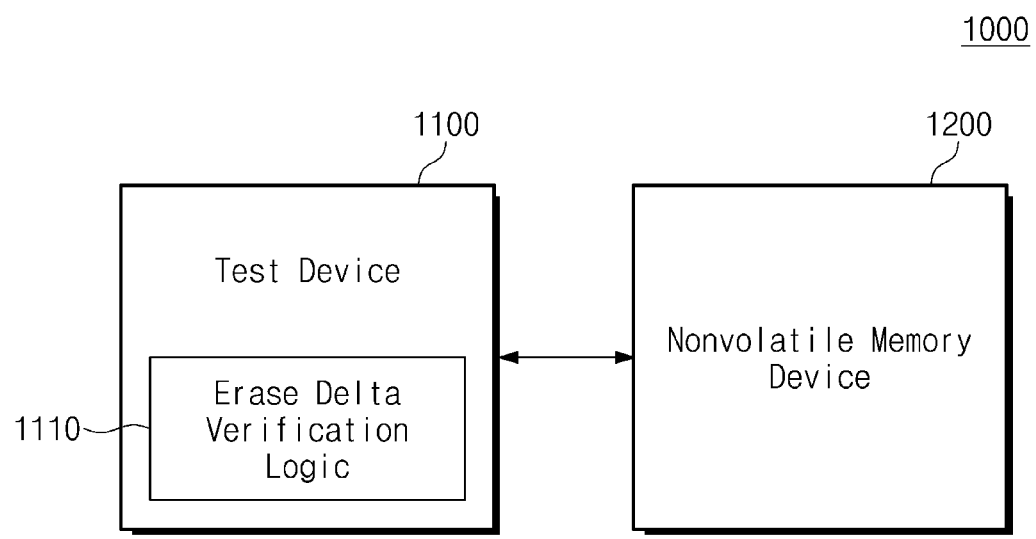
FIG. 31 is a block diagram illustrating a test system according to an embodiment of the inventive concept.

FIG. 31 is a block diagram illustrating a test system according to an embodiment of the inventive concept. Referring to FIG. 31, a test system 1000 may include a test device 1100 and a nonvolatile memory device 1200. The test device 1100 may perform various test operations on the nonvolatile memory device 1200. In an exemplary embodiment, the test device 1100 may include erase delta verification logic 1110. The erase delta verification logic 1110 may perform the delta verification operation described with reference to FIGS. 1 to 30. The test device 1100 may perform the delta verification operation on the nonvolatile memory device 1200 and to detect a soft defect occurring at a specific memory block, a specific wordline group, or a specific wordline of the nonvolatile memory device 1200.

Figure 32:
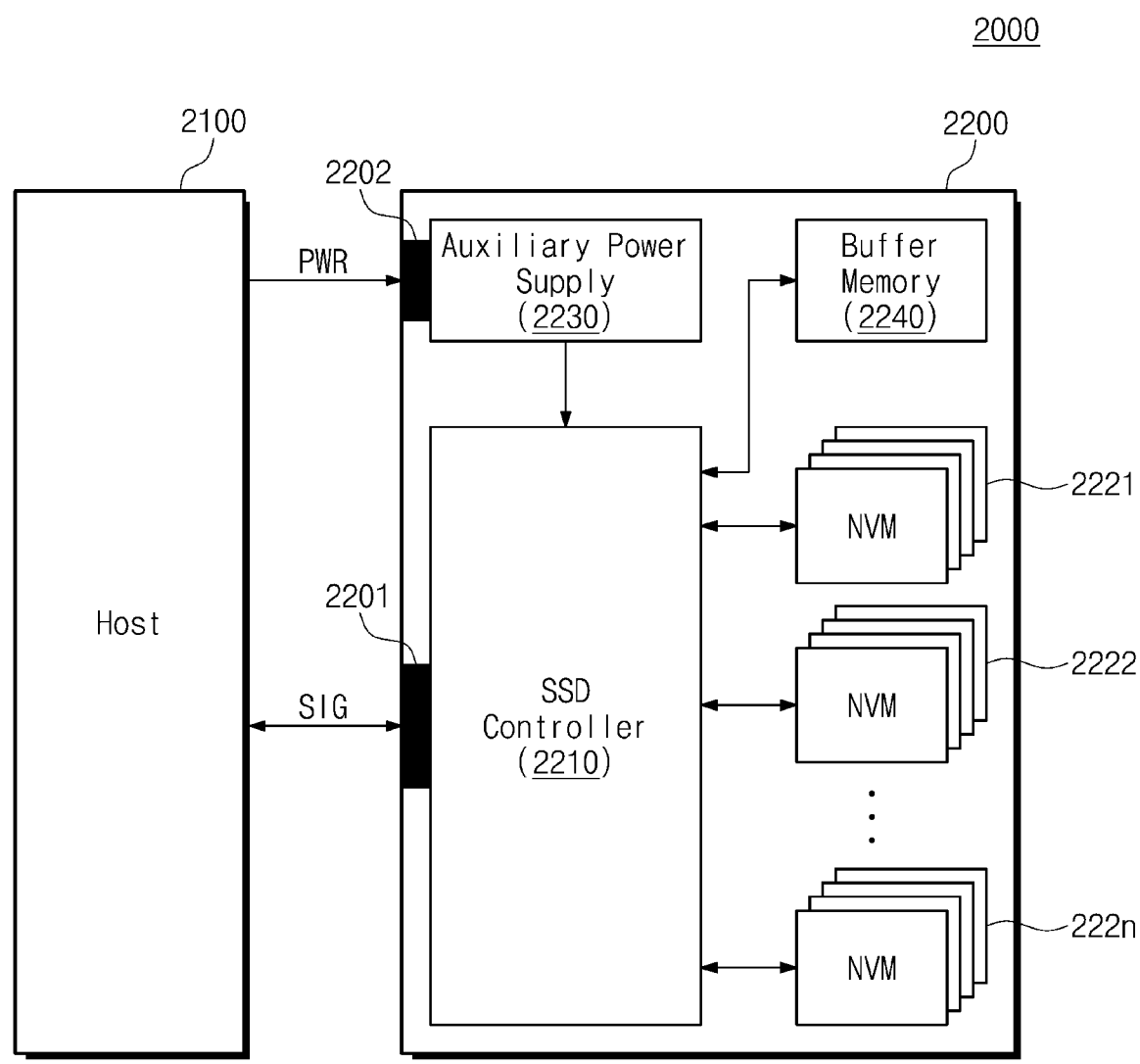
FIG. 32 is a block diagram illustrating a solid state drive system to which a nonvolatile memory device according to the inventive concept is applied.

FIG. 32 is a block diagram illustrating a solid state drive (SSD) system to which a nonvolatile memory device according to the inventive concept is applied. Referring to FIG. 32, an SSD system 2000 may include a host 2100 and a storage device 2200. The storage device 2200 may exchange signals SIG with the host 2100 through a signal connector 2201 and may be supplied with a power PWR through a power connector 2202. The storage device 2200 includes an SSD controller 2210, a plurality of nonvolatile memories 2221 to 222n, an auxiliary power supply 2230, and a buffer memory 2240.

The SSD controller 2210 may control the plurality of nonvolatile memories 2221 to 222n in response to the signals SIG received from the host 2100. The plurality of nonvolatile memories 2221 to 222n may operate under control of the SSD controller 2210. The auxiliary power supply 2230 is connected with the host 2100 through the power connector 2202. The auxiliary power supply 2230 may be charged by the power PWR supplied from the host 2100. When the power PWR is not smoothly supplied from the host 2100, the auxiliary power supply 2230 may power the storage device 2200. The buffer memory 2240 may be used as a buffer memory of the storage device 2200. In an exemplary embodiment, each of the plurality of nonvolatile memories 2221 to 222n may perform the delta verification operation described with reference to FIGS. 1 to 30 or may include an erase delta verification logic circuit which performs the delta verification operation. In another exemplary embodiment, the SSD controller 2210 may perform the delta verification operation described with reference to FIGS. 1 to 30 on each of the plurality of nonvolatile memories 2221 to 222n or may include an erase delta verification logic circuit which performs the delta verification operation.

Figure 33:
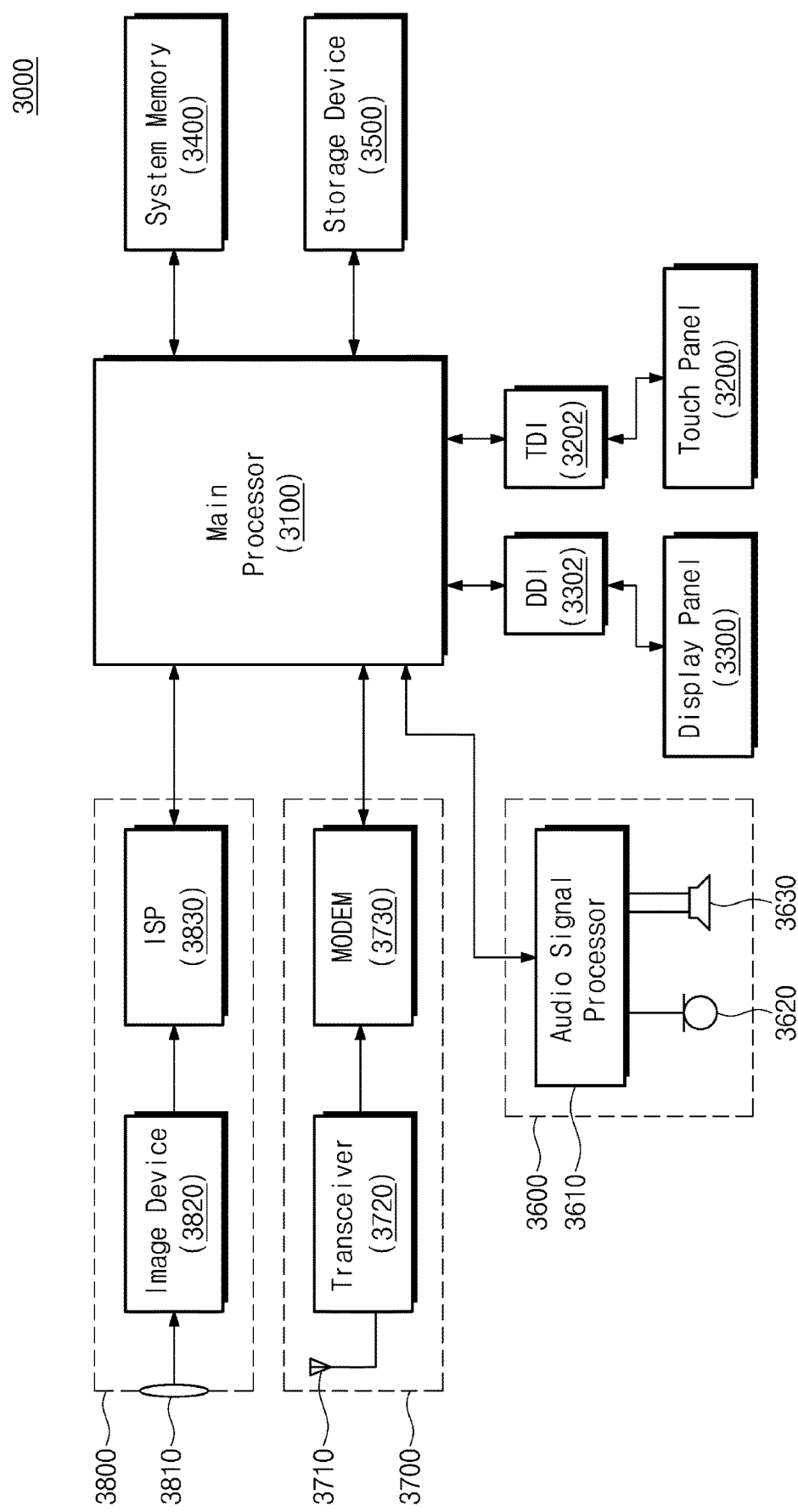
FIG. 33 is a block diagram illustrating an electronic device to which a storage system according to the inventive concept is applied.

FIG. 33 is a block diagram illustrating an electronic device to which a storage system according to the inventive concept is applied. Referring to FIG. 33, an electronic device 3000 may include a main processor 3100, a touch panel 3200, a touch driver integrated circuit 3202, a display panel 3300, a display driver integrated circuit 3302, a system memory 3400, a storage device 3500, an audio processor 3600, a communication block 3700, and an image processor 3800. In an exemplary embodiment, the electronic device 3000 may be one of various electronic devices such as a personal computer, a laptop computer, a workstation, a portable communication terminal, a personal digital assistant (PDA), a portable media player (PMP), a digital camera, a smartphone, a tablet computer, and a wearable device.

The main processor 3100 may control overall operations of the electronic device 3000. The main processor 3100 may control/manage operations of the components of the electronic device 3000. The main processor 3100 may process various operations for the purpose of operating the electronic device 3000. The touch panel 3200 may sense a touch input from a user under control of the touch driver integrated circuit 3202. The display panel 3300 may display image information under control of the display driver integrated circuit 3302.

The system memory 3400 may store data that are used for an operation of the electronic device 3000. For example, the system memory 3400 may include a volatile memory such as a static random access memory (SRAM), a dynamic RAM (DRAM), or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM).

The storage device 3500 may store data regardless of whether a power is supplied. For example, the storage device 3500 may include at least one of various nonvolatile memories such as a flash memory, a PRAM, an MRAM, a ReRAM, and a FRAM. For example, the storage device 3500 may include an embedded memory and/or a removable memory of the electronic device 3000. In an exemplary embodiment, the storage device 3500 may include a nonvolatile memory and may perform the delta verification operation on the nonvolatile memory.

The audio processor 3600 may process an audio signal using an audio signal processor 3610. The audio processor 3600 may receive an audio input through a microphone 3620 or may provide an audio output through a speaker 3630. The communication block 3700 may exchange signals with an external device/system through an antenna 3710. A transceiver 3720 and a modulator/demodulator (MODEM) 3730 of the communication block 3700 may process signals exchanged with the external device/system in compliance with at least one of various wireless communication protocols: long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID). The image processor 3800 may receive a light through a lens 3810. An image device 3820 and an image signal processor (ISP) 3830 included in the image processor 3800 may generate image information about an external object, based on a received light.

Figure 34:
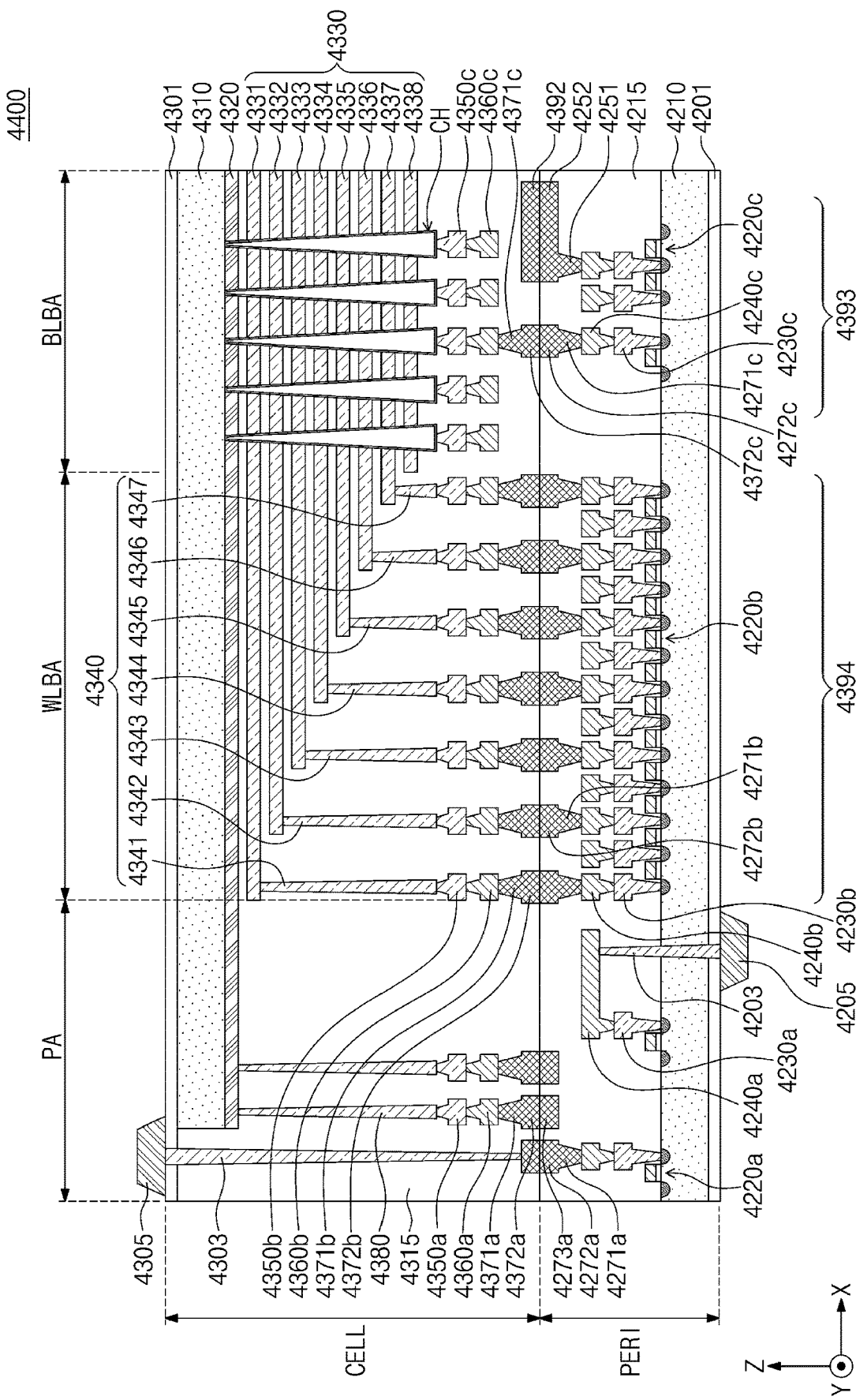
FIG. 34 is a diagram illustrating a memory device according to another example embodiment.

FIG. 34 is a diagram illustrating a memory device 4400 according to another example embodiment.

Referring to FIG. 34, a memory device 4400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, the bonding metals may include copper (Cu) using a Cu—Cu bonding. The present inventive concept, however, is not limited thereto. For example, the bonding metals may also be formed of aluminum (Al) or tungsten (W).

Each of the peripheral circuit region PERI and the cell region CELL of the memory device 4400 may include an external pad bonding area PA, a wordline bonding area WLBA, and a bitline bonding area BLBA.

The peripheral circuit region PERI may include a first substrate 4210, an interlayer insulating layer 4215, a plurality of circuit elements 4220*a*, 4220*b*, and 4220*c* formed on the first substrate 4210, first metal layers 4230*a*, 4230*b*, and 4230*c* respectively connected to the plurality of circuit elements 4220*a*, 4220*b*, and 4220*c*, and second metal layers 4240*a*, 4240*b*, and 4240*c* formed on the first metal layers 4230*a*, 4230*b*, and 4230*c*. In an example embodiment, the first metal layers 4230*a*, 4230*b*, and 4230*c* may be formed of tungsten having relatively high electrical resistance, and the second metal layers 4240*a*, 4240*b*, and 4240*c* may be formed of copper having relatively low electrical resistance.

In an example embodiment illustrate in FIG. 35, although only the first metal layers 4230*a*, 4230*b*, and 4230*c* and the second metal layers 4240*a*, 4240*b*, and 4240*c* are shown and described, the example embodiment is not limited thereto, and one or more additional metal layers may be further formed on the second metal layers 4240*a*, 4240*b*, and 4240*c*. At least a portion of the one or more additional metal layers formed on the second metal layers 4240*a*, 4240*b*, and 4240*c* may be formed of aluminum or the like having a lower electrical resistance than those of copper forming the second metal layers 4240*a*, 4240*b*, and 4240*c*.

The interlayer insulating layer 4215 may be disposed on the first substrate 4210 and cover the plurality of circuit elements 4220*a*, 4220*b*, and 4220*c*, the first metal layers 4230*a*, 4230*b*, and 4230*c*, and the second metal layers 4240*a*, 4240*b*, and 4240*c*. The interlayer insulating layer 4215 may include an insulating material such as silicon oxide, silicon nitride, or the like.

Lower bonding metals 4271*b* and 4272*b* may be formed on the second metal layer 4240*b* in the wordline bonding area WLBA. In the wordline bonding area WLBA, the lower bonding metals 4271*b* and 4272*b* in the peripheral circuit region PERI may be electrically bonded to upper bonding metals 4371*b* and 4372*b* of the cell region CELL. The lower bonding metals 4271*b* and 4272*b* and the upper bonding metals 4371*b* and 4372*b* may be formed of aluminum, copper, tungsten, or the like.

Further, the upper bonding metals 4371*b* and 4372*b* in the cell region CELL may be referred as first metal pads and the lower bonding metals 4271*b* and 4272*b* in the peripheral circuit region PERI may be referred as second metal pads.

The cell region CELL may include at least one memory block. The cell region CELL may include a second substrate 4310, an interlayer insulating layer 4315 and a common source line 4320. On the second substrate 4310, a plurality of wordlines 4331 to 4338 (i.e., 4330) may be stacked in a direction (a Z-axis direction), perpendicular to an upper surface of the second substrate 4310. At least one string select line and at least one ground select line may be arranged on and below the plurality of wordlines 4330, respectively, and the plurality of wordlines 4330 may be disposed between the at least one string select line and the at least one ground select line.

Widths of the plurality of wordlines 4330 along the X-direction may be different each other. As a distance from the first substrate 4210 of the peripheral circuit region PERI to respective one of the plurality of wordline 4330 increases, the width of the respective one of the plurality of wordline 4330 decreases. Similarly, as a distance from the second substrate 4310 of the cell region CELL to respective one of the plurality of wordline 4330 increases, the width of the respective one of the plurality of wordline 4330 increases.

In the bitline bonding area BLBA, a channel structure CH may extend in a direction (a Z-axis direction), perpendicular to the upper surface of the second substrate 4310, and pass through the plurality of wordlines 4330, the at least one string select line, and the at least one ground select line. The channel structure CH may include a data storage layer, a channel layer, a buried insulating layer, and the like, and the channel layer may be electrically connected to a first metal layer 4350*c* and a second metal layer 4360*c*. For example, the first metal layer 4350*c* may be a bitline contact, and the second metal layer 4360*c* may be a bitline. In an example embodiment, the bitline 4360*c* may extend in a first direction (a Y-axis direction), parallel to the upper surface of the second substrate 4310.

The interlayer insulating layer 4315 may be disposed on the second substrate 4310 and cover the common source line 4320, the plurality of wordlines 4330, the plurality of cell contact plugs 4340, the first metal layer 4350*a*, 4350*b* and 4350*c*, and the second metal layer 4360*a*, 4360*b* and 4360*b*.

The interlayer insulating layer 4315 may include an insulating material such as silicon oxide, silicon nitride, or the like.

In an example embodiment illustrated in FIG. 35, an area in which the channel structure CH, the bitline 4360c, and the like are disposed may be defined as the bitline bonding area BLBA. In the bitline bonding area BLBA, the bitline 4360c may be electrically connected to the circuit elements 4220c providing a page buffer 4393 in the peripheral circuit region PERI. The bitline 4360c may be connected to upper bonding metals 4371c and 4372c in the cell region CELL, and the upper bonding metals 4371c and 4372c may be connected to lower bonding metals 4271c and 4272c connected to the circuit elements 4220c of the page buffer 4393.

In the wordline bonding area WLBA, the plurality of wordlines 4330 may extend in a second direction (an X-axis direction), parallel to the upper surface of the second substrate 4310 and perpendicular to the first direction, and may be connected to a plurality of cell contact plugs 4341 to 4347 (i.e., 4340). The plurality of wordlines 4330 and the plurality of cell contact plugs 4340 may be connected to each other in pads provided by at least a portion of the plurality of wordlines 4330 extending in different lengths in the second direction. A first metal layer 4350b and a second metal layer 4360b may be connected to an upper portion of the plurality of cell contact plugs 4340 connected to the plurality of wordlines 4330, sequentially. The plurality of cell contact plugs 4340 may be connected to the peripheral circuit region PERI by the upper bonding metals 4371b and 4372b of the cell region CELL and the lower bonding metals 4271b and 4272b of the peripheral circuit region PERI in the wordline bonding area WLBA.

The plurality of cell contact plugs 4340 may be electrically connected to the circuit elements 4220b forming a row decoder 4394 in the peripheral circuit region PERI. In an example embodiment, operating voltages of the circuit elements 4220b of the row decoder 4394 may be different than operating voltages of the circuit elements 4220c forming the page buffer 4393. For example, operating voltages of the circuit elements 4220c forming the page buffer 4393 may be greater than operating voltages of the circuit elements 4220b forming the row decoder 4394.

A common source line contact plug 4380 may be disposed in the external pad bonding area PA. The common source line contact plug 4380 may be formed of a conductive material such as a metal, a metal compound, polysilicon, or the like, and may be electrically connected to the common source line 4320. A first metal layer 4350a and a second metal layer 4360a may be stacked on an upper portion of the common source line contact plug 4380, sequentially. For example, an area in which the common source line contact plug 4380, the first metal layer 4350a, and the second metal layer 4360a are disposed may be defined as the external pad bonding area PA.

Input-output pads 4205 and 4305 may be disposed in the external pad bonding area PA. Referring to FIG. 35, a lower insulating film 4201 covering a lower surface of the first substrate 4210 may be formed below the first substrate 4210, and a first input-output pad 4205 may be formed on the lower insulating film 4201. The first input-output pad 4205 may be connected to at least one of the plurality of circuit elements 4220a, 4220b, and 4220c disposed in the peripheral circuit region PERI through a first input-output contact plug 4203, and may be separated from the first substrate 4210 by the lower insulating film 4201. In addition, a side insulating film may be disposed between the first input-output contact plug 4203 and the first substrate 4210 to electrically separate the first input-output contact plug 4203 and the first substrate 4210.

Referring to FIG. 35, an upper insulating film 4301 covering the upper surface of the second substrate 4310 may be formed on the second substrate 4310, and a second input-output pad 4305 may be disposed on the upper insulating film 4301. The second input-output pad 4305 may be connected to at least one of the plurality of circuit elements 4220a, 4220b, and 4220c disposed in the peripheral circuit region PERI through a second input-output contact plug 4303. In the example embodiment, the second input-output pad 4305 is electrically connected to a circuit element 4220a.

According to embodiments, the second substrate 4310 and the common source line 4320 are not disposed in an area in which the second input-output contact plug 4303 is disposed. The second input-output pad 4305 does not overlap the wordlines 4330 in the third direction (the Z-axis direction). Referring to FIG. 35, the second input-output contact plug 4303 may be separated from the second substrate 4310 in a direction, parallel to the upper surface of the second substrate 4310, and may pass through the interlayer insulating layer 4315 of the cell region CELL to be connected to the second input-output pad 4305 and the lower bonding metals 4271a and 4272a of the peripheral circuit area PERI.

According to embodiments, the first input-output pad 4205 and the second input-output pad 4305 may be selectively formed. For example, the memory device 4400 may include only the first input-output pad 4205 disposed on the first substrate 4210 or the second input-output pad 4305 disposed on the second substrate 4310. Alternatively, the memory device 4400 may include both the first input-output pad 4205 and the second input-output pad 4305.

A metal pattern provided on an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the memory device 4400 may include a lower metal pattern 4273a, corresponding to an upper metal pattern 4372a formed in an uppermost metal layer of the cell region CELL, and having the same cross-sectional shape as the upper metal pattern 4372a of the cell region CELL so as to be connected to each other, in an uppermost metal layer of the peripheral circuit region PERI. In the peripheral circuit region PERI, the lower metal pattern 4273a formed in the uppermost metal layer of the peripheral circuit region PERI is not connected to a contact. Similarly, in the external pad bonding area PA, an upper metal pattern 4372a, corresponding to the lower metal pattern 4273a formed in an uppermost metal layer of the peripheral circuit region PERI, and having the same shape as a lower metal pattern 4273a of the peripheral circuit region PERI, may be formed in an uppermost metal layer of the cell region CELL.

The lower bonding metals 4271b and 4272b may be formed on the second metal layer 4240b in the wordline bonding area WLBA. In the wordline bonding area WLBA, the lower bonding metals 4271b and 4272b of the peripheral circuit region PERI may be electrically connected to the upper bonding metals 4371b and 4372b of the cell region CELL by a Cu-to-Cu bonding.

Further, in the bitline bonding area BLBA, an upper metal pattern 4392, corresponding to a lower metal pattern 4252 formed in the uppermost metal layer of the peripheral circuit region PERI, and having the same cross-sectional shape as the lower metal pattern 4252 of the peripheral circuit region PERI, may be formed in an uppermost metal layer of the cell region CELL. A contact is not formed on the upper metal pattern 4392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in another one of the cell region CELL and the peripheral circuit region PERI. A contact is not formed on the reinforcement metal pattern.

In an exemplary embodiment, a memory cell array of a nonvolatile memory device described with reference to FIGS. 1 to 32 may be included in the memory cell region CELL, and various circuit components such as an erase delta verification logic circuit, an address decoder, a page buffer, an input/output circuit, a control logic and voltage generating circuit, and a storage circuit may be included in the peripheral circuit region PERI.

According to the inventive concept, a nonvolatile memory device may detect a soft defect of a memory block based on a difference between fail bit counts of wordline groups in an erase operation of the memory block. Accordingly, an operation method of the nonvolatile memory device having improved reliability is provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An operation method of a nonvolatile memory device which includes a memory block including a plurality of wordlines and a plurality of bitlines, the method comprising:
   performing an erase operation on the memory block using a 0-th erase voltage;
   performing a block verification operation on the memory block using a 0-th erase verification voltage;
   performing, in response to a result of the block verification operation being determined as a pass, a delta verification operation on the memory block; and
   outputting, in response to the result of the block verification operation or a result of the delta verification operation, information of whether the erase operation performed on the memory block is determined as a pass or a fail,
   wherein the plurality of wordlines are grouped into a plurality of wordline groups, and
   wherein the delta verification operation includes:
   generating a plurality of first delta counting values respectively from the plurality of wordline groups using a first sensing condition;
   generating a first delta value based on the plurality of first delta counting values;
   comparing the first delta value and a first reference value; and
   generating, in response to the first delta value being smaller than the first reference value, a plurality of second delta counting values respectively from the plurality of wordline groups using a second sensing condition.

2. The method of claim 1,
   wherein the first sensing condition includes information about a first erase verification voltage applied to each of the plurality of wordline groups, and
   the second sensing condition includes information about a second erase verification voltage applied to each of the plurality of wordline groups.

3. The method of claim 2,
   wherein the first erase verification voltage is smaller than the 0-th erase verification voltage, and
   the second erase verification voltage is smaller than the first erase verification voltage.

4. The method of claim 1,
   wherein the first sensing condition includes information about a first develop time of a sensing node, and
   the second sensing condition includes information about a second develop time of a sensing node.

5. The method of claim 4,
   wherein the second develop time is longer than the first develop time.

6. The method of claim 1,
   wherein the first sensing condition includes information about a first resolution of a mass bit counter circuit, the mass bit counter configured to generate the plurality of first delta counting values and the plurality of second delta counting values respectively from the plurality of wordline groups, and
   wherein the second sensing condition includes information about a second resolution of the mass bit counter circuit.

7. The method of claim 6,
   wherein the second resolution of the mass bit counter circuit is greater than the first resolution of the mass bit counter circuit.

8. The method of claim 1,
   wherein the delta verification operation further includes:
   generating a second delta value based on the plurality of second delta counting values; and
   comparing the second delta value with the first reference value.

9. The method of claim 8,
   wherein the delta verification operation further includes:
   generating, in response to the second delta value being smaller than the first reference value, a plurality of third delta counting values respectively from the plurality of wordline groups using a third sensing condition, the third sensing condition being different from each of the first and second sensing conditions;
   generating a third delta value based on the plurality of third delta counting values; and
   comparing the third delta value with the first reference value.

10. The method of claim 9,
    wherein a result of the delta verification operation is determined as a pass, in response to the third delta value being smaller than the first reference value.

11. The method of claim 1,
    wherein the 0-th erase verification voltage is determined based on an end of life (EOL) state of the memory block.

12. The method of claim 1, further comprising:
    performing, in response to an erase result of the memory block being determined as a pass, a program operation on the memory block.

13. The method of claim 1,
    wherein when an erase result of the memory block is determined as a fail, the memory block is managed as a bad block by an external memory controller.

14. An operation method of a nonvolatile memory device which includes a memory block including a plurality of wordlines and a plurality of bitlines, the plurality of wordlines being grouped into a plurality of wordline groups, the method comprising:

performing an erase operation on the memory block;
generating a plurality of first delta counting values respectively from the plurality of wordline groups using a first sensing condition;
generating a first delta value based on the plurality of first delta counting values;
comparing the first delta value and a first reference value;
generating a plurality of second delta counting values respectively from the plurality of wordline groups using a second sensing condition different from the first sensing condition;
generating a second delta value based on the plurality of second delta counting values; and
comparing the second delta value and the first reference value.

15. The method of claim 14,
wherein the first sensing condition includes information about a first erase verification voltage applied to each of the plurality of wordline groups, and
the second sensing condition includes information about a second erase verification voltage applied to each of the plurality of wordline groups.

16. The method of claim 15,
wherein second erase verification is smaller than the first erase verification voltage.

17. The method of claim 14,
wherein the first sensing condition includes information about a first develop time of a sensing node, and
the second sensing condition includes information about a second develop time of a sensing node.

18. The method of claim 17,
wherein the second develop time is longer than the first develop time.

19. An operation method of a nonvolatile memory device which includes a memory block including a plurality of wordlines and a plurality of bitlines, the method comprising:

performing an erase operation on the memory block;
performing a block verification operation on the memory block;
performing, in response to a result of the block verification operation being determined as a pass, a delta verification operation; and
outputting, in response to the result of the block verification operation or a result of the delta verification operation, information of whether the erase operation performed on the memory block is determined as a pass or a fail,
wherein the delta verification operation indicates an operation for detecting a soft defect on the memory block by generating a first delta value based on a first sensing condition, comparing the first delta value and a first reference value, generating a second delta value based on a second sensing condition, and comparing the second delta value and the first reference value.

20. The method of claim 19,
wherein the first sensing condition includes information about a first erase verification voltage applied to each of the plurality of wordline groups, and
the second sensing condition includes information about a second erase verification voltage applied to each of the plurality of wordline groups.

* * * * *